(12) United States Patent
Choi et al.

(10) Patent No.: US 12,433,070 B2
(45) Date of Patent: Sep. 30, 2025

(54) DISPLAY DEVICE AND METHOD FOR MANUFACTURING THE SAME

(71) Applicant: Samsung Display Co., LTD., Yongin-si (KR)

(72) Inventors: Jin Woo Choi, Seoul (KR); Min Woo Kim, Hwaseong-si (KR); Sung Kook Park, Suwon-si (KR); Sung Eun Baek, Suwon-si (KR); So Yeon Yoon, Uijeongbu-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 518 days.

(21) Appl. No.: 17/718,521

(22) Filed: Apr. 12, 2022

(65) Prior Publication Data

US 2023/0046091 A1    Feb. 16, 2023

(30) Foreign Application Priority Data

Aug. 11, 2021  (KR) ........................ 10-2021-0105962

(51) Int. Cl.
*H01L 25/16*  (2023.01)
*H10H 20/01*  (2025.01)
(Continued)

(52) U.S. Cl.
CPC ......... *H10H 20/831* (2025.01); *H01L 25/167* (2013.01); *H10H 20/01335* (2025.01);
(Continued)

(58) Field of Classification Search
CPC ..... H01L 33/00–648; H01L 27/15–156; H01L 2933/00–0091; H10K 50/844; H10K 50/00–87; H10K 59/131; H10K 59/122; H10K 59/123; H10K 59/80–8794; H10K 59/00–88; H10K 59/12–1315; H10K 59/173; H10K 59/18;
(Continued)

(56) References Cited

U.S. PATENT DOCUMENTS 10,923,538 B2  2/2021  Lee et al.
11,605,677 B2  3/2023  Lee et al.
(Continued)

FOREIGN PATENT DOCUMENTS

CN   110890406   3/2020
CN   111048497   4/2020
(Continued)

*Primary Examiner* — David Vu
(74) *Attorney, Agent, or Firm* — CANTOR COLBURN LLP

(57) ABSTRACT

A display device includes pixel electrodes disposed on a substrate, at least one light-emitting element disposed on each of the pixel electrodes, a planarization layer disposed on the pixel electrodes and filling a space between the at least one light-emitting element, and a common electrode disposed on the planarization layer and the at least one light-emitting element. Each of the light-emitting elements is arranged perpendicular to a top face of each of the pixel electrodes, at least one of the pixel electrodes includes a protrusion protruding toward an adjacent one of the pixel electrodes, and the protrusion overlaps the light-emitting element in a plan view.

10 Claims, 59 Drawing Sheets

(51) Int. Cl.
*H10H 20/831* (2025.01)
*H10H 20/857* (2025.01)
*H10H 20/812* (2025.01)
*H10H 20/825* (2025.01)
*H10H 20/856* (2025.01)

(52) U.S. Cl.
CPC ......... *H10H 20/018* (2025.01); *H10H 20/032* (2025.01); *H10H 20/812* (2025.01); *H10H 20/825* (2025.01); *H10H 20/856* (2025.01)

(58) Field of Classification Search
CPC ....... H10K 2102/311; H10K 2102/301; H10K 2102/341; H10K 2102/30; H10K 2102/361; H10K 70/00; H10K 71/00–441; H10K 71/831–861; H10K 30/865; H10K 2101/10; H10K 2101/40; H10K 2101/00–80; H10K 85/00–761; H10K 77/10; H10K 77/111; H05B 33/02; H05B 33/04; H05B 33/06; H05B 33/10; H05B 33/22; B32B 2457/206
See application file for complete search history.

(56) References Cited

U.S. PATENT DOCUMENTS

| | | |
|---|---|---|
| 11,895,859 B2 | 2/2024 | Lou et al. |
| 2020/0252707 A1* | 8/2020 | Won ........................ H04R 9/025 |
| 2021/0249624 A1* | 8/2021 | Lou ........................ H10K 71/00 |
| 2023/0189609 A1* | 6/2023 | Wu ........................ H10K 59/877 |
| | | 257/40 |

FOREIGN PATENT DOCUMENTS

| | | |
|---|---|---|
| KR | 10-2019-0130081 | 11/2019 |
| KR | 10-2020-0121430 | 10/2020 |
| KR | 10-2021-0078561 | 6/2021 |
| KR | 10 2022 0087669 | 6/2022 |
| WO | 2020/080603 | 4/2020 |

* cited by examiner

FIG. 23
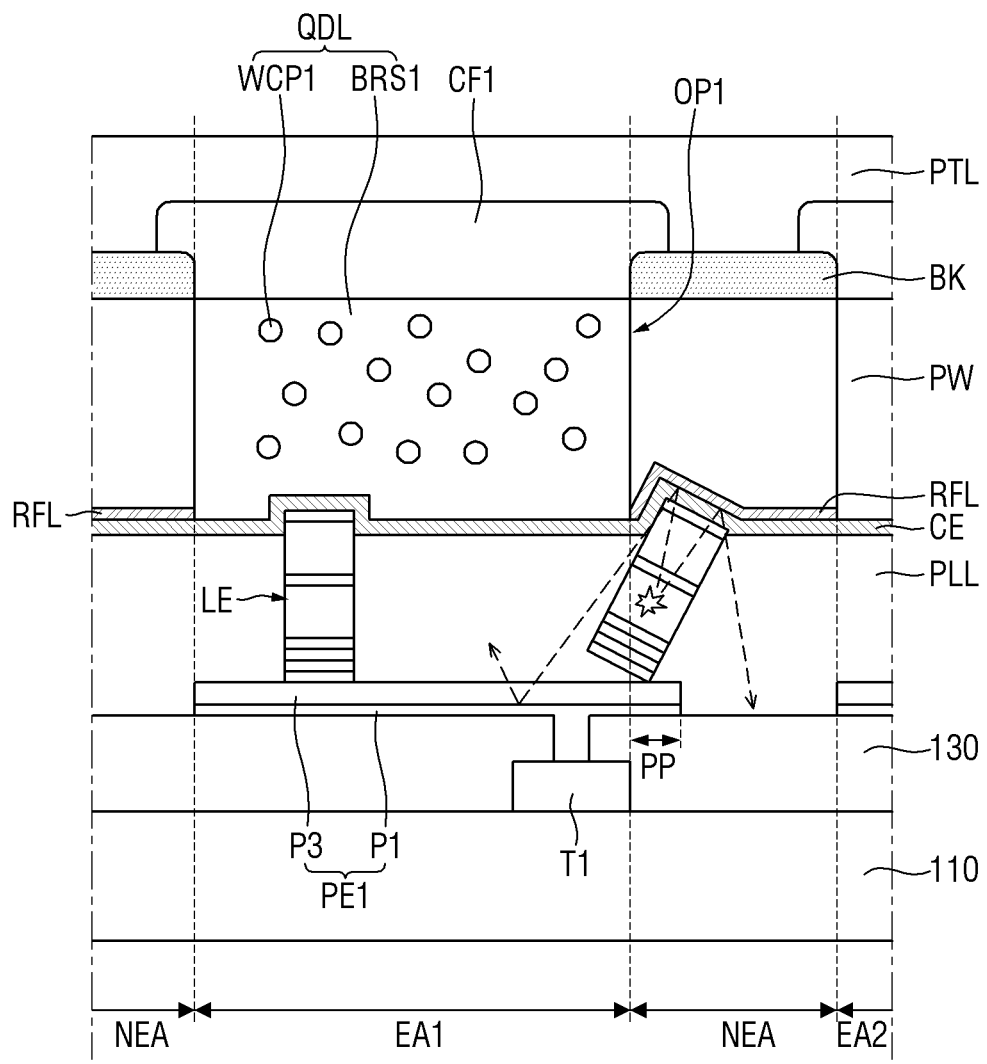
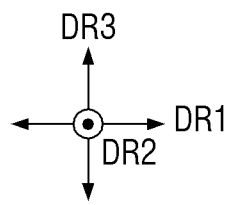

FIG. 29
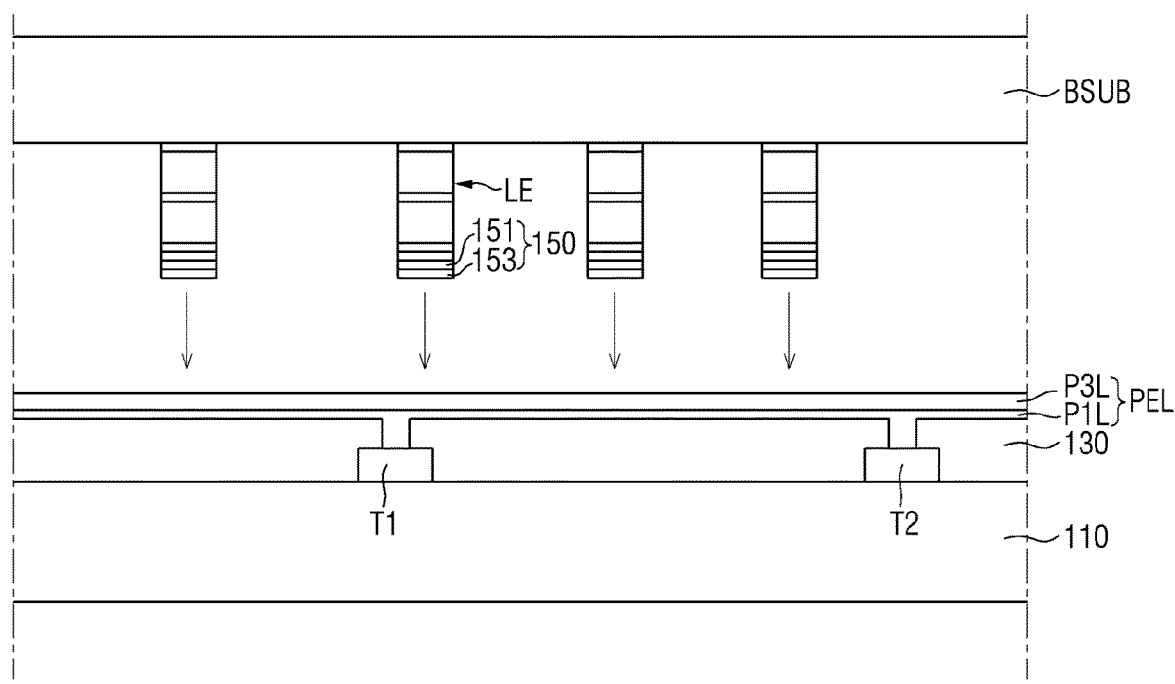
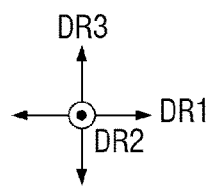

FIG. 30
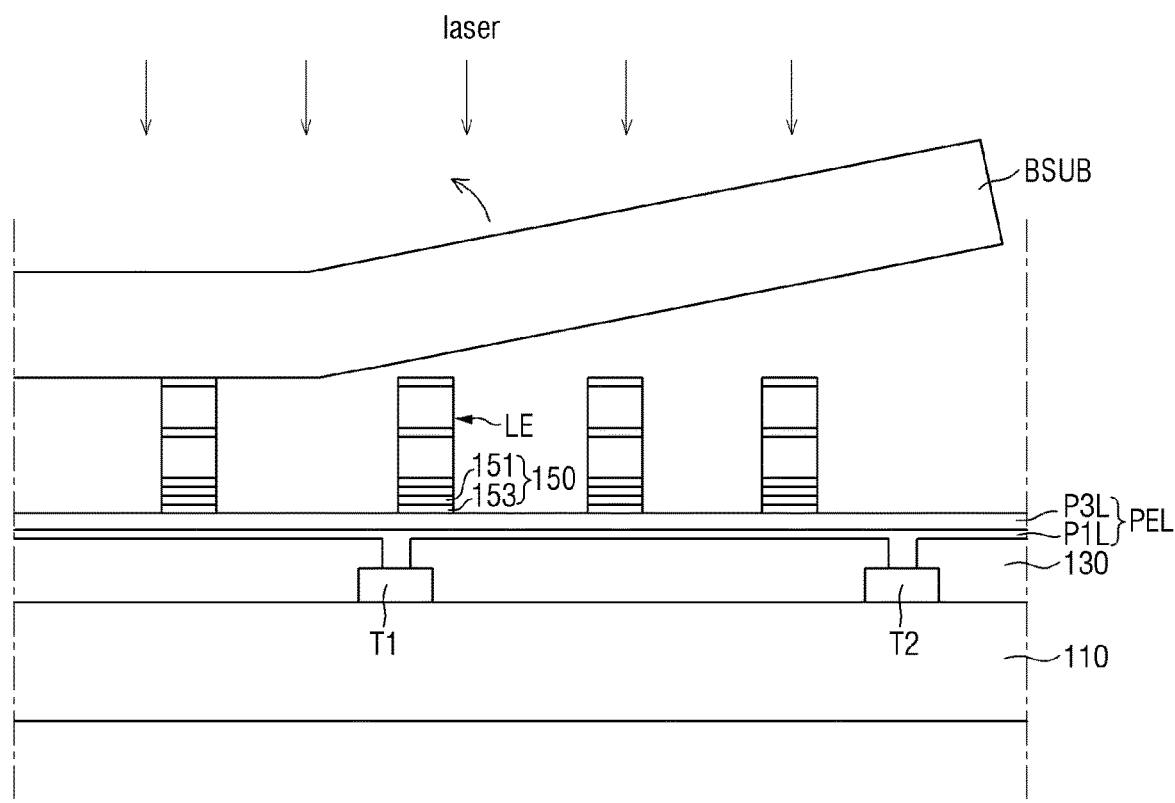
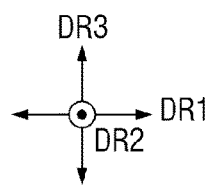

FIG. 32
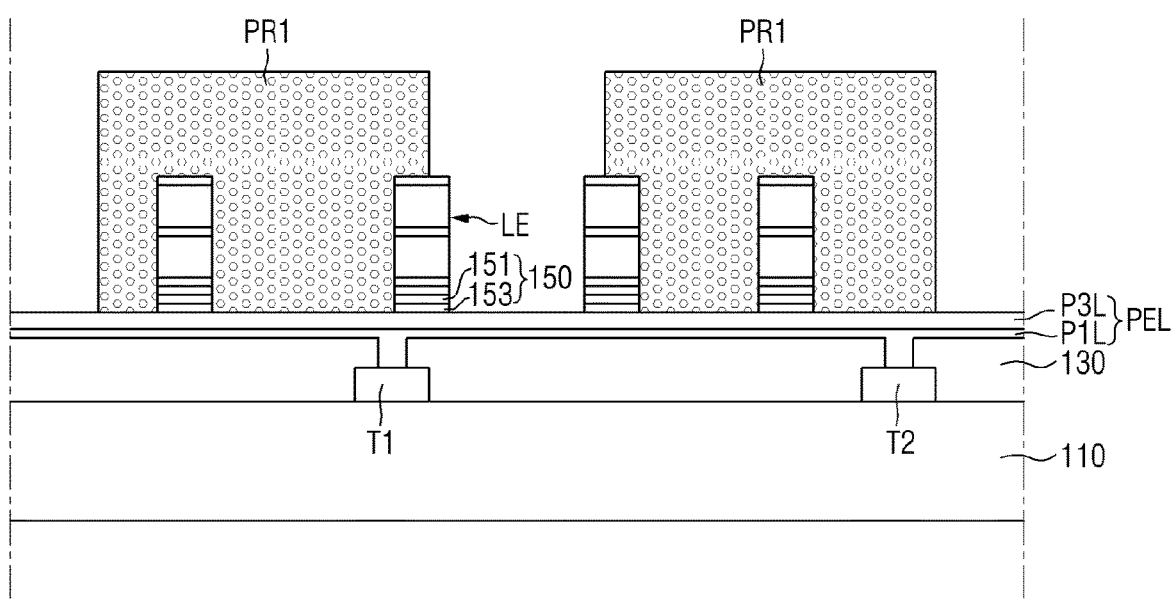
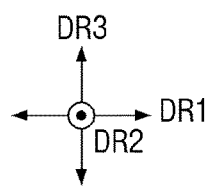

FIG. 33
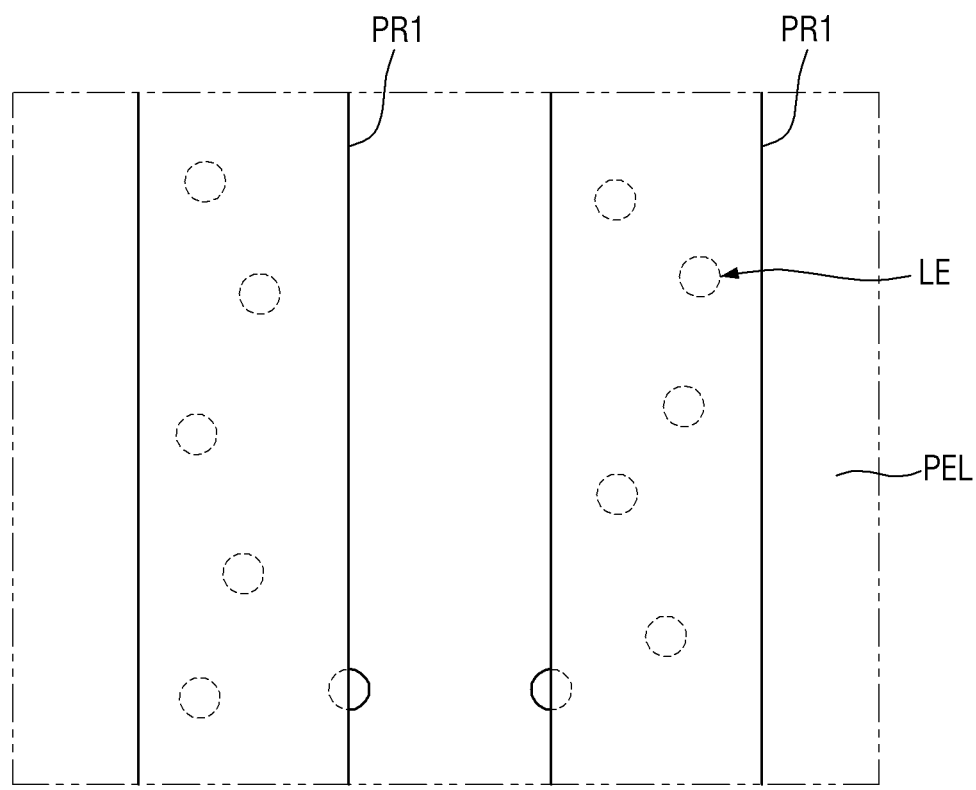
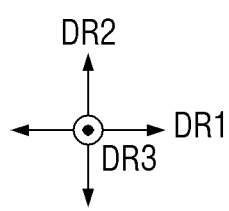

FIG. 34
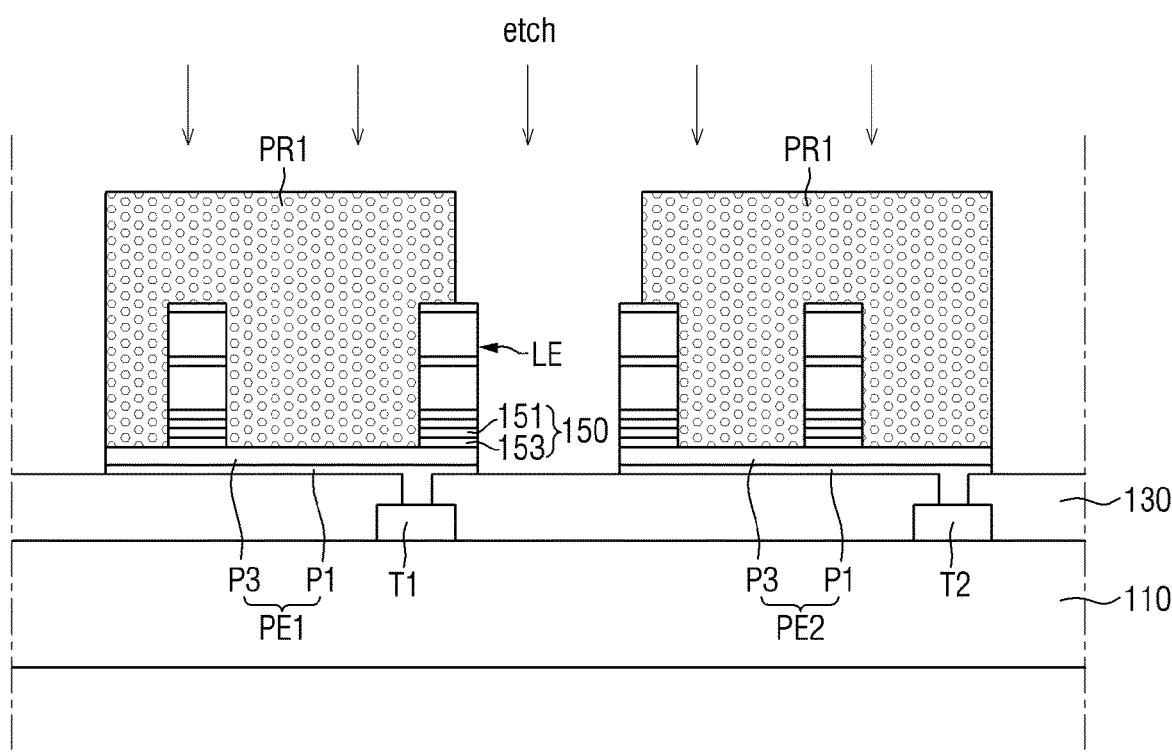
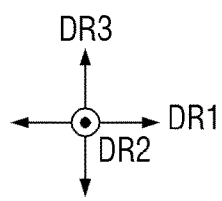

FIG. 35
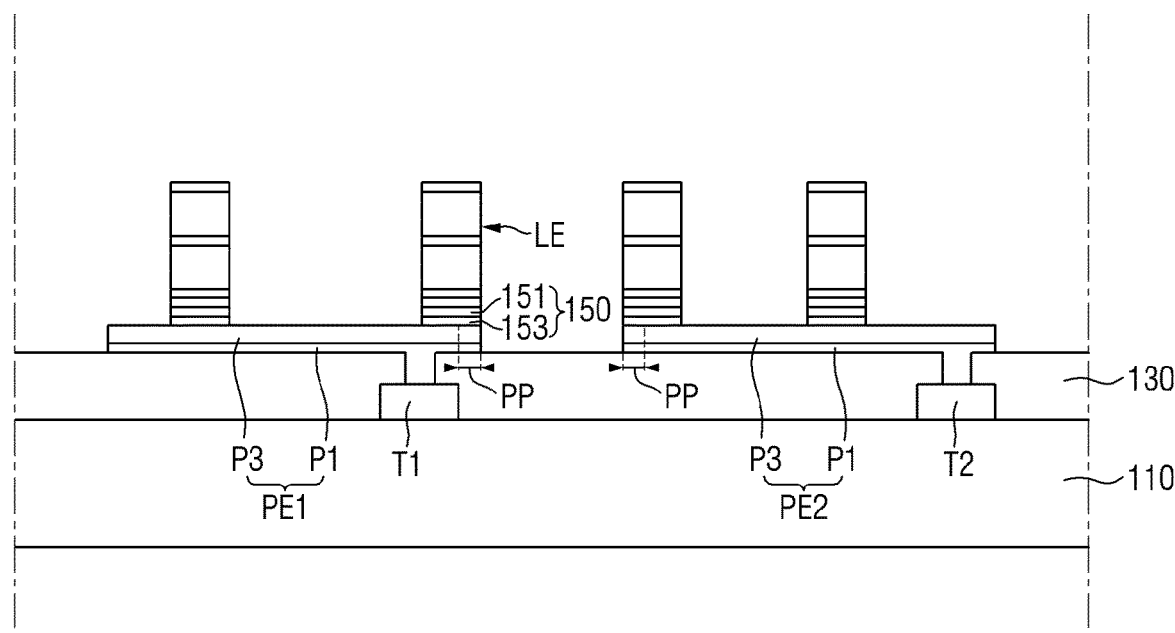
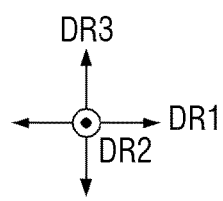

FIG. 37
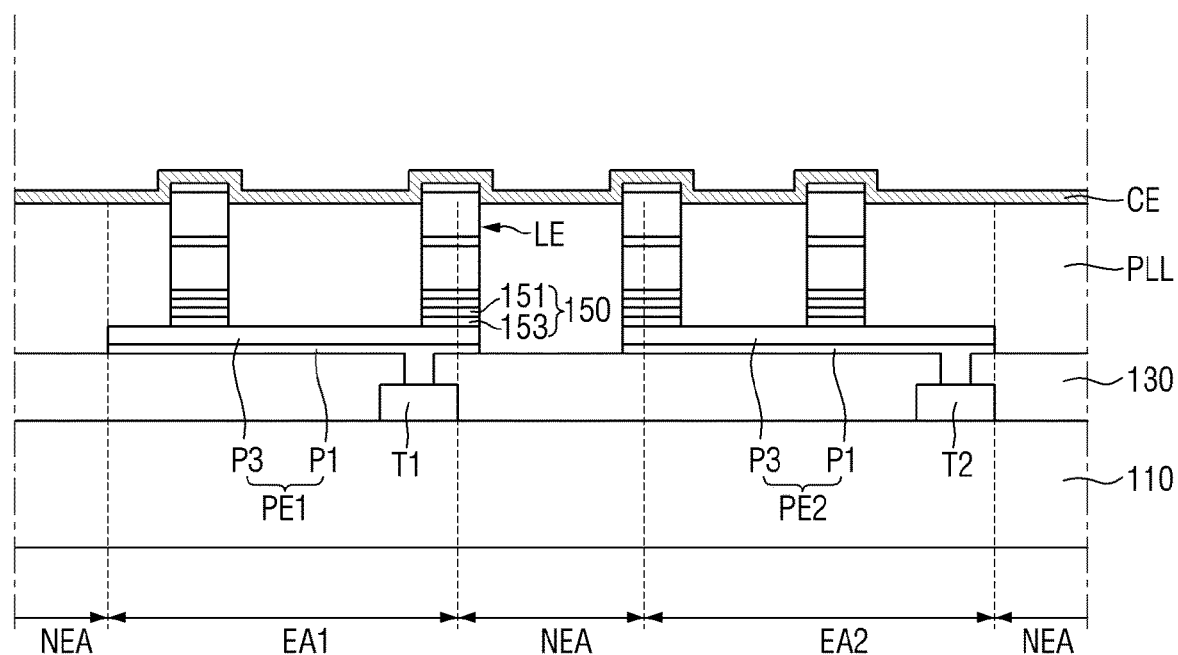
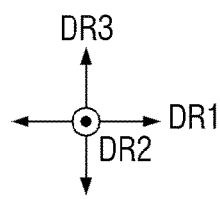

DISPLAY DEVICE AND METHOD FOR MANUFACTURING THE SAME

CROSS-REFERENCE TO RELATED APPLICATION(S)

This application claims priority to and benefits of Korean Patent Application No. 10-2021-0105962 under 35 U.S.C. § 119, filed on Aug. 11, 2021, in the Korean Intellectual Property Office (KIPO), the entire contents of which are herein incorporated by reference.

BACKGROUND

1. Technical Field

The disclosure relates to a display device and a method for manufacturing the same.

2. Description of Related Art

A display device has increasing importance under development of multimedia. In response to this trend, various types of the display devices such as an organic light-emitting display device (OLED), a liquid crystal display device (LCD), etc. have been used.

A display device that displays an image may include a display panel such as a light-emitting display panel or a liquid crystal display panel. The light-emitting display panel may include a light-emitting element such as a light-emitting diode (LED). The light-emitting diode may include an organic light-emitting diode OLED using an organic material as a light-emitting material and an inorganic light-emitting diode using an inorganic material as the light-emitting material.

SUMMARY

A purpose of the disclosure is to provide a display device and a manufacturing method thereof which are capable of preventing misalignment of light-emitting elements and color mixing thereof.

Purposes according to the disclosure are not limited to the above-mentioned purpose. Other purposes and advantages according to the disclosure that are not mentioned may be understood based on following descriptions, and may be more clearly understood based on embodiments according to the disclosure. Further, it will be understood that the purposes and advantages according to the disclosure may be realized using means shown in the claims and combinations thereof.

According to an embodiment of the disclosure, the display device includes pixel electrodes disposed on a substrate, at least one light-emitting element disposed on each of the pixel electrodes, a planarization layer disposed on the pixel electrodes and filling a space between the at least one light-emitting element, and a common electrode disposed on the planarization layer and the at least one light-emitting element. Each of the light-emitting elements may be arranged perpendicular to a top face of each of the pixel electrodes; at least one of the pixel electrodes may include a protrusion protruding toward an adjacent one of the pixel electrodes, and the protrusion may overlap the at least one light-emitting element in a plan view.

In an embodiment, an outer side of the protrusion may be aligned with and coincident with an outer side of the at least one light-emitting element.

In an embodiment, a first width of the at least one of the pixel electrodes extending in one direction and through the protrusion is greater than a second width of the at least one of the pixel electrodes extending in the direction and not through the protrusion.

In an embodiment, a dimension of a first line extending between the pixel electrodes to adjacent to each other and in a direction may be smaller than a dimension of a second line extending between the pixel electrodes to adjacent to each other and in the direction, the first line may contact the protrusion, and the second line may not contact the protrusion.

In an embodiment, the device may further comprise a wavelength converter disposed on the common electrode. The wavelength converter may include banks, each of the banks separating each of light-emitting areas and each of non-light-emitting areas, a wavelength conversion layer disposed between the banks and overlapping each of the light-emitting areas in a plan view, a light-blocking member disposed on the banks, and a color filter disposed on the wavelength conversion layer.

In an embodiment, the protrusion may overlap each of the non-light-emitting areas, each of the banks, and each of the light-blocking members in a plan view.

In an embodiment, the device may further comprise a reflective metal layer disposed between the common electrode and the banks. The reflective metal layer may overlap each of the non-light-emitting areas in a plan view.

In an embodiment, each of the pixel electrodes may include a lower electrode layer and an upper electrode layer disposed on the lower electrode layer. Each of the lower electrode layer and the upper electrode layer may include a metal.

In an embodiment, each of the pixel electrodes may include a lower electrode layer, a reflective electrode layer disposed on the lower electrode layer, and the upper electrode layer disposed on the reflective electrode layer, each of the lower electrode layer and the upper electrode layer may include a metal oxide, and the reflective electrode layer may include a metal.

According to an embodiment of the disclosure, the display device comprises a light-emitting area and a non-light-emitting area, pixel electrodes disposed on a substrate, first light-emitting elements disposed on each of the pixel electrodes and second light-emitting elements disposed between the pixel electrodes, a planarization layer disposed on the pixel electrodes and filling a space between the first and second light-emitting elements, a common electrode disposed on the planarization layer and the first and second light-emitting elements, a conductive pattern disposed between the pixel electrodes. Each of the first and second light-emitting elements may be arranged perpendicular to a top face of each of the pixel electrodes, the conductive pattern is spaced apart from each of the pixel electrodes, and the conductive pattern may be disposed on the second light-emitting element and overlap the non-light-emitting area and the second light-emitting element in a plan view.

In an embodiment, the conductive pattern and the pixel electrodes may be disposed on a same layer and may include a same material.

In an embodiment, an outer side of the conductive pattern may be aligned with and may coincide with an outer side of the second light-emitting element.

In an embodiment, the second light-emitting element overlapping the conductive pattern in a plan view electrically contacts the common electrode.

In an embodiment, the conductive pattern may be a floating pattern, and the second light-emitting element overlapping in a plan view the conductive pattern may not emit light.

In an embodiment, a planar shape of the conductive pattern may be identical with a shape of a cut face of the second light-emitting element perpendicular to an extending direction of the second light-emitting element.

According to an embodiment of the disclosure, the method for manufacturing a display device, the method comprises forming light-emitting elements on a base substrate, forming a first substrate including a pixel electrode layer, bonding the base substrate and the first substrate to each other such that the light-emitting elements are adhered onto the pixel electrode layer, irradiating laser to the base substrate to remove the base substrate from the light-emitting elements, patterning the pixel electrode layer using a photoresist pattern and the light-emitting elements as a mask to form a pixel electrode, forming a planarization layer on the pixel electrode, and forming a common electrode on the planarization layer.

In an embodiment, the bonding of the base substrate and the first substrate may include irradiating the laser to an upper electrode material layer of the pixel electrode layer, such that the light-emitting elements and the upper electrode material layer are melt-bonded to each other via heat conduction in the upper electrode material layer.

In an embodiment, in the irradiating of the laser to the base substrate to remove the base substrate from the light-emitting elements, the laser is a KrF excimer laser, and an energy density of the laser is in a range of about 550 mJ/cm2 to about 950 mJ/cm2.

In an embodiment, the patterning of the pixel electrode layer using the photoresist pattern and the light-emitting elements as the mask to form the pixel electrode may include forming the photoresist pattern so as to overlap the pixel electrode layer and a portion of at least one of the light-emitting elements in a plan view, and spraying an etchant toward the pixel electrode layer and using the photoresist pattern and the light-emitting elements as the mask to pattern the pixel electrode layer.

In an embodiment, the patterning of the pixel electrode layer may include forming a protrusion of the pixel electrode under each of the at least one of the light-emitting elements such that an outer side of each of the at least one of the light-emitting elements and an outer side of the protrusion are aligned with each other.

In the display device and the method for manufacturing the same according to the embodiments, the light-emitting element is bonded to each pixel electrode material layer, and then, the pixel electrodes are formed using the photoresist pattern and the light-emitting element as a mask, thereby facilitating alignment of the pixel electrode and the light-emitting element. Accordingly, misalignment of the light-emitting element may be prevented to prevent step defect and damage to an underlying layer due to the misalignment.

Further, in the display device and the method for manufacturing the same according to the embodiments, the reflective metal layer is formed on the common electrode in the non-light-emitting area, thereby preventing light from the light-emitting element from invading a light-emitting area adjacent thereto and thus preventing color mixing from occurring.

Further, according to the display device and the method for manufacturing the same according to the embodiments, the light-emitting elements are bonded to the substrate using the transfer film, such that a density of light-emitting elements may be readily controlled. Thus, the display device that may be adapted to pixels of various sizes may be manufactured.

Effects of the disclosure are not limited to the above-mentioned effects, and other effects as not mentioned will be clearly understood by those skilled in the art from following descriptions.

BRIEF DESCRIPTION OF DRAWINGS

The above and other aspects and features of the disclosure will become more apparent by describing in detail embodiments thereof with reference to the attached drawings, in which:

FIG. 23 is a cross-sectional view schematically showing a display device according to still yet another embodiment;

FIG. 27 to FIG. 40 are diagrams schematically illustrating a method for manufacturing a display device according to an embodiment;

DETAILED DESCRIPTIONS OF THE EMBODIMENTS

Figure 1:
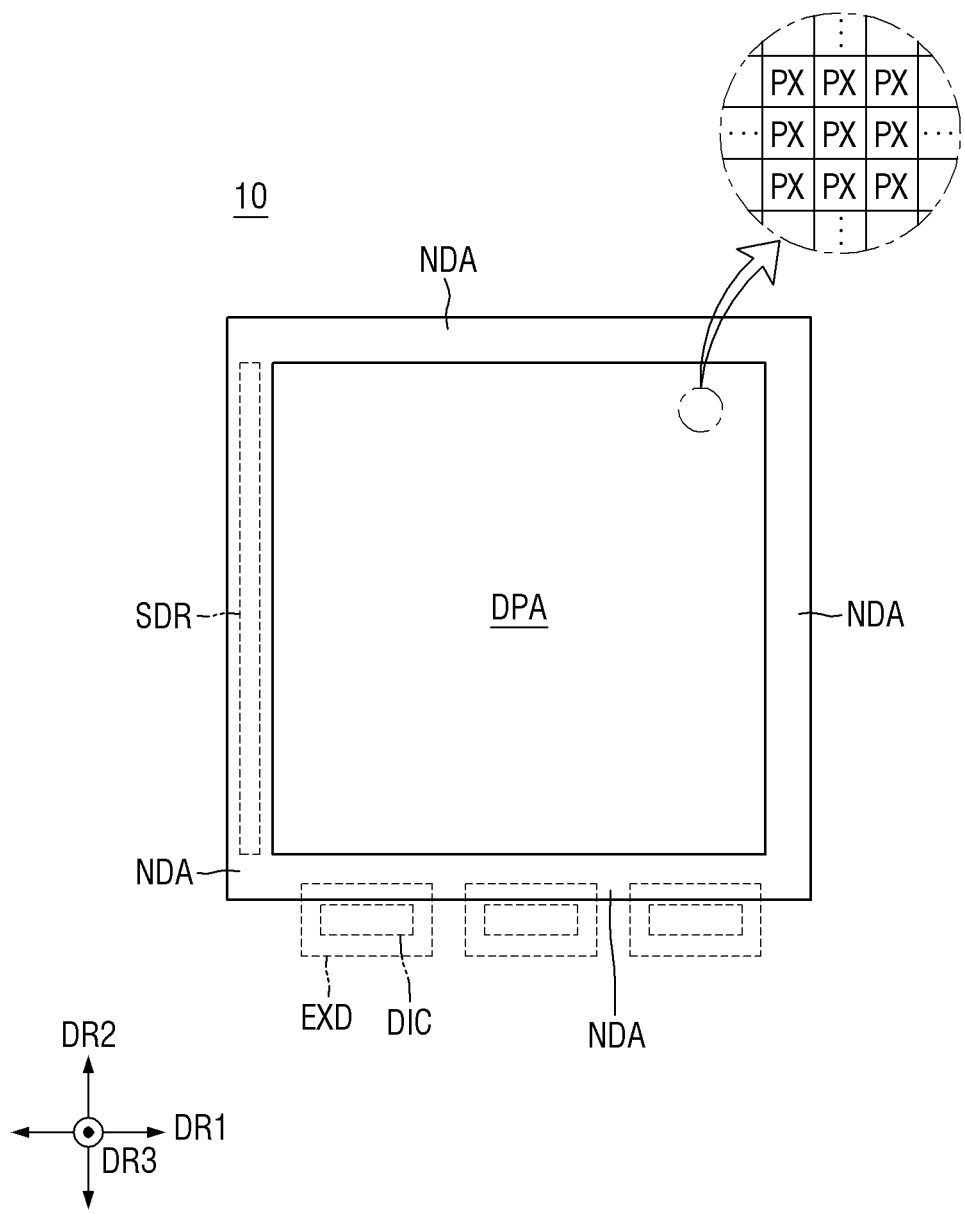
FIG. 1 is a schematic plan view of a display device according to an embodiment.

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Each of the features of the various embodiments of the disclosure may be combined or combined with each other, in part or in whole, and technically various interlocking and driving are possible. Each embodiment may be implemented independently of each other or may be implemented together in an association.

Hereinafter, specific embodiments will be described with reference to the accompanying drawings.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "contact," "connected to," and "coupled to" may include a physical and/or electrical contact, connection, or coupling.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

FIG. 1 is a schematic plan view of a display device according to an embodiment.

Referring to FIG. 1, a display device 10 according to an embodiment may be used in a smartphone, a mobile phone, a tablet personal computer (PC), a personal digital assistant (PDA), a portable multimedia player (PMP), a television, a game console, a wristwatch-type electronic device, a head-mounted display, a PC monitor, a laptop computer, a vehicle navigation system, a vehicle dashboard, a digital camera, a camcorder, an outdoor billboard, an electronic billboard, a medical device, an inspection device, various home appliances such as a refrigerator and a washing machine, or an Internet of things (IoT) device. In the disclosure, an example in which the display device is used as a television is described. The television may have high to ultra-high resolutions such as high definition (HD), ultra-high definition (UHD), 4K, and 8K. However, the disclosure is not limited thereto.

Further, the display device 10 according to an embodiment may be classified based on a display method. For example, the display device may include an organic light-emitting display device, an inorganic light-emitting display device, a quantum dot light-emitting display device, a micro light-emitting diode (LED) display device, a nano LED display device, a plasma display device, a field emission display (FED) device, a cathode-ray tube (CRT), a liquid crystal display (LCD) device, and an electrophoretic display (EPD) device, and the like. Hereinafter, a case in which the display device is embodied as the organic light-emitting display device (OLED) will be described by way of example. Unless otherwise mentioned, the organic light-emitting display device used in an embodiment will be abbreviated as the display device. However, the embodiment is not limited to the organic light-emitting display device. When the same technical idea is applicable to other display devices, the other display devices listed above may be used.

Further, in following drawings, a first direction DR1 indicates a longitudinal or horizontal direction of the display device 10, a second direction DR2 indicates a transverse or vertical direction of the display device 10, and a third direction DR3 indicates a thickness direction of the display device 10. In this case, "left", "right", "upper", and "lower" indicate directions of the display device 10 in a plan view. For example, "right" indicates a side in the first direction DR1, "left" indicates the opposite side in the first direction DR1, "upper" indicates a side in the second direction DR2, and "lower" indicates the opposite side in the second direction DR2. Further, "top" refers to a side in the third direction DR3, and "bottom" refers to the opposite side in the third direction DR3.

The display device 10 according to an embodiment may have a square shape in a plan view and, for example, may have a regular square shape. Further, in case that the display device 10 is used in a television, the display device 10 may have a rectangular shape having a long side extending in the horizontal or longitudinal direction. However, the disclosure is not limited thereto. The long side may extend in the vertical or transverse direction. As another example, the display device 10 may be rotatable so that an extension direction of the long side may change to the horizontal or vertical direction. As another example, the display device 10 may have a circular or elliptical planar shape.

The display device 10 may include a display area DPA and a non-display area NDA. The display area DPA may refer to an active area in which an image is displayed. The display area DPA may have a regular square shape in a plan view similar to the overall planar shape of the display device 10. However, the disclosure is not limited thereto.

The display area DPA may include pixels PX. The pixels PX may be arranged in a matrix form. A shape of each pixel PX may be a rectangular or regular square shape in a plan view, but may not be limited thereto. A shape of each pixel PX may have a rhombic shape having each side which is inclined with respect to a side of the display device 10. The pixels PX may render various colors. For example, the pixels PX may include, but may not be limited to, a first color pixel PX for rendering a red color, a second color pixel PX for rendering a green color, and a third color pixel PX for rendering a blue color. The pixels PX may be arranged in a stripe type manner or in a PENTILE™ type manner.

The non-display area NDA may be disposed around the display area DPA. The non-display area NDA may entirely or partially surround the display area DPA. The display area DPA may have a regular square shape, and the non-display area NDA may have four portions, each adjacent to each of four sides of the display area DPA. The non-display area NDA may form (or constitute) a bezel of the display device 10.

A driver circuit or a driver element for driving the display area DPA may be disposed in the non-display area NDA. In an embodiment, in a portion of the non-display area NDA disposed adjacent to a first side (a lower side in FIG. 1) of the display device 10, a pad area may be disposed on a display substrate of the display device 10, and an external device EXD may be mounted on a pad electrode of the pad area. Examples of the external device EXD may include a connection film, a printed circuit board, a driver chip DIC, a connector, and a line connection film. In a portion of the non-display area NDA disposed adjacent to a second side (a left side in FIG. 1) of the display device 10, a scan driver SDR, etc. formed directly on the display substrate of the display device 10 may be disposed.

Figure 2:
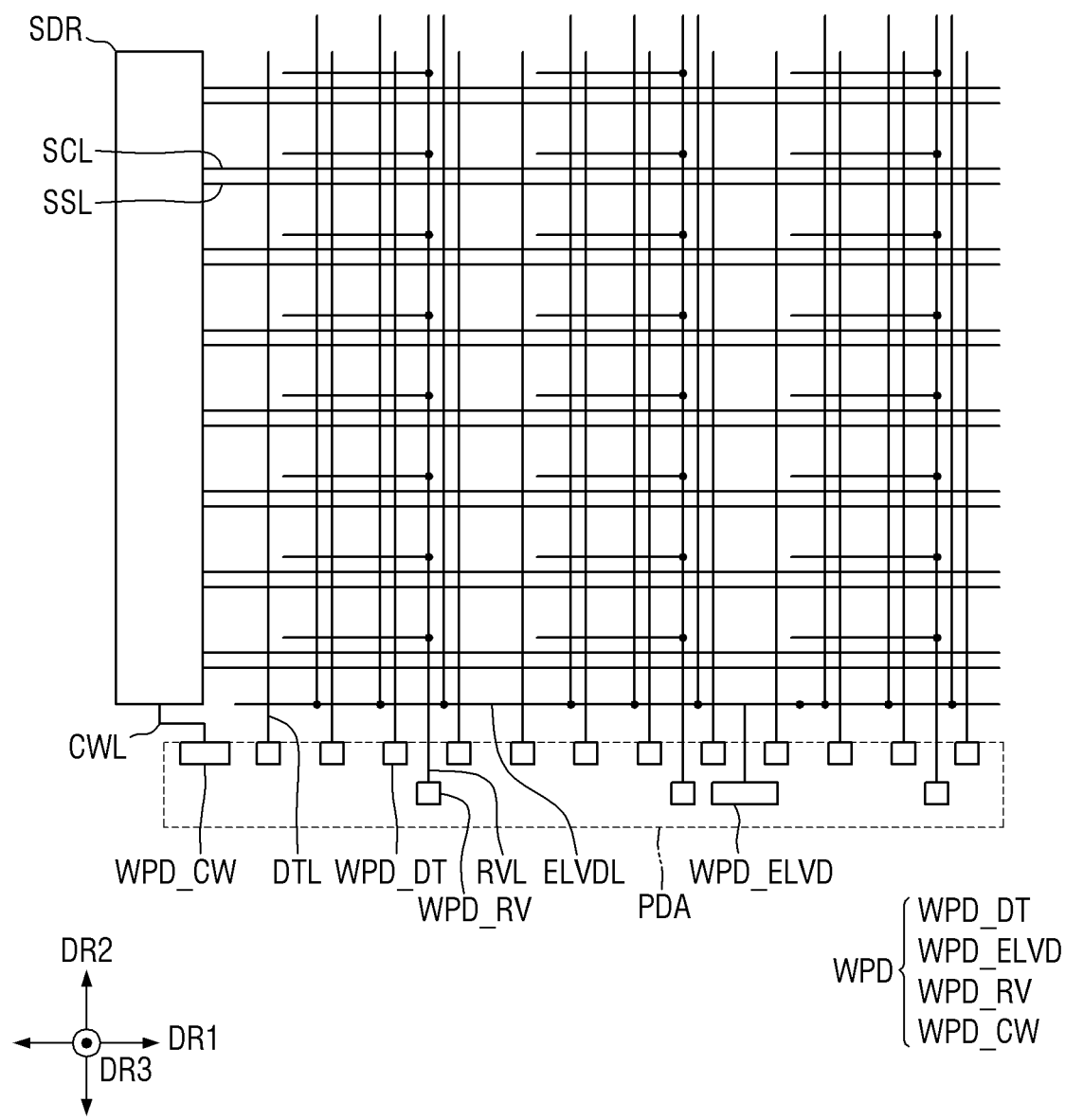
FIG. 2 is a schematic layout diagram of a circuit of a display substrate of a display device according to an embodiment.

FIG. 2 is a schematic layout diagram of an equivalent circuit of a display substrate of a display device according to an embodiment.

Referring to FIG. 2, lines are disposed on a first substrate. The lines may include a scan line SCL, a sensing signal line SSL, a data line DTL, a reference voltage line RVL, a first power line ELVDL, and the like.

Each of the scan line SCL and the sensing signal line SSL may extend in the first direction DR1. Each of the scan line SCL and the sensing signal line SSL may be electrically connected to the scan driver SDR. The scan driver SDR may include a driver circuit. The scan driver SDR may be disposed in a side portion of the non-display area NDA and on the display substrate. However, the disclosure is not limited thereto. The scan driver SDR may be disposed on each of both opposing side portions of the non-display area NDA. The scan driver SDR may be electrically connected to a signal connection line CWL. At least one end of the signal connection line CWL may be electrically connected to a pad WPD_CW on a non-display area NDA. The pad WPD_CW may be electrically connected to the external device EXD (see FIG. 1).

Each of the data line DTL and the reference voltage line RVL may extend in the second direction DR2 intersecting the first direction DR1. The first power line ELVDL may include a portion extending in the second direction DR2. The first power line ELVDL may further include a portion extending in the first direction DR1. Thus, the first power line ELVDL may have a mesh structure. However, the disclosure is not limited thereto.

A line pad WPD may be disposed at and be electrically connected to at least one end of each of the data line DTL, the reference voltage line RVL, and the first power line ELVDL. The line pads WPD may be disposed in a pad area PDA of the non-display area NDA. In an embodiment, a line pad WPD_DT (hereinafter referred to as "data pad") electrically connected to the data line DTL, a line pad WPD_RV (hereinafter referred to as "reference voltage pad") electrically connected to the reference voltage line RVL, and a line pad WPD_ELVD (hereinafter referred to as "first power pad") electrically connected to the first power line ELVDL may be disposed in the pad area PDA of the non-display area NDA. In another example, the data pad WPD_DT, the reference voltage pad WPD_RV, and the first power pad WPD_ELVD may be further disposed in another non-display area NDA. As described above, the external device EXD (see FIG. 1) may be mounted on the line pad WPD. The external device EXD may be mounted on the line pad WPD by means of an anisotropic conductive film or by ultrasonic bonding.

Each pixel PX on the display substrate includes a pixel driver circuit. The above-described lines may pass through or around each pixel PX and may apply a driving signal to each pixel driver circuit. The pixel driver circuit may include a transistor and a capacitor. Each of the number of transistors and the number of capacitors in each pixel driver circuit may be variously modified. Hereinafter, a 3T1C structure in which each pixel driver circuit includes three transistors and a capacitor will be described by way of example. However, the disclosure is not limited thereto. Various modified pixel PX structures such as a 2T1C structure, a 7T1C structure, and a 6T1C structure may be applied to the disclosure.

Figure 3:
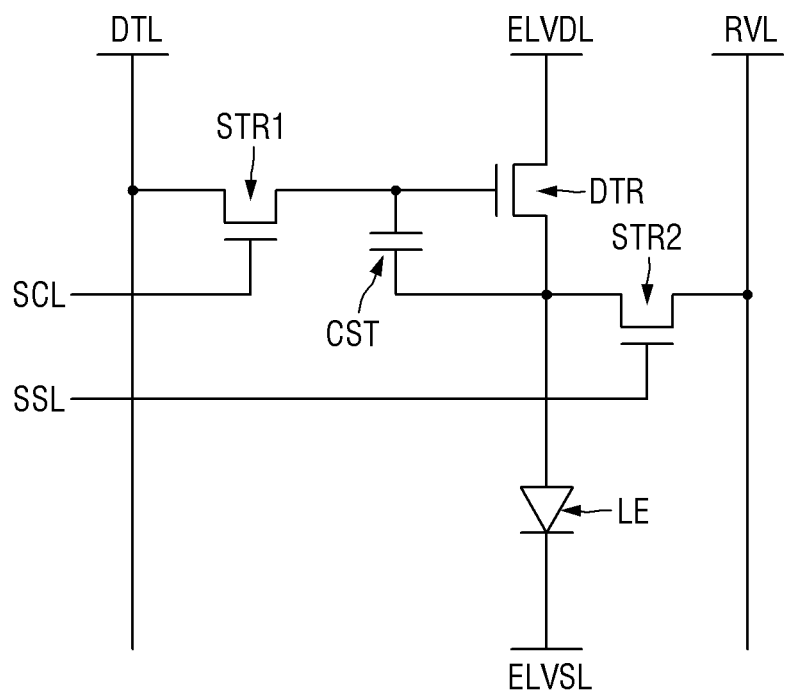
FIG. 3 is a schematic diagram of an equivalent circuit of a pixel of a display device according to an embodiment.

FIG. 3 is a schematic diagram of an equivalent circuit of a pixel of a display device according to an embodiment.

Referring to FIG. 3, each pixel PX of the display device according to an embodiment includes not only a light-emitting element LE, but also three transistors DTR, STR1, and STR2, and a capacitor CST as a storage capacitor.

The light-emitting element LE emits light based on current supplied through a driving transistor DTR. The light-emitting element LE may be implemented as an inorganic light-emitting diode, an organic light-emitting diode, a micro light-emitting diode, a nano light-emitting diode, or the like.

A first electrode, for example, an anode of the light-emitting element LE may be electrically connected to a source electrode of the driving transistor DTR, and a second electrode, for example, a cathode thereof may be electrically connected to a second power line ELVSL to which a low-potential voltage (or second power voltage) lower than a high-potential voltage (or first power voltage) of the first power line ELVDL is supplied.

The driving transistor DTR adjusts current flowing from the first power line ELVDL, to which the first power voltage is supplied, to the light-emitting element LE, based on a voltage difference between a voltage of a gate electrode thereof and a voltage of the source electrode thereof. The gate electrode of the driving transistor DTR may be electrically connected to a first electrode of a first switching transistor STR1, the source electrode thereof may be electrically connected to the first electrode of the light-emitting element LE, and a drain electrode thereof may be electrically connected to the first power line ELVDL to which the first power voltage is applied.

The first switching transistor STR1 is turned on based on a scan signal from the scan line SCL to electrically connect the data line DTL to the gate electrode of the driving transistor DTR. A gate electrode of the first switching transistor STR1 may be electrically connected to the scan line SCL, the first electrode thereof may be electrically connected to the gate electrode of the driving transistor DTR, and a second electrode thereof may be electrically connected to the data line DTL.

A second switching transistor STR2 is turned on based on a sensing signal from the sensing signal line SSL to electrically connect a reference voltage line RVL to the source electrode of the driving transistor DTR. A gate electrode of the second switching transistor STR2 may be electrically connected to the sensing signal line SSL, a first electrode thereof may be electrically connected to the reference voltage line RVL, and a second electrode thereof may be electrically connected to the source electrode of the driving transistor DTR.

In an embodiment, the first electrode of each of the first and second switching transistors STR1 and STR2 may act as a source electrode, and the second electrode thereof may act as a drain electrode. However, the disclosure is not limited thereto. The first electrode of each of the first and second switching transistors STR1 and STR2 may act as a drain electrode, while the second thereof may act as a source electrode.

The capacitor CST is disposed between the gate electrode and the source electrode of the driving transistor DTR. The storage capacitor CST stores therein the difference voltage between the gate voltage and the source voltage of the driving transistor DTR.

Each of the driving transistor DTR and the first and second switching transistors STR1 and STR2 may be embodied as a thin-film transistor. Further, in FIG. 3, an example in which each of the driving transistor DTR and the first and second switching transistors STR1 and STR2 is embodied as an N-type MOSFET (Metal Oxide Semiconductor Field Effect Transistor) is illustrated. However, the disclosure is not limited thereto. For example, each of the driving transistor DTR and the first and second switching transistors STR1 and STR2 may be embodied as a P-type MOSFET. As another example, some of the driving transistor DTR and the first and second switching transistors STR1 and STR2 may be embodied as an N-type MOSFET, and others thereof may be embodied as a P-type MOSFET.

Figure 4:
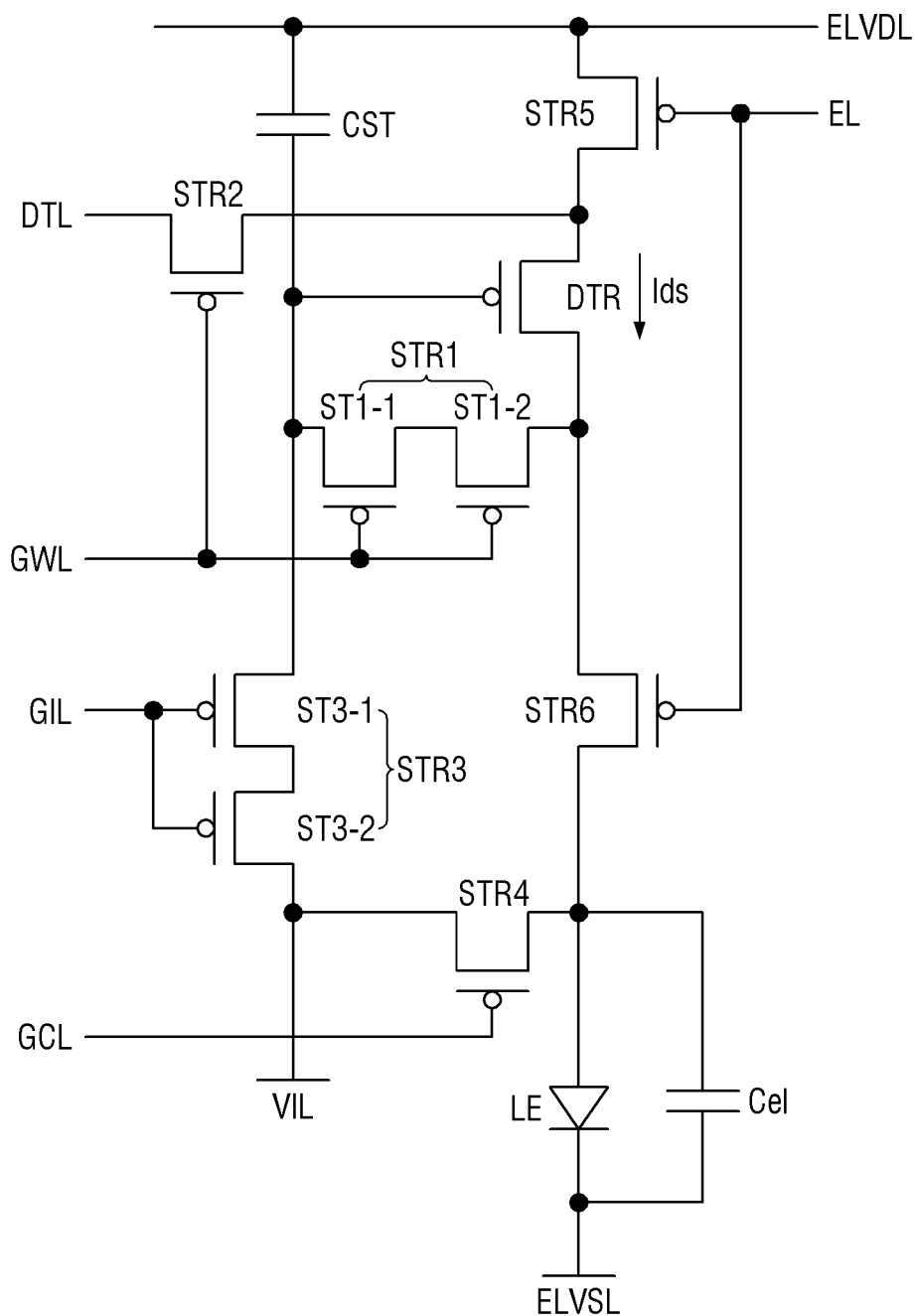
FIG. 4 is a schematic diagram of an equivalent circuit of a pixel of a display device according to another embodiment.

FIG. 4 is a schematic diagram of an equivalent circuit of a pixel of a display device according to another embodiment.

Referring to FIG. 4, a first electrode of a light-emitting element LE may be electrically connected to a first electrode of a fourth switching transistor STR4 and a second electrode of a sixth switching transistor STR6, and a second electrode of the light-emitting element LE may be electrically connected to a second power line ELVSL. A parasitic capacitance Cel may be formed between the first and second electrodes of the light-emitting element LE.

Each pixel PX includes a driving transistor DTR, switch elements, and a capacitor CST. The switch elements include first to sixth switching transistors STR1, STR2, STR3, STR4, STR5, and STR6. The first switching transistor STR1 may include two transistors ST1-1 and ST1-2, and the third switching transistor STR3 may include two transistors ST3-1 and ST3-2.

The driving transistor DTR includes a gate electrode, a first electrode, and a second electrode. The driving transistor DTR controls a drain-source current Ids (hereinafter referred to as "drive current") flowing between the first electrode and the second electrode based on a data voltage applied to the gate electrode thereof.

The capacitor CST is formed between the second electrode of the driving transistor DTR and the second power line ELVSL. An electrode of the capacitor CST may be electrically connected to the second electrode of the driving transistor DTR, and another electrode thereof may be electrically connected to the second power line ELVSL.

In case that a first electrode of each of the first to sixth switching transistors STR1, STR2, STR3, STR4, STR5, and STR6 and the driving transistor DTR acts as a source electrode, a second electrode thereof may act as a drain electrode. As another example, in case that the first electrode of each of the first to sixth switching transistors STR1, STR2, STR3, STR4, STR5, and STR6 and the driving transistor DTR acts as a drain electrode, the second electrode thereof may act as a source electrode.

An active layer of each of the first to sixth switching transistors STR1, STR2, STR3, STR4, STR5 and STR6, and the driving transistor DTR may be made of (or include) one of polysilicon, amorphous silicon, and oxide semiconductor. In case that the active layer of each of the first to sixth switching transistors STR1, STR2, STR3, STR4, STR5 and STR6 and the driving transistor DTR is made of polysilicon, a process for forming the active layer may be a low-temperature polysilicon (LTPS) process.

Further, FIG. 4 illustrates that each of the first to sixth switching transistors STR1, STR2, STR3, STR4, STR5 and STR6 and the driving transistor DTR is embodied as a P-type MOSFET. However, the disclosure is not limited thereto. Each of the first to sixth switching transistors STR1, STR2, STR3, STR4, STR5 and STR6 and the driving transistor DTR may be embodied as an N-type MOSFET.

Furthermore, a first power voltage of a first power line ELVDL, a second power voltage of the second power line ELVSL, and a third power voltage of a third power line VIL may be set in consideration of characteristics of the driving transistor DTR and characteristics of the light-emitting element LE.

Figure 5:
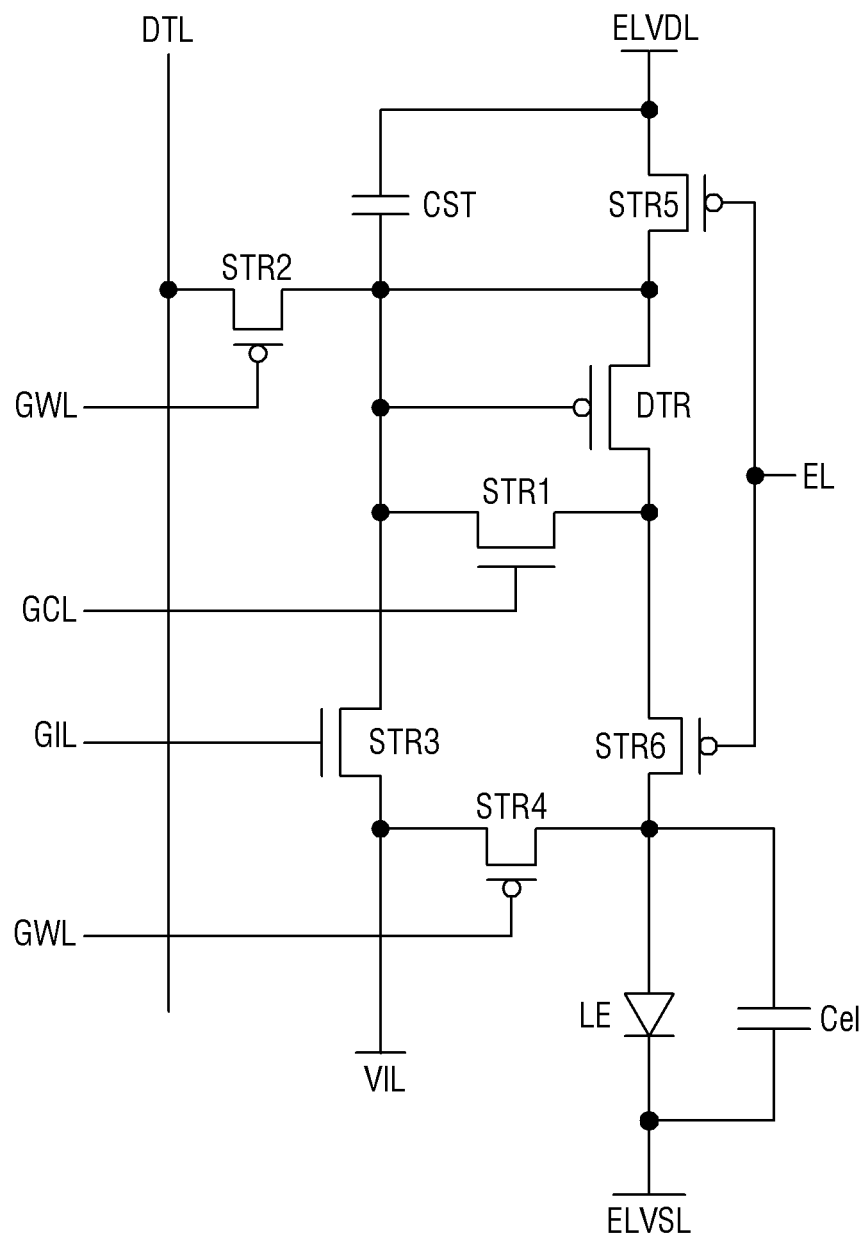
FIG. 5 is a schematic diagram of an equivalent circuit of a pixel of a display device according to still another embodiment.

FIG. 5 is a schematic diagram of an equivalent circuit of a pixel of the display device according to still another embodiment.

The embodiment of FIG. 5 is different from the embodiment of FIG. 4 at least in that each of the driving transistor DTR, the second switching transistor STR2, the fourth switching transistor STR4, the fifth switching transistor STR5, and the sixth switching transistor STR6 is embodied as a P-type MOSFET, and each of the first switching transistor STR1 and the third switching transistor STR3 is embodied as an N-type MOSFET.

Referring to FIG. 5, an active layer of each of the driving transistor DTR, the second switching transistor STR2, the fourth switching transistor STR4, the fifth switching transistor STR5, and the sixth switching transistor STR6 which is embodied as the P-type MOSFET may be made of polysilicon, and an active layer of each of the first switching transistor STR1 and the third switching transistor STR3 which is embodied as an N-type MOSFET may be made of an oxide semiconductor.

The embodiment of FIG. 5 is further different from the embodiment of FIG. 4 at least in that a gate electrode of the second switching transistor STR2 and a gate electrode of the fourth switching transistor STR4 is electrically connected to a write scan line GWL, and a gate electrode of the first switching transistor ST1 is electrically connected to a control scan line GCL. Further, as illustrated in FIG. 5, each of the first switching transistor STR1 and the third switching transistor STR3 is embodied as an N-type MOSFET such that a scan signal of a gate high voltage may be applied to the control scan line GCL and an initialization scan line GIL. Each of the second switching transistor STR2, the fourth switching transistor STR4, the fifth switching transistor STR5, and the sixth switching transistor STR6 is embodied as a P-type MOSFET such that a scan signal of a low gate voltage may be applied to the write scan line GWL and a light-emission line EL.

In an example, it should be noted that an equivalent circuit diagram of a pixel according to an embodiment of the specification is not limited to that shown in FIGS. 3 to 5. The equivalent circuit diagram of the pixel according to the embodiment of the present specification may have other circuit structures employable by those skilled in the art than those of the embodiments shown in FIGS. 3 to 5.

Figure 6:
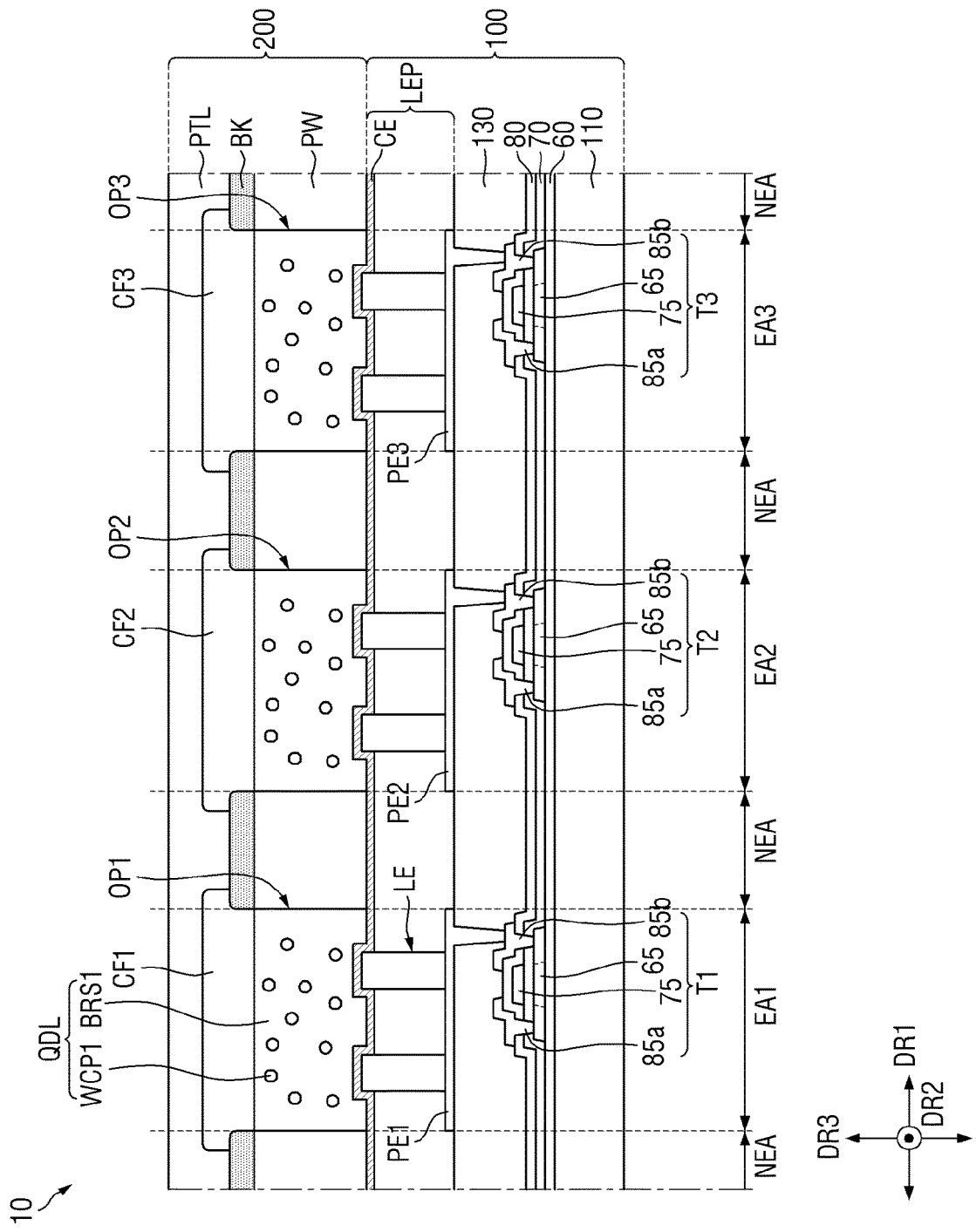
FIG. 6 is a cross-sectional view schematically showing a display device according to an embodiment.
Figure 7:
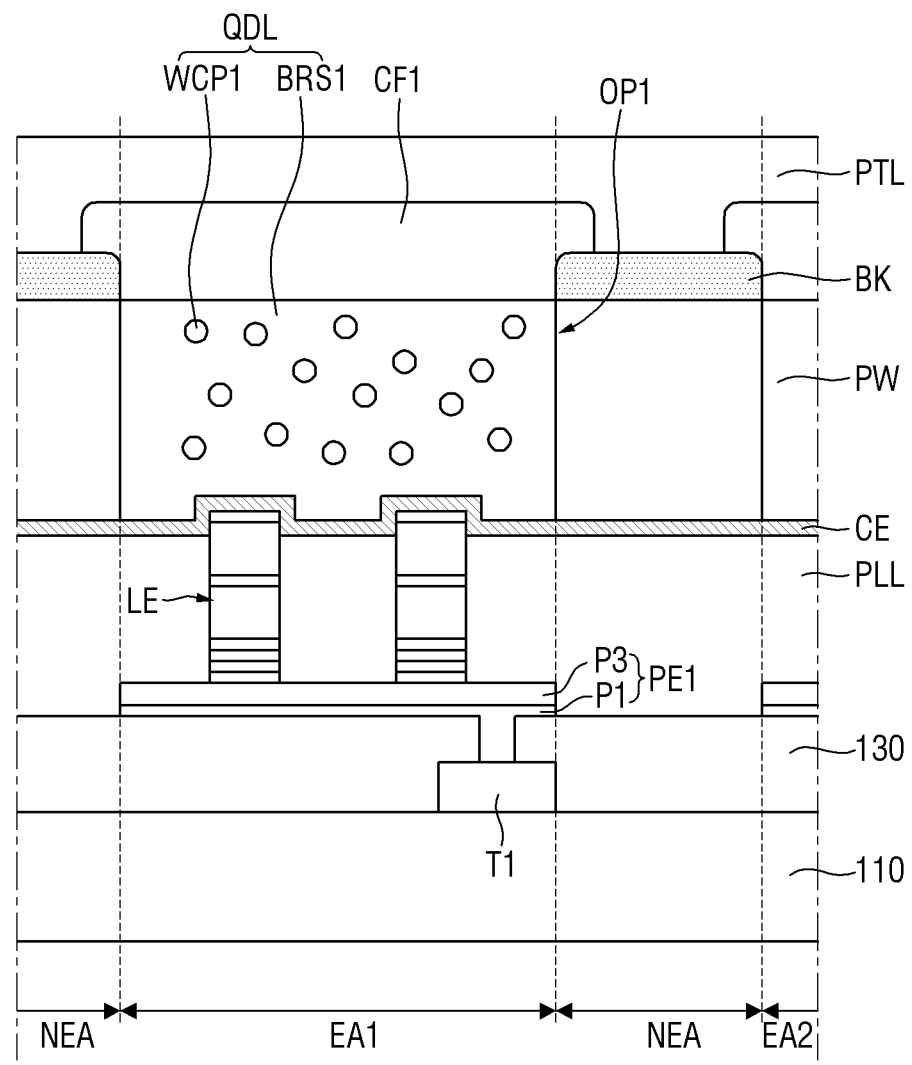
FIG. 7 is an enlarged view schematically showing a first light-emitting area according to an embodiment.
Figure 8:
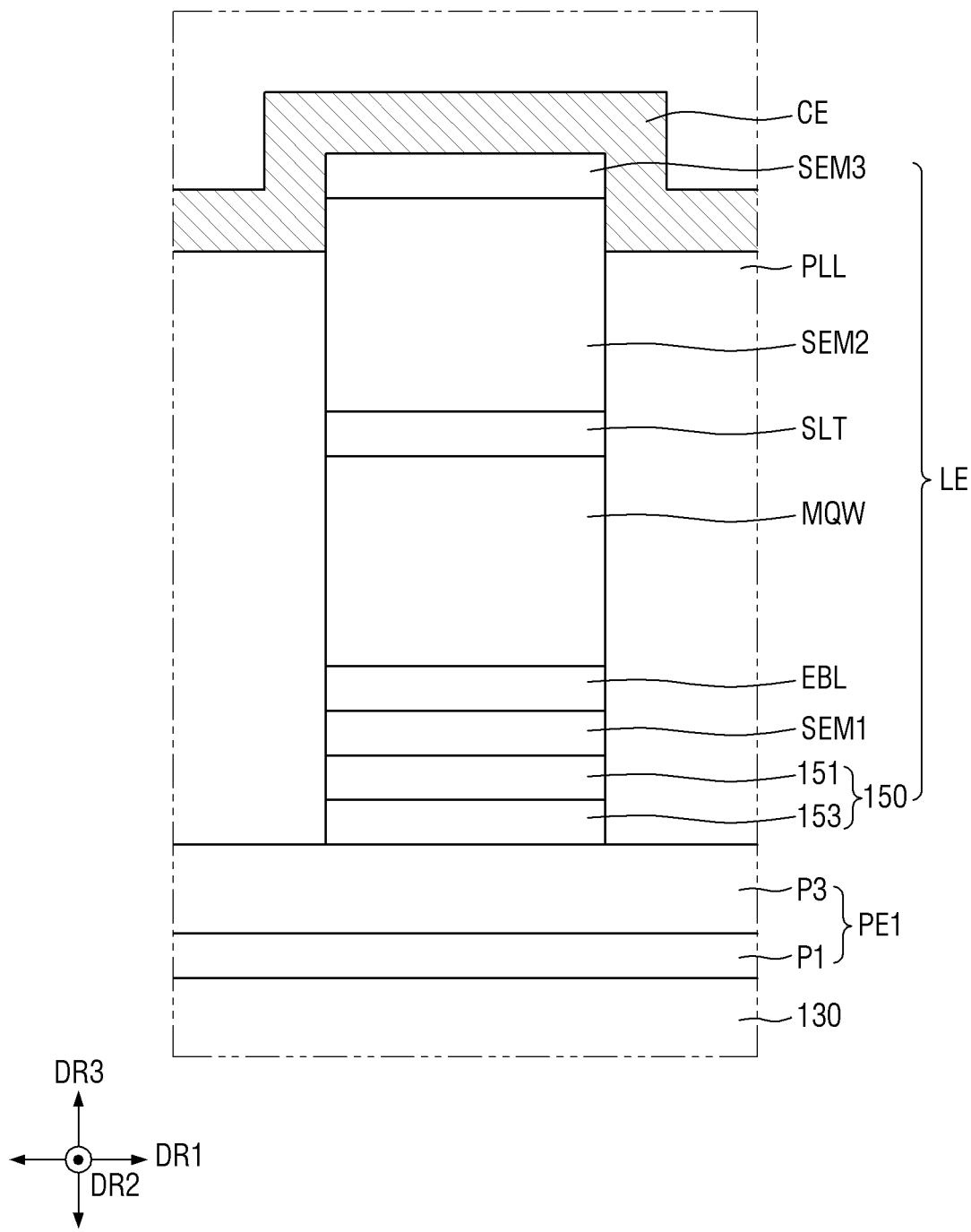
FIG. 8 is a cross-sectional view schematically showing a pixel electrode and a light-emitting element according to an embodiment.
Figure 9:
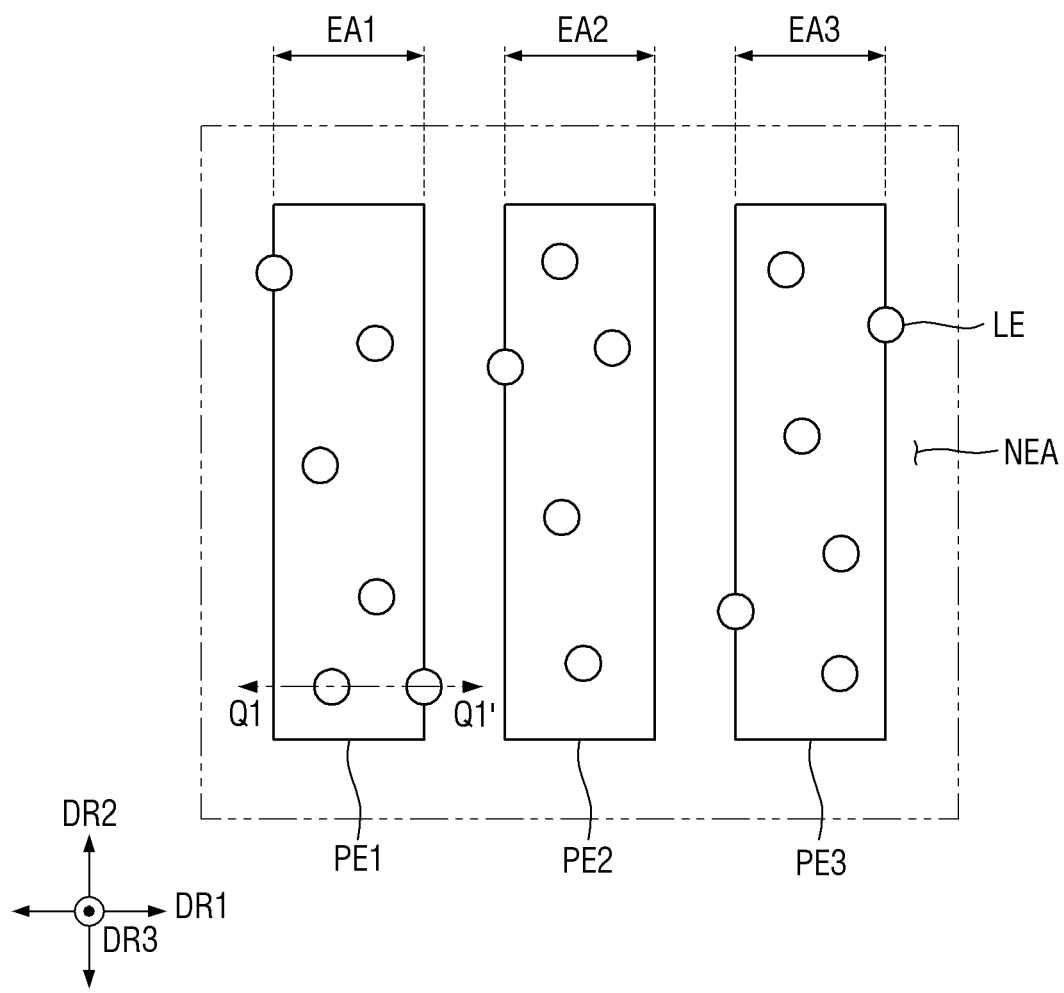
FIG. 9 is a plan view schematically showing light-emitting areas of a display device according to an embodiment.
Figure 10:
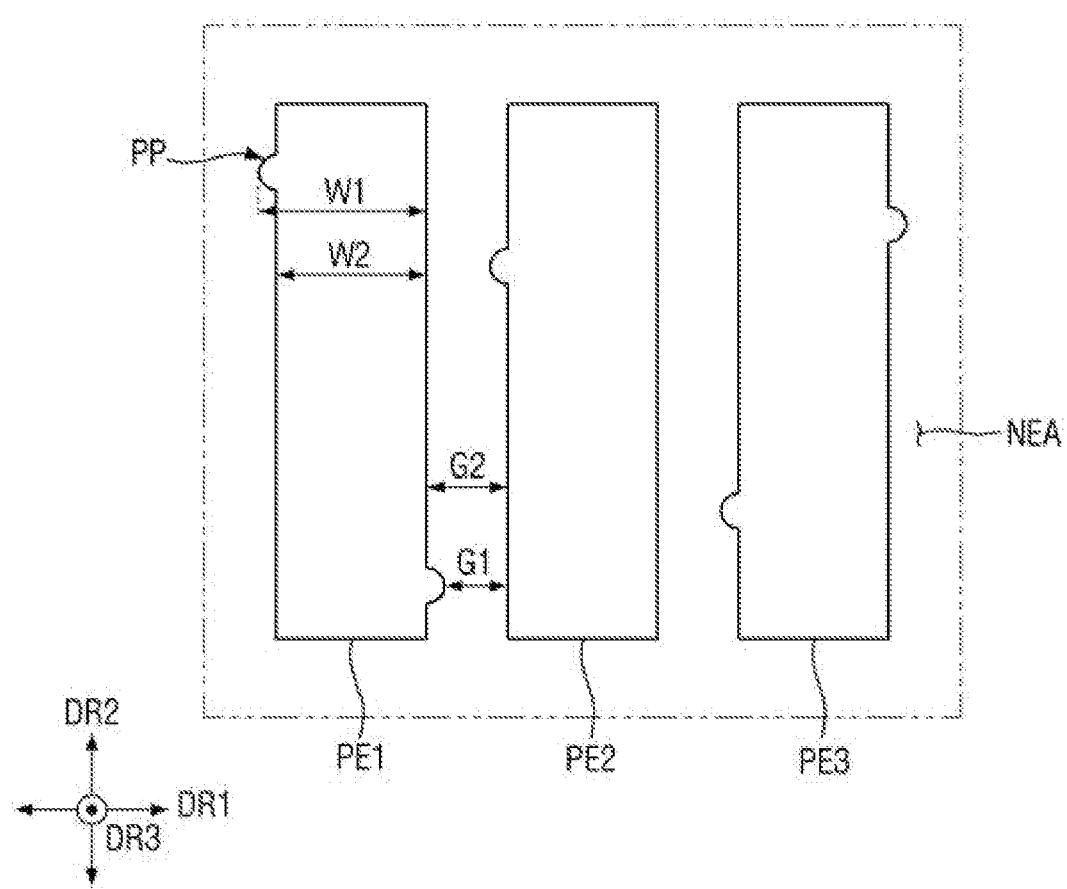
FIG. 10 is a plan view schematically showing a pixel electrode according to an embodiment.
Figure 11:
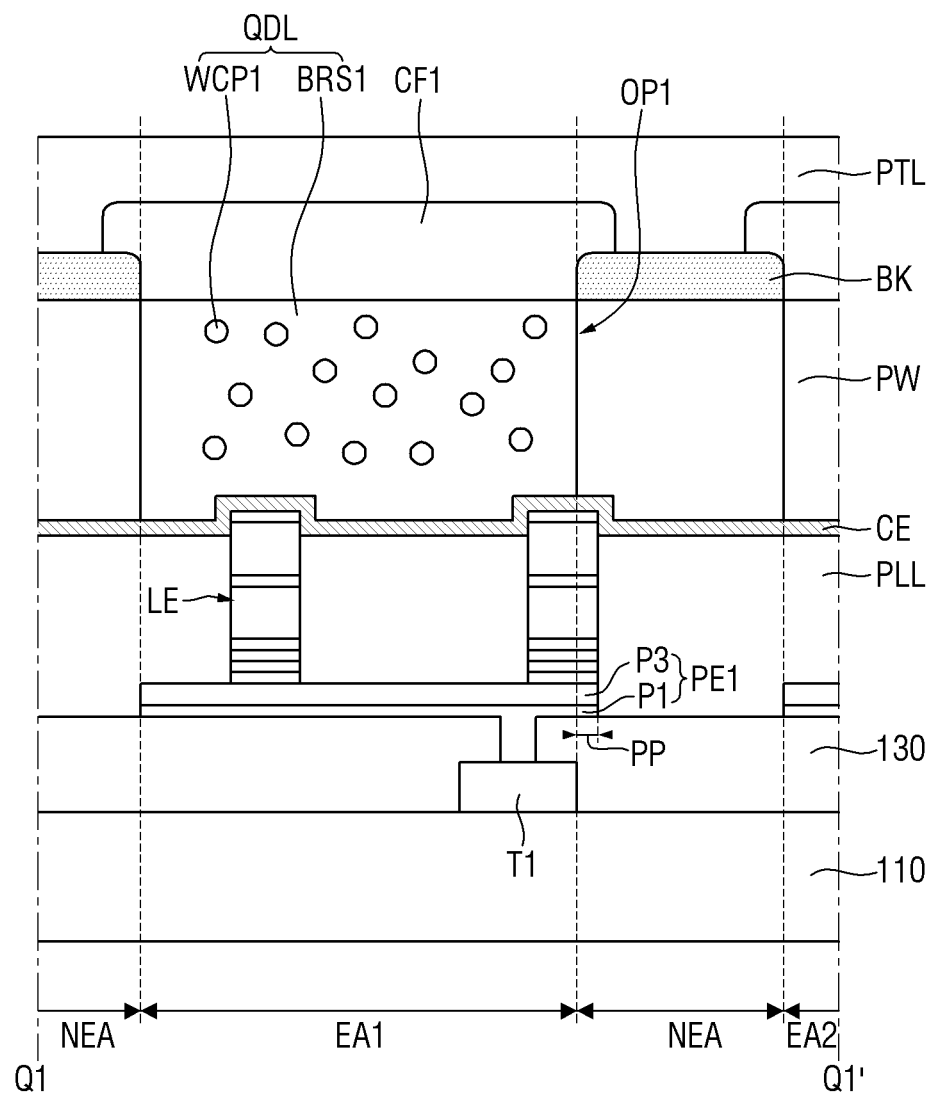
FIG. 11 is a schematic cross-sectional view taken along a line Q1-Q1' in FIG. 9.
Figure 12:
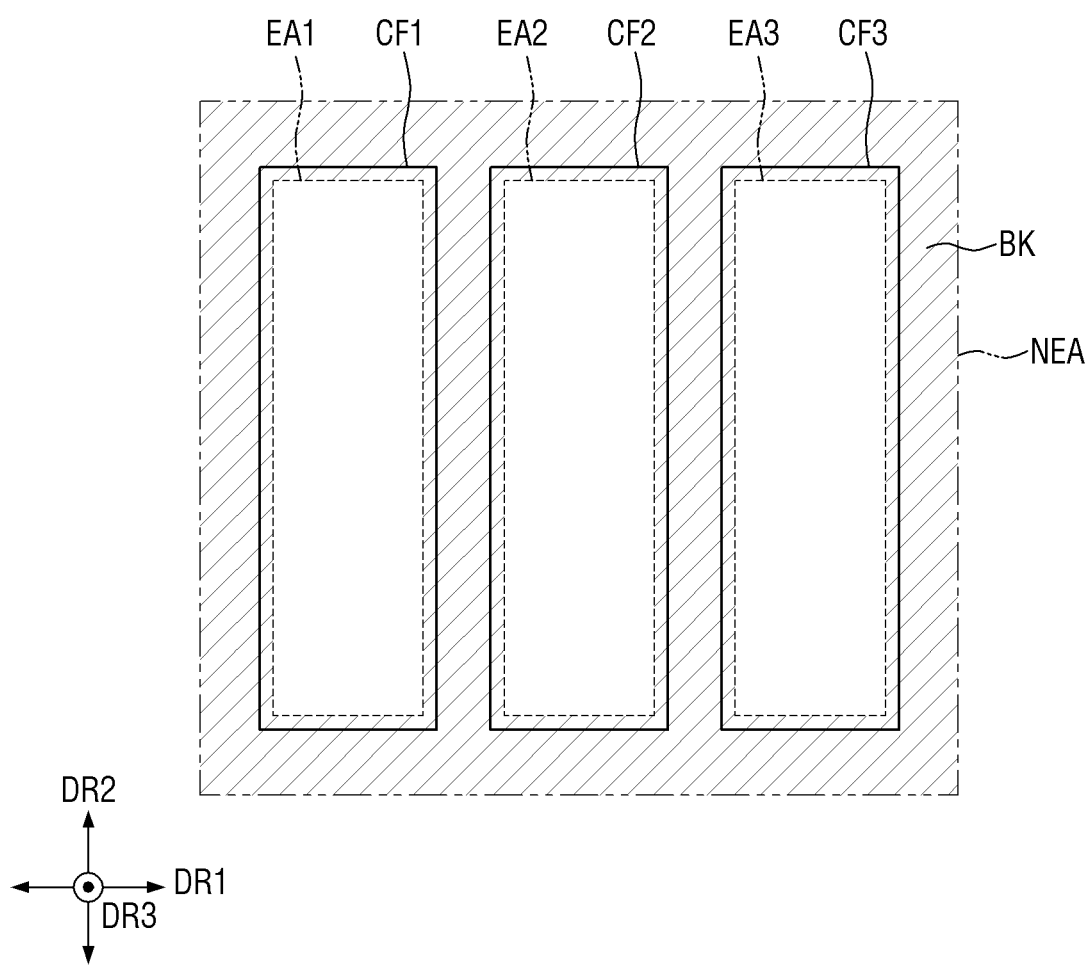
FIG. 12 is a plan view schematically showing a plurality of light-emitting areas and a plurality of color filters.
Figure 13:
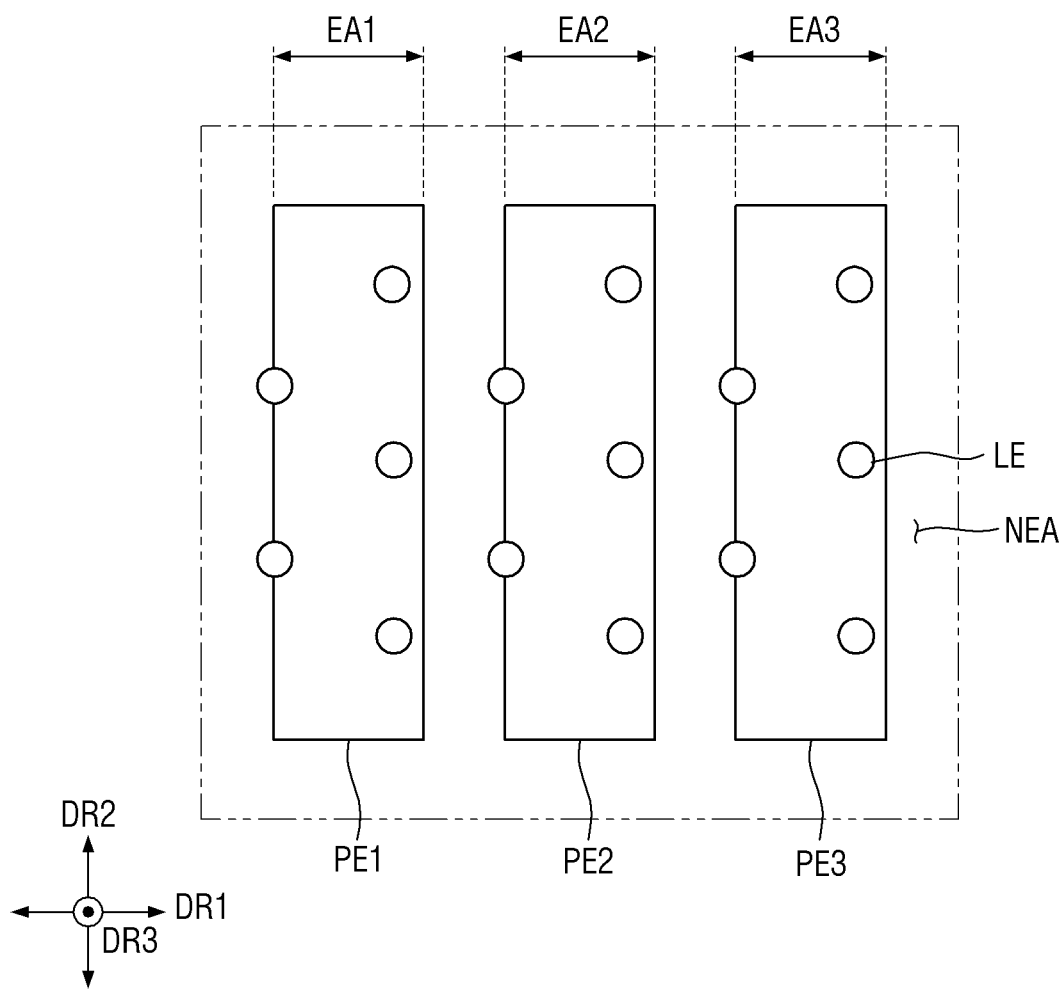
FIG. 13 is a plan view schematically showing a modified example of an arrangement of a pixel electrode and a light-emitting element according to an embodiment.
Figure 14A:
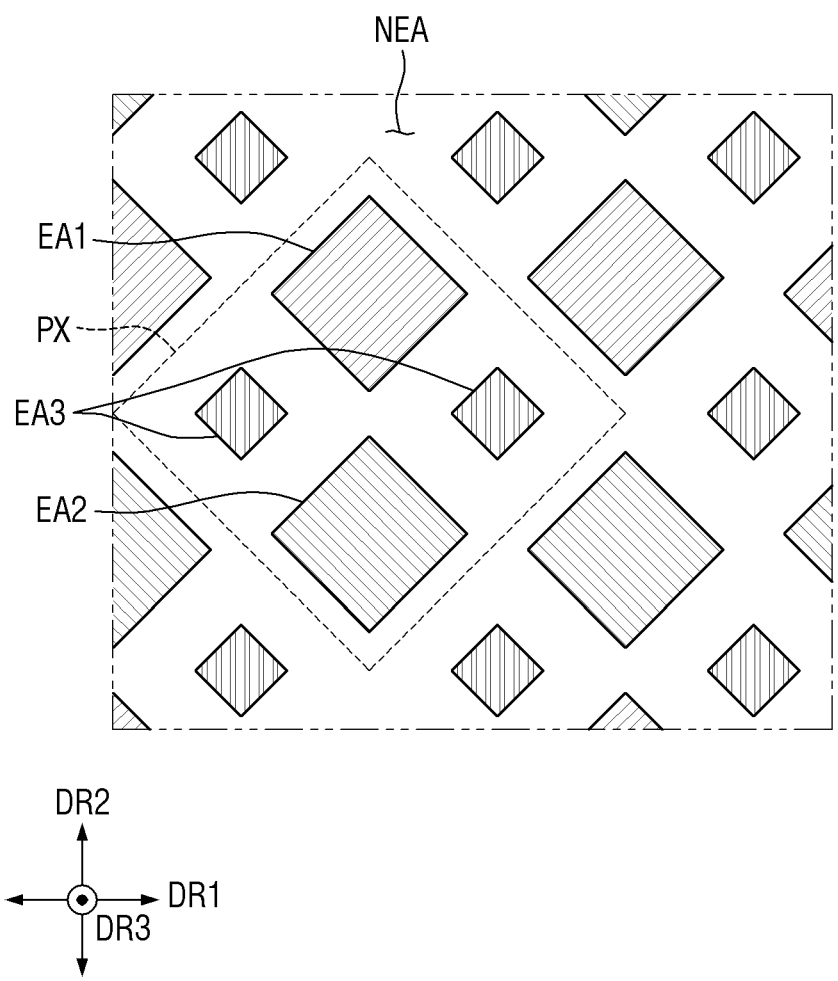
FIG. 14A to FIG. 14C are plan views schematically showing modified examples of light-emitting areas of a display device according to an embodiment.
Figure 14B:
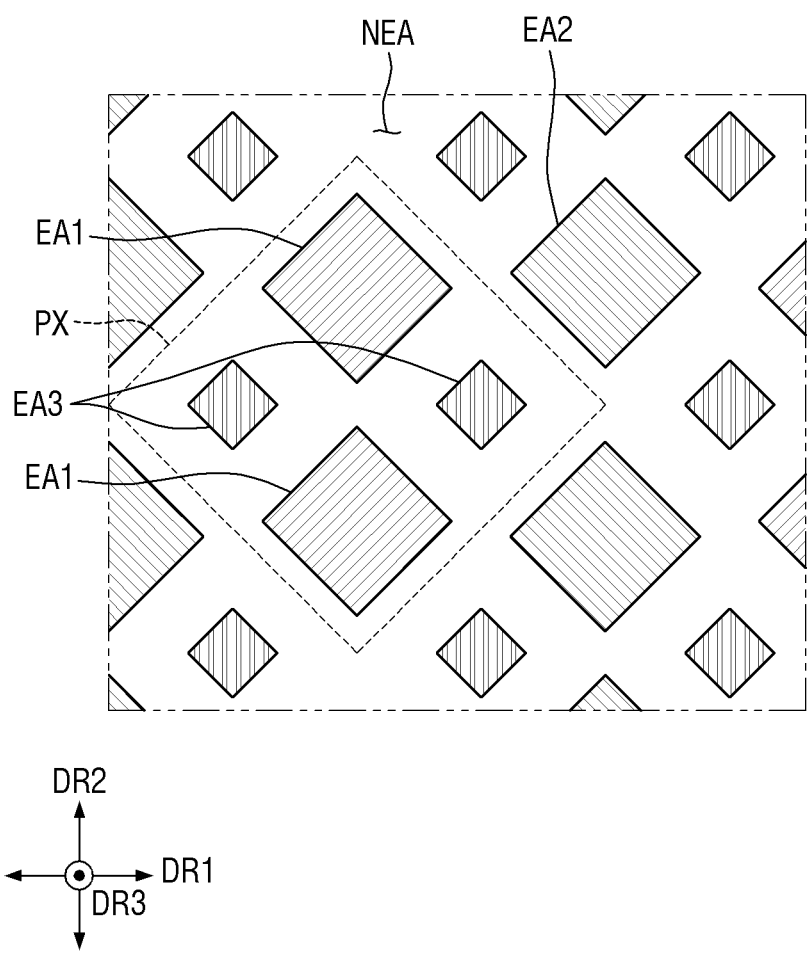
Figure 14C:
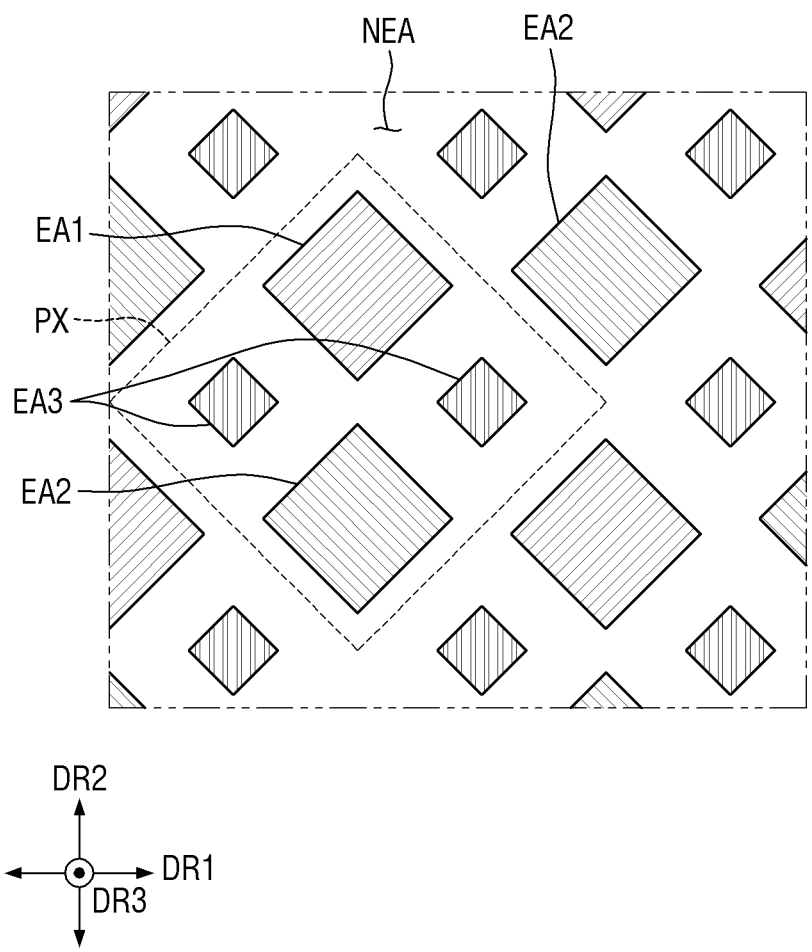

FIG. 6 is a cross-sectional view schematically illustrating a display device according to an embodiment. FIG. 7 is an enlarged view schematically illustrating a first light-emitting area according to an embodiment. FIG. 8 is a schematic cross-sectional view illustrating a pixel electrode and a light-emitting element according to an embodiment. FIG. 9 is a schematic plan view illustrating light-emitting areas of a display device according to an embodiment. FIG. 10 is a plan view schematically illustrating a pixel electrode according to an embodiment. FIG. 11 is a schematic cross-sectional view taken along line Q1-Q1' in FIG. 9. FIG. 12 is a plan view schematically illustrating light-emitting areas and color filters. FIG. 13 is a schematic plan view illustrating a modified example of an arrangement of a pixel electrode and a light-emitting element according to an embodiment. FIGS. 14A to 14C are schematic plan views illustrating modified examples of light-emitting areas of a display device according to an embodiment.

Referring to FIGS. 6 to 12, the display device 10 may include a display substrate 100 and a wavelength converter 200 disposed on the display substrate 100.

The display substrate 100 may include a first substrate 110 and a light-emitter LEP disposed on the first substrate 110. The first substrate 110 may act as an insulating substrate. The first substrate 110 may include a transparent material. For example, the first substrate 110 may include a transparent insulating material such as glass, quartz, or the like. The first substrate 110 may be embodied as a rigid substrate. However, the first substrate 110 may not be limited thereto, and may include plastic such as polyimide and the like, or may be flexible, for example, may be bendable, foldable, or rollable. Light-emitting areas EA1, EA2, and EA3 and non-light-emitting areas NEA may be defined on the first substrate 110.

Switching elements T1, T2, and T3 may be disposed on the first substrate 110. In an embodiment, a first switching element T1 may be located in a first light-emitting area EA1 of the first substrate 110, a second switching element T2 may be positioned in a second light-emitting area EA2 thereof, and a third switching element T3 may be positioned in a third light-emitting area EA3 thereof. However, the disclosure is not limited thereto. In an embodiment, at least one of the first switching element T1, the second switching element T2, or the third switching element T3 may be located in the non-light-emitting area NEA.

In an embodiment, each of the first switching element T1, the second switching element T2, and the third switching element T3 may be embodied as a thin-film transistor including an amorphous silicon, a polysilicon, or an oxide semiconductor. Although not shown in the drawings, signal lines (for example, a gate line, a data line, and a power line) for transmitting a signal to each of the switching elements may be further disposed on the first substrate 110.

Each of the switching elements T1, T2, and T3 may include a semiconductor layer 65, a gate electrode 75, a source electrode 85a, and a drain electrode 85b. Specifically, a buffer layer 60 may be disposed on the first substrate 110. The buffer layer 60 may be disposed to cover an entire face of the first substrate 110. The buffer layer 60 may include silicon nitride, silicon oxide, or silicon oxynitride and may be composed of (or include) a single layer or a double layer.

The semiconductor layer 65 may be disposed on the buffer layer 60. The semiconductor layer 65 may form a channel of each of the switching elements T1, T2, and T3. The semiconductor layer 60 may include amorphous silicon, polycrystalline silicon, or oxide semiconductor. In an example, the oxide semiconductor may include, for example, a binary compound ($AB_x$), a ternary compound ($AB_xC_y$), or a quaternary compound ($AB_xC_yD_z$) containing indium (In), zinc (Zn), gallium (Ga), tin (Sn), titanium (Ti), aluminum (Al), hafnium (Hf), zirconium (Zr), magnesium (Mg), etc. In an embodiment, the semiconductor layer 65 may include indium gallium zinc oxide (IGZO).

A gate insulating layer 70 may be disposed on the semiconductor layer 65. The gate insulating layer 70 may include a silicon compound, a metal oxide, etc. For example, the gate insulating layer 70 may include silicon oxide, silicon nitride, silicon oxynitride, aluminum oxide, tantalum oxide, hafnium oxide, zirconium oxide, titanium oxide, or the like. In an embodiment, the gate insulating layer 70 may include silicon oxide.

The gate electrode 75 may be disposed on the gate insulating layer 70. The gate electrode 75 may overlap the semiconductor layer 65 (e.g., in a plan view). The gate electrode 75 may include a conductive material. The gate electrode 75 may include a metal oxide such as ITO, IZO, ITZO, or $In_2O_3$, or a metal such as copper (Cu), titanium (Ti), aluminum (Al), molybdenum (Mo), tantalum (Ta), calcium (Ca), chromium (Cr), magnesium (Mg), or nickel (Ni). For example, the gate electrode 75 may be embodied as a Cu/Ti double layer in which an upper layer made of copper is stacked on a lower layer made of titanium. However, the disclosure is not limited thereto.

An interlayer insulating layer 80 may be disposed on the gate electrode 75. The interlayer insulating layer 80 may include an inorganic insulating material such as silicon oxide, silicon nitride, silicon oxynitride, hafnium oxide, aluminum oxide, titanium oxide, tantalum oxide, zinc oxide, etc.

The source electrode 85a and the drain electrode 85b may be disposed on the interlayer insulating layer 80. The source electrode 85*a* and the drain electrode 85*b* may contact the semiconductor layer 65 via contact holes extending through the interlayer insulating layer 80 and the gate insulating layer 70. Each of the source electrode 85*a* and the drain electrode 85*b* may be made of a metal oxide such as ITO, IZO, ITZO, or $In_2O_3$ or a metal such as copper (Cu), titanium (Ti), aluminum (Al), molybdenum (Mo), tantalum (Ta), calcium (Ca), chromium (Cr), magnesium (Mg), or nickel (Ni). For example, each of the source electrode 85*a* and the drain electrode 85*b* may be embodied as a Cu/Ti double layer in which an upper layer made of copper is stacked on a lower layer made of titanium. However, the disclosure is not limited thereto.

An insulating layer 130 may be disposed on the first switching element T1, the second switching element T2, and the third switching element T3. In an embodiment, the insulating layer 130 may act as a planarization layer and may include an organic material. For example, the insulating layer 130 may include an acrylic-based resin, an epoxy-based resin, an imide-based resin, an ester-based resin, and the like. In an embodiment, the insulating layer 130 may include a positive photosensitive material or a negative photosensitive material.

The light-emitter LEP may be disposed on the insulating layer 130. The light-emitter LEP may include pixel electrodes PE1, PE2, and PE3, light-emitting elements LE, and a common electrode CE.

The pixel electrodes PE1, PE2, and PE3 may include a first pixel electrode PE1, a second pixel electrode PE2, and a third pixel electrode PE3. Each of the first pixel electrode PE1, the second pixel electrode PE2, and the third pixel electrode PE3 may serve (or function) as the first electrode of the light-emitting element LE, and may act as an anode or a cathode. The first pixel electrode PE1 may be located in the first light-emitting area EA1, the second pixel electrode PE2 may be located in the second light-emitting area EA2, and the third pixel electrode PE3 may be located in the third light-emitting area EA3. In an embodiment, the first pixel electrode PE1 may entirely overlap the first light-emitting area EA1, the second pixel electrode PE2 may entirely overlap the second light-emitting area EA2, and the third pixel electrode PE3 may entirely overlap the third light-emitting area EA3. The first pixel electrode PE1 may extend through the insulating layer 130 and may be electrically connected to the first switching element T1. The second pixel electrode PE2 may extend through the insulating layer 130 and may be electrically connected to the second switching element T2. The third pixel electrode PE3 may extend through the insulating layer 130 and may be electrically connected to the third switching element T3.

Each of the first pixel electrode PE1, the second pixel electrode PE2, and the third pixel electrode PE3 may include metal. The metal may include, for example, copper (Cu), titanium (Ti), silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), or a mixture thereof. Further, each of the first pixel electrode PE1, the second pixel electrode PE2, and the third pixel electrode PE3 may have a multi-layer structure in which two or more metal layers are stacked. For example, each of the first pixel electrode PE1, the second pixel electrode PE2, and the third pixel electrode PE3 may have a two-layer structure in which a copper layer is stacked on a titanium layer. However, the disclosure is not limited thereto.

Referring to FIG. 7, in this embodiment, each of the first to third pixel electrodes PE1, PE2, and PE3 may include a lower electrode layer P1 and an upper electrode layer P3. Hereinafter, the first pixel electrode PE1 will be described by way of example.

The lower electrode layer P1 may form a lower portion of the first pixel electrode PE1 and be electrically connected to the switching element. The lower electrode layer P1 may serve to impart adhesion between the insulating layer 130 and the first pixel electrode PE1. The lower electrode layer P1 may include metal, for example, titanium.

The upper electrode layer P3 may be disposed on the lower electrode layer P1 and may directly contact the light-emitting element LE. The upper electrode layer P3 may be disposed between the lower electrode layer P1 and the light-emitting element LE and may serve to impart adhesion between the first pixel electrode PE1 and the light-emitting element LE. The upper electrode layer P3 may include metal, for example, copper.

Light-emitting elements LE may be disposed on each of the first pixel electrode PE1, the second pixel electrode PE2, and the third pixel electrode PE3.

As shown in FIGS. 6 to 8, the light-emitting elements LE may be disposed in each of the first light-emitting area EA1, the second light-emitting area EA2, and the third light-emitting area EA3. The light-emitting element LE may be embodied as a vertical light-emitting diode element that extends in the third direction DR3 in an elongate manner. For example, a length in the third direction DR3 of the light-emitting element LE may be larger than a length in the horizontal direction thereof. The length in the horizontal direction indicates a length in the first direction DR1 or a length in the second direction DR2. For example, the length in the third direction DR3 of the light-emitting element LE may be in a range of about 1 μm to about 5 μm.

The light-emitting element LE may be embodied as a micro light-emitting diode. The light-emitting element LE may include a connective electrode 150, a first semiconductor layer SEM1, an electron blocking layer EBL, an active layer MQW, a superlattice layer SLT, a second semiconductor layer SEM2, and a third semiconductor layer SEM3 which are arranged in the thickness direction of the display substrate 100, for example, in the third direction DR3. The connective electrode 150, the first semiconductor layer SEM1, the electron blocking layer EBL, the active layer MQW, the superlattice layer SLT, the second semiconductor layer SEM2, and the third semiconductor layer SEM3 may be sequentially stacked in the third direction DR3.

The light-emitting element LE may have a cylindrical shape, a disk shape, or a rod shape in which a width is larger than a height. However, the disclosure is not limited thereto. For example, the light-emitting element LE may have various shape including a shape of a rod, a wire, a tube, etc., a shape of a cube, a cuboid, or a polygonal prism such as a hexagonal prism, or a shape extending in a direction but having a partially inclined outer face.

The connective electrode 150 may be disposed on each of the pixel electrodes PE1, PE2, and PE3. Hereinafter, the light-emitting element LE disposed on the first pixel electrode PE1 will be described by way of example. However, the disclosure is not limited thereto. A following description may be equally applied to structures of the light-emitting elements LE disposed on the second pixel electrode PE2 and the third pixel electrode PE3.

The connective electrode 150 may include a reflective layer 151 and a connection layer 153. The reflective layer 151 may serve to reflect light emitted from an active layer MQW of the light-emitting element LE. The reflective layer 151 may be disposed adjacent to the active layer MQW of the light-emitting element LE. The reflective layer 151 may include a metal material (or metal) having high light reflectivity while having conductivity. The reflective layer 151 may include, for example, aluminum (Al) or silver (Ag), or an alloy thereof.

The connection layer 153 may serve to transmit a light-emission signal from the first pixel electrode PE1 to the light-emitting element LE. The connection layer 153 may be embodied as an ohmic connection electrode. However, the disclosure is not limited thereto, and the connection layer 153 may be embodied as a Schottky connection electrode. The connection layer 153 may form the bottommost portion of the light-emitting element LE and may be disposed farther from the active layer MQW than the reflective layer 151 may be. The connection layer 153 may include at least one of gold (Au), copper (Cu), tin (Sn), silver (Ag), aluminum (Al), and titanium (Ti). For example, the connection layer 153 may include 9:1 alloy, 8:2 alloy or 7:3 alloy of gold and tin, or an alloy (SAC305) of copper, silver and tin.

FIG. 8 illustrates that the light-emitting element LE includes the connective electrode 150 having a double-layer structure composed of (or including) a single reflective layer 151 and a single connection layer 153. However, the disclosure is not limited thereto. In some cases, the light-emitting element LE may include the connective electrode 150 in which a larger number of layers are stacked, or some layers may be omitted.

The first semiconductor layer SEM1 may be disposed on the connective electrode 150. The first semiconductor layer SEM1 may be a p-type semiconductor and may include a semiconductor material of a chemical formula $Al_xGa_yIn_{1-x-y}N$ ($0 \le x \le 1$, $0 \le y \le 1$, $0 \le x+y \le 1$). For example, the first semiconductor layer SEM1 may be made of at least one of AlGaInN, GaN, AlGaN, InGaN, AlN, or InN doped with p-type dopants. The first semiconductor layer SEM1 may be doped with a p-type dopant. The p-type dopant may be Mg, Zn, Ca, Se, Ba, or the like. For example, the first semiconductor layer SEM1 may be made of p-GaN doped with Mg as a p-type dopant. A thickness of the first semiconductor layer SEM1 may in a range of about 30 nm to about 200 nm, but is not limited thereto.

The electron blocking layer EBL may be disposed on the first semiconductor layer SEM1. The electron blocking layer EBL may function to inhibit or prevent an excessive amount of electrons from flowing into the active layer MQW. For example, the electron blocking layer EBL may be made of p-AlGaN doped with Mg as a p-type dopant. A thickness of the electron blocking layer EBL may be in a range of about 10 nm to about 50 nm, but may not be limited thereto. Further, the electron blocking layer EBL may be omitted.

The active layer MQW may be disposed on the electron blocking layer EBL. The active layer MQW may emit light via combinations between electrons and holes using an electric signal applied through the first semiconductor layer SEM1 and the second semiconductor layer SEM2. The active layer MQW may emit first light having a central wavelength band in a range of about 450 nm to about 495 nm, for example, light having a blue wavelength band.

The active layer MQW may include a material having a single or multi-quantum well structure. In case that the active layer MQW includes a material having a multi-quantum well structure, well layers and barrier layers may be alternately stacked each other. In this connection, the well layer may be made of InGaN, and the barrier layer may be made of GaN or AlGaN. However, the disclosure is not limited thereto.

As another example, the active layer MQW may have a structure in which a semiconductor material having a large bandgap energy and a semiconductor material having a small bandgap energy are alternately stacked each other. The active layer MQW may include groups III to V semiconductor materials depending on a wavelength band of light to be emitted therefrom. The light emitted from the active layer MQW is not limited to the first light (having a blue wavelength band). In some cases, the light emitted from the active layer MQ may be second light (having a green wavelength band) or third light (having a red wavelength band). In an embodiment, in case that a semiconductor material contained in the active layer MQW includes indium, a color of emitted light may vary based on a content of indium. For example, in case that the content of indium decreases, a wavelength band of the emitted light may shift toward a red wavelength band. In case that the content of indium increases, the wavelength band of the emitted light may shift toward a blue wavelength band.

The superlattice layer SLT may be disposed on the active layer MQW. The superlattice layer SLT may function to relieve stress between the second semiconductor layer SEM2 and the active layer MQW. For example, the superlattice layer SLT may be made of InGaN or GaN. A thickness of the superlattice layer SLT may be in a range of about 50 nm to about 200 nm. The superlattice layer SLT may be omitted.

The second semiconductor layer SEM2 may be disposed on the superlattice layer SLT. The second semiconductor layer SEM2 may be embodied as an n-type semiconductor.

The second semiconductor layer SEM2 may include a semiconductor material having a chemical formula $Al_xGa_yIn_{1-x-y}N$ ($0 \le x \le 1$, $0 \le y \le 1$, $0 \le x+y \le 1$). For example, the second semiconductor layer SEM2 may be made of at least one of AlGaInN, GaN, AlGaN, InGaN, AlN, or InN doped with n-type dopants. The second semiconductor layer SEM2 may be doped with an n-type dopant. The n-type dopant may be Si, Ge, Sn, or the like. For example, the second semiconductor layer SEM2 may be made of n-GaN doped with n-type Si. A thickness of the second semiconductor layer SEM2 may in a range of about 2 μm to about 4 μm, but is not limited thereto.

The third semiconductor layer SEM3 may be disposed on the second semiconductor layer SEM2. The third semiconductor layer SEM3 may be disposed between the second semiconductor layer SEM2 and a common electrode CE. The third semiconductor layer SEM3 may include an undoped semiconductor. The third semiconductor layer SEM3 and the second semiconductor SEM2 may include a same material, but the third semiconductor layer SEM3 is undoped (or not doped) with an n-type or p-type dopant. In an embodiment, the third semiconductor layer SEM3 may include at least one of InAlGaN, GaN, AlGaN, InGaN, AlN or InN as undoped. However, the disclosure is not limited thereto.

A planarization layer PLL may be disposed on the pixel electrodes PE1, PE2, and PE3 and the insulating layer 130. The planarization layer PLL may planarize underlying steps (or differences in height) formed on top faces of the pixel electrodes PE1, PE2, and PE3 so that the common electrode CE which will be described below may be formed on a top face of the planarization layer PLL. The planarization layer PLL may have a vertical dimension (e.g., a predetermined or selected vertical dimension) such that at least a portion, for example, a top portion of each of the light-emitting elements LE may protrude upward beyond a top face of the planarization layer PLL. For example, the vertical dimension of the planarization layer PLL from the top face of the first pixel electrode PE1 may be smaller than a vertical dimension of the light-emitting element LE from the top face of the first pixel electrode PE1.

The planarization layer PLL may include an organic material to planarize the underlying steps. For example, the planarization layer PLL may include a polyacrylates resin, an epoxy resin, a phenolic resin, a polyamides resin, a polyimides rein, an unsaturated polyesters resin, a polyphenylene ethers resin, a polyphenylenesulfides resin, or benzocyclobutene (BCB).

The common electrode CE may be disposed on the planarization layer PLL and the light-emitting elements LE. The common electrode CE may be disposed on a face of the first substrate 110 on which the light-emitting element LE is formed, and may be disposed throughout the display area DPA and the non-display area NDA. The common electrode CE may overlap each of the light-emitting areas EA1, EA2, and EA3 in the display area DPA, and may have a small thickness so that light may transmit through the common electrode CE.

The common electrode CE may be disposed directly on a top face and side face(s) of each of the light-emitting elements LE. The common electrode CE may directly contact a partial side face of the second semiconductor layer SEM2 and an entire side face of the third semiconductor layer SEM3 of the light-emitting element LE. As shown in FIG. 8, the common electrode CE may be embodied as a common layer that covers the light-emitting elements LE and electrically connects the light-emitting elements LE to each other. Since the conductive second semiconductor layer SEM2 of each of the light-emitting elements LE has a patterned structure, the common electrode CE may directly contact a side face of the second semiconductor layer SEM2 of each light-emitting element LE so that a common voltage may be applied therefrom to each light-emitting element LE.

The common electrode CE may be disposed over an entirety of the first substrate 110 and may receive the common voltage. For this reason, the common electrode CE may be made of a material having low electrical resistance. Further, the common electrode CE may have a small thickness such that light transmission therethrough is realized. For example, the common electrode CE may include a material having low electrical resistance such as aluminum (Al), silver (Ag), copper (Cu), and the like. The thickness of the common electrode CE may be in a range of about 10 Å to about 200 Å, but is not limited thereto.

Each of the above-described light-emitting elements LE may receive a pixel voltage or an anode voltage from each of the pixel electrodes PE1, PE2, and PE3, and may receive a common voltage via the common electrode CE. The light-emitting element LE may emit light at a luminance level (e.g., a predefined or selected luminance level) based on a voltage difference between the pixel voltage and the common voltage.

In this embodiment, respectively disposing the light-emitting elements LE, for example, inorganic light-emitting diodes on the pixel electrodes PE1, PE2, and PE3 may eliminate a disadvantage of the organic light-emitting diodes that the organic light-emitting diodes are vulnerable to external moisture or oxygen, thereby improving lifespan and reliability thereof.

In an example, referring to FIGS. 9 to 11, light-emitting elements LE may be disposed on each of the pixel electrodes PE1, PE2, and PE3. At least one of the pixel electrodes PE1, PE2, and PE3 may include at least one protrusion PP protruding laterally and outwardly in a plan view.

The protrusion PP may be a portion protruding toward the pixel electrode PE1, PE2, or PE3 adjacent thereto. For example, a protrusion PP of the first pixel electrode PE1 may protrude toward the second pixel electrode PE2 adjacent thereto in the first direction DR1. Further, another protrusion PP thereof may protrude in a direction opposite to a direction toward the second pixel electrode PE2. In an embodiment, the protrusion PP may protrude toward another first pixel electrode PE1 adjacent thereto in the second direction DR2.

The protrusion PP may protrude from a side extending in the second direction DR2 of each of the pixel electrodes PE1, PE2, and PE3. In an embodiment, the protrusion PP may protrude from a side extending in the first direction DR1 of each of the pixel electrodes PE1, PE2, and PE3. In an embodiment, the protrusion PP may protrude from a corner of each of the pixel electrodes PE1, PE2, and PE3.

The protrusion PP may overlap the non-light-emitting area NEA and may overlap a partitioning wall (or bank) PW and a light-blocking member BK. As a result, each of the pixel electrodes PE1, PE2, and PE3 may substantially overlap each of the light-emitting areas EA1, EA2, and EA3, but a portion thereof may overlap the non-light-emitting area NEA. Accordingly, a portion of the light-emitting element LE overlapping the protrusion PP may overlap the non-light-emitting area NEA and may overlap the partitioning wall PW and the light-blocking member BK.

A planar shape of the protrusion PP may be circular or semi-circular, or may be a partial circular shape. However, the disclosure is not limited thereto. The planar shape of the protrusion PP may vary depending on a shape of a cut face of the light-emitting element LE perpendicular to an extending direction of the light-emitting element LE or the vertical direction. For example, in case that the shape of the cut face of the light-emitting element LE is rectangular, the planar shape of the protrusion PP may be rectangular.

As each of the pixel electrodes PE1, PE2, and PE3 includes the protrusion PP, a width of each of the pixel electrodes PE1, PE2, and PE3 may vary based on a measurement position thereof.

For example, a first width W1 in the first direction DR1 passing through the protrusion PP of the first pixel electrode PE1 may be greater than a second width W2 in the first direction DR1 not passing through the protrusion PP thereof. The first pixel electrode PE1 may generally have the second width W2, but may have the first width W1 at a position where the protrusion PP is disposed.

Further, as each of the pixel electrodes PE1, PE2, and PE3 includes the protrusion PP, a spacing between adjacent ones of the pixel electrodes PE1, PE2, and PE3 may vary based on a measurement position thereof. For example, a first distance G1 in the first direction DR1 from the protrusion PP of the first pixel electrode PE1 to the second pixel electrode PE2 may be smaller than a second distance G2 between a portion of the first pixel electrode PE1 free of the protrusion PP and the second pixel electrode PE2. A distance between the first pixel electrode PE1 and the second pixel electrode PE2 may be generally the second distance G2, but may be a first distance G1 at a position where the protrusion PP is disposed.

A portion of the light-emitting element LE may be disposed on the protrusion PP of each of the pixel electrodes PE1, PE2, and PE3 as described above. The light-emitting element LE may overlap an entirety of the protrusion PP. As described in a manufacturing method to be described below, the light-emitting element LE is bonded to each of the pixel electrodes PE1, PE2, and PE3, and each of the pixel electrodes PE1, PE2, and PE3 is etched while the light-emitting element LE acts as a mask in a portion thereof. Thus, the light-emitting element LE and the protrusion PP may overlap each other (e.g., in a plan view).

In an embodiment, a side of the protrusion PP may be aligned with and coincide with a side of the light-emitting element LE overlapping the protrusion PP. For example, a side of each of the lower electrode layer P1 and the upper electrode layer P3 of the first pixel electrode PE1 in an area of the protrusion PP may be aligned with and coincide with a side of each of the connective electrode 150, the first semiconductor layer SEM1, the electron blocking layer EBL, the active layer MQW, the superlattice layer SLT, the second semiconductor layer SEM2, and the third semiconductor layer SEM3 of the light-emitting element LE.

As described above, the light-emitting element LE may be bonded to each of the pixel electrodes PE1, PE2, and PE3, and each of the pixel electrodes PE1, PE2, and PE3 may be etched while the light-emitting element LE acts as a mask in a portion thereof. Thus, the light-emitting element LE and the protrusion PP may overlap each other. In contrast, each of the pixel electrodes PE1, PE2 and PE3 is patterned, and the light-emitting element LE is bonded thereto, an entire bottom of the light-emitting element LE may not be adhered (or bonded) to a top face of each of the pixel electrodes PE1, PE2, and PE3, but only a side of the light-emitting element LE may be adhered to the top face of each of the pixel electrodes PE1, PE2, and PE3. In this case, the light-emitting element LE may be inclined, resulting in a step. In case that the common electrode CE is formed on the light-emitting element LE, a defect may occur due to the step. Further, when irradiating laser for bonding the light-emitting element LE thereto, the laser may transmit through between the pixel electrodes PE1, PE2, and PE3, and the underlying layers may be damaged by the laser.

In this embodiment, the light-emitting element LE is bonded to each of the pixel electrodes PE1, PE2, and PE3, and each of the pixel electrodes PE1, PE2 and PE3 is etched using a photoresist pattern and using the light-emitting element LE as a mask. Thus, the entire bottom of the light-emitting element LE may be adhered to the top face of each of the pixel electrodes PE1, PE2, and PE3, thereby preventing the defect due to the step.

In an example, the wavelength converter 200 may be disposed on the light-emitter LEP. The wavelength converter 200 may include a partitioning wall PW, a wavelength conversion layer QDL, color filters CF1, CF2, and CF3, a light-blocking member BK, and a protective layer PTL.

The partitioning wall PW may be disposed on the common electrode CE in the display area DPA. The partitioning wall PW may define each of the light-emitting areas EA1, EA2, and EA2. The partitioning wall PW may extend in the first direction DR1 and the second direction DR2 and may be formed in a grid-like pattern over an entire display area DPA. Further, the partitioning wall PW may not overlap the light-emitting areas EA1, EA2, and EA3 and may overlap the non-light-emitting area NEA.

The partitioning wall PW may have openings OP1, OP2, and OP3 defined therein partially exposing the underlying common electrode CE. The openings OP1, OP2, and OP3 may include a first opening OP1 overlapping the first light-emitting area EA1, a second opening OP2 overlapping the second light-emitting area EA2, and a third opening OP3 overlapping the third light-emitting area EA3. In this case, the openings OP1, OP2, and OP3 may respectively correspond to the light-emitting areas EA1, EA2, and EA3. For example, the first opening OP1 may correspond to the first light-emitting area EA1, the second opening OP2 may correspond to the second light-emitting area EA2, and the third opening OP3 may correspond to the third light-emitting area EA3.

The partitioning wall PW may serve to provide a space in which the wavelength conversion layer QDL is formed. To this end, the partitioning wall PW may have a thickness. For example, the thickness of the partitioning wall PW may be in a range of about 1 µm to about 10 µm. The partitioning wall PW may include an organic insulating material to have a thickness. The organic insulating material may include, for example, an epoxy-based resin, an acrylic-based resin, a cardo-based resin, or an imide-based resin.

The wavelength conversion layers QDL may be respectively disposed in the openings OP1, OP2, and OP3. The wavelength conversion layer QDL may convert or shift a peak wavelength of incident light thereto to light having a specific peak wavelength different therefrom and may output light having the specific peak wavelength. The wavelength conversion layer QDL may convert a portion of the first light (blue light) emitted from the light-emitting element LE into fourth light (yellow light). The wavelength conversion layer QDL may mix the first light and the fourth light with each other and thus emit fifth light (white light). The fifth light may be converted to the first light through the first color filter CF1, may be converted to the second light through the second color filter CF2, and may be converted to the third light through the third color filter CF3.

The wavelength conversion layers QDL may be disposed in the openings OP1, OP2, and OP3 and may be spaced apart from each other. For example, the wavelength conversion layer QDL may be formed of a dot-shaped island pattern. For example, the wavelength conversion layers QDL may be disposed on the first opening OP1, the second opening OP2, and the third opening OP3 and may correspond thereto in an one-to-one manner. Further, the wavelength conversion layers QDL may overlap the first light-emitting area EA1, the second light-emitting area EA2, and the third light-emitting area EA3 (e.g., in a plan view). In an embodiment, each of the wavelength conversion layers QDL may entirely overlap each of the first light-emitting area EA1, the second light-emitting area EA2, and the third light-emitting area EA3.

The wavelength conversion layer QDL may include a first base resin BRS1 and first wavelength conversion particles WCP1. The first base resin BRS1 may include a light-transmissive organic material. For example, the first base resin BRS1 may include an epoxy-based resin, an acrylic-based resin, a cardo-based resin, or an imide-based resin.

The first wavelength conversion particles WCP1 may convert the first light incident thereto from the light-emitting element LE to the fourth light. For example, the first wavelength conversion particles WCP1 may convert light of the blue wavelength band into light of a yellow wavelength band. The first wavelength conversion particle WCP1 may include a quantum dot (QD), a quantum rod, a fluorescent material, or a phosphorescent material. For example, a quantum dot may refer to a particulate material that emits light of a specific color as electrons transition from a conduction band to a valence band.

The quantum dot may be made of a semiconductor nanocrystal material. The quantum dot may have a specific bandgap based on a composition and a size thereof to absorb light and emit light having a unique wavelength. Examples of the semiconductor nanocrystal material of the quantum dot may include group IV nanocrystal, group II-VI compound nanocrystal, group III-V compound nanocrystal, group IV-VI nanocrystal, or combinations thereof.

The group II-VI compound may be selected from a group consisting of a binary compound selected from a group consisting of CdSe, CdTe, ZnS, ZnSe, ZnTe, ZnO, HgS, HgSe, HgTe, MgSe, MgS, and mixtures thereof; a ternary compound selected from a group consisting of InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures of thereof; and a quaternary compound selected from a group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures of thereof.

The group III-V compound may be selected from a group consisting of a binary compound selected from a group consisting of GaN, GaP, GaAs, GaSb, AlN, AlP, AlAs, AlSb, InN, InP, InAs, InSb, and mixtures thereof; a ternary compound selected from a group consisting of GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, and mixtures thereof; and a quaternary compound selected from a group consisting of GaAlNAs, GaAlNSb, GaAlPAs, GaAlPSb, GaInNP, GaInNAs, GaInNSb, GaIn-PAs, GaInPSb, InAlNP, InAlNAs, InAlNSb, InAlPAs, InAlPSb, and mixtures thereof.

The group IV-VI compound may be selected from a group consisting of a binary compound selected from a group consisting of SnS, SnSe, SnTe, PbS, PbSe, PbTe, and mixtures thereof; a ternary compound selected from a group consisting of SnSeS, SnSeTe, SnSTe, PbSeS, PbSeTe, PbTe, SnPbS, SnPbSe, SnPbTe, and mixtures thereof; and a quaternary compound selected from a group consisting of SnPbSSe, SnPbSeTe, SnPbSTe, and mixtures thereof. The group IV element may be selected from a group consisting of Si, Ge, and mixtures thereof. The group IV compound may be a binary compound selected from a group consisting of SiC, SiGe, and mixtures thereof.

In this connection, the binary compound, the ternary compound, or the quaternary compound may be contained at a uniform concentration and in the particle. As another example, the binary compound, the ternary compound, and the quaternary compound may be contained at a same concentration and in the particle. As another example, the binary compound, the ternary compound, or the quaternary compound may be contained at a concentration gradient and in the particle. As another example, the binary compound, the ternary compound, and the quaternary compound may be contained at a same concentration in a same particle. Further, the first wavelength conversion particle WCP1 may have a core/shell structure in which a quantum dot surrounds another quantum dot. An interface between the core and the shell may have a concentration gradient in which a concentration of an element present in the shell decreases as it goes toward a center of the core-shell structure.

In an embodiment, the quantum dot may have a core-shell structure including a core including the aforementioned nanocrystal and a shell surrounding the core. The shell of the quantum dot may serve as a protective layer to prevent chemical denaturation of the core to maintain semiconductor characteristics thereof and/or as a charging layer to impart electrophoresis ability to the quantum dot. The shell may be composed of a single layer or multiple layers. Examples of the shell of the quantum dot may include an oxide of a metal or a non-metal, a semiconductor compound, or a combination thereof.

For example, the oxide of the metal or the non-metal may include a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, and $NiO$, or a ternary compound such as $MgAl_2O_4$, $CoFe_2O_4$, $NiFe_2O_4$, and $CoMn_2O_4$. However, the disclosure is not limited thereto.

Further, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb. However, the disclosure is not limited thereto The wavelength conversion layer QDL may further include a scattering material to scatter the light from the light-emitting element LE in random directions. The scattering material may have a refractive index different from that of the first base resin BRS1 so that an optical interface may be formed between the scattering material and the first base resin BRS1. For example, the scattering material may be embodied as light scattering particles. The scattering material is not particularly limited as long as the scattering material is capable of scattering at least a portion of light transmitting therethrough. For example, the scattering material may be embodied as metal oxide particles or organic particles. The metal oxide may include titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$). The organic particle may be made of an acrylic-based resin or a urethane-based resin. The scattering material may scatter the light in a random direction regardless of an incidence direction of the incident light thereto while not substantially converting the wavelength of the light.

The larger a thickness of the wavelength conversion layer QDL in the third direction DR3, the higher a content of the first wavelength conversion particles WCP1 contained in the wavelength conversion layer QDL. Thus, the optical conversion efficiency of the wavelength conversion layer QDL may be improved. Therefore, the thickness of the wavelength conversion layer QDL is formed in consideration of the optical conversion efficiency of the wavelength conversion layer QDL.

The wavelength conversion layer QDL of the above-described wavelength converter 200 may convert a portion of the first light emitting from the light-emitting element LE into the fourth light. The wavelength conversion layer QDL may mix the first light and the fourth light with each other and thus may emit the fifth light of the white color. The first color filter CF1 which will be described below may transmit therethrough only the first light of the fifth light emitting from the wavelength conversion layer QDL. The second color filter CF2 which will be described below may transmit therethrough only the second light of the fifth light emitting from the wavelength conversion layer QDL. The third color filter CF3 which will be described below may transmit therethrough only the third light of the fifth light emitting from the wavelength conversion layer QDL. Accordingly, the light emitted from the wavelength converter 200 may be composed of the blue light as the first light, the red light as the second light, and the green light as the third light. In this manner, a full color may be realized.

Each of the color filters CF1, CF2, and CF3 may be disposed on the partitioning wall PW and each of the wavelength conversion layers QDL. Each of the color filters CF1, CF2, and CF3 may overlap each of the openings OP1, OP2, and OP3 and each of the wavelength conversion layers QDL. The color filters CF1, CF2, and CF3 may include a first color filter CF1, a second color filter CF2, and a third color filter CF3.

The first color filter CF1 may overlap the first light-emitting area EA1, and a portion thereof may overlap the non-light-emitting area NEA. Further, the first color filter CF1 may be disposed on the first opening OP1 of the partitioning wall PW and may overlap the first opening OP1, and a portion thereof may overlap the light-blocking member BK. The first color filter CF1 transmits the first light emitted from the light-emitting element LE therethrough, and may absorb or block the second light and the third light. For example, the first color filter CF1 may transmit light of the blue wavelength band therethrough, and may absorb or block light of other wavelength bands such as green and red wavelength bands.

The second color filter CF2 may overlap the second light-emitting area EA2, and a portion thereof may overlap the non-light-emitting area NEA. Further, the second color filter CF2 may be disposed on the second opening OP2 of the partitioning wall PW and may overlap the second opening OP2, and a portion thereof may overlap the light-blocking member BK. The second color filter CF2 may transmit the second light therethrough and absorb or block the first light and the third light. For example, the second color filter CF2 may transmit light of the green wavelength band therethrough, and may absorb or block the light of other wavelength bands such as blue and red wavelength bands.

The third color filter CF3 may overlap the third light-emitting area EA3, and a portion thereof may overlap the non-light-emitting area NEA. Further, the third color filter CF3 may be disposed on the third opening OP3 of the partitioning wall PW and may overlap the third opening OP3, and a portion thereof may overlap the light-blocking member BK. The third color filter CF3 may transmit the third light therethrough and absorb or block the first light and the second light. For example, the third color filter CF3 may transmit light of a red wavelength band therethrough and may absorb or block light of other wavelength bands such as blue and green wavelength bands.

As shown in FIG. 12, a planar area of each of the color filters CF1, CF2, and CF3 may be larger than a planar area of each of the light-emitting areas EA1, EA2, and EA3. For example, a planar area of the first color filter CF1 may be larger than a planar area of the first light-emitting area EA1. A planar area of the second color filter CF2 may be larger than a planar area of the second light-emitting area EA2. A planar area of the third color filter CF3 may be larger than a planar area of the third light-emitting area EA3. However, the disclosure is not limited thereto. The planar area of each of the color filters CF1, CF2, and CF3 may be equal to the planar area of each of the light-emitting areas EA1, EA2, and EA3.

Referring again to FIGS. 6 and 7, the light-blocking member BK may be disposed on the partitioning wall PW. The light-blocking member BK may overlap the non-light-emitting area NEA to block light transmission. Similar to the partitioning wall PW, the light-blocking member BK may be formed roughly in a grid pattern in a plan view, in a similar manner to the partitioning wall PW. The light-blocking member BK may overlap the partitioning wall PW and may not overlap the light-emitting areas EA1, EA2 and EA3.

In an embodiment, the light-blocking member BK may include an organic light-blocking material and may be formed by coating and exposure processes of an organic light-blocking material. The light-blocking member BK may include dyes or pigments having light blocking properties and may be a black matrix. The light-blocking member BK may partially overlap each of the color filters CF1, CF2, and CF3 adjacent thereto. Each of the color filters CF1, CF2, and CF3 may be disposed on at least a portion of the light-blocking member BK.

External light incident from an outside of the display device 10 may distort color gamut of the wavelength converter 200. In case that the light-blocking member BK is included in the wavelength converter 200 according to this embodiment, at least a portion of the external light is absorbed by the light-blocking member BK. Accordingly, color distortion due to reflection of external light may be reduced. Further, the light-blocking member BK may prevent mutual light invasion between adjacent light-emitting areas and thus may prevent color mixing. Accordingly, color gamut may be further improved.

The protective layer PTL may be disposed on the color filters CF1, CF2, and CF3 and the light-blocking member BK. The protective layer PTL may be disposed on a top of the display device 10 to protect the color filters CF1, CF2, and CF3 and the light-blocking member BK disposed thereunder. A face, for example, a bottom face of the protective layer PTL may contact a top face of each of the color filters CF1, CF2, and CF3 and a top face of the light-blocking member BK.

The protective layer PTL may include an inorganic insulating material to protect the color filters CF1, CF2, and CF3 and the light-blocking member BK. For example, the protective layer PTL may include silicon oxide ($SiO_x$), silicon nitride ($SiN_x$), silicon oxynitride ($SiO_xN_y$), aluminum oxide ($Al_xO_y$), aluminum nitride (AlN), and the like. However, the disclosure is not limited thereto. The protective layer PTF may have a thickness (e.g., a predetermined or selected thickness) which may be in, for example, a range of about 0.01 µm to about 1 However, the disclosure is not limited thereto.

In the display device 10 according to an embodiment as described above, the light-emitting element LE is disposed on the protrusion PP of each of the pixel electrodes PE1, PE2, and PE3, thereby preventing incomplete adhesion of the light-emitting element LE onto each of the pixel electrodes PE1, PE2, and PE3, thus preventing the defect due to the step.

In an example, FIG. 9 illustrates a random arrangement of the light-emitting elements LE on each of the pixel electrodes PE1, PE2, and PE3.

In contrast, referring to FIG. 13, in an embodiment, the light-emitting elements LE may be arranged to be aligned with an arbitrary line extending in a direction. For example, the light-emitting elements LE may be arranged in each of an inclined row and an inclined column. Spacings between adjacent rows may be constant, and spacings between adjacent columns may be constant. Further, an arrangement of the light-emitting elements LE on the pixel electrode PE1, an arrangement of the light-emitting elements LE on the pixel electrode PE2, and an arrangement of the light-emitting elements LE on the pixel electrode PE3 may be identical with each other.

Further, FIGS. 9, 10, 12, and 13 illustrate that the pixel is composed of three light-emitting areas, for example, the first light-emitting area EA1 which emits light of the first color, the second light-emitting area EA2 which emits light of the second color, and the third light-emitting area EA3 which emits light of the third color.

In contrast, referring to FIGS. 14A to 14C, in an embodiment, two third light-emitting areas EA3 for emitting light of a third color may be provided. Thus, the pixel is composed of four light-emitting areas.

In an embodiment, the pixel PX may have a PENTILE™ structure. As shown in FIG. 14A, first light-emitting areas EA1 may be arranged in a first row in the first direction DR1. Second light-emitting areas EA2 may be arranged in a second row in the first direction DR1, and the first and second rows may be alternately and repeatedly arranged with each other in the second direction DR2. Further, as shown in FIG. 14B, first light-emitting areas EA1 may be arranged in a first column in the second direction DR2. Second light-emitting areas EA2 may be arranged in a second row in the second direction DR2. The first and second columns may be alternately and repeatedly arranged with each other in the first direction DR1. Further, as shown in FIG. 14C, the first light-emitting area EA1 and the second light-emitting area EA2 may be alternately and repeatedly arranged with each other in each of the first direction DR1 and the second direction DR2.

In an embodiment, a size of the first light-emitting area EA1, a size of the second light-emitting area EA2, and a size of the third light-emitting areas EA3 may be substantially the same as each other. However, the disclosure is not limited thereto. For example, as shown in FIGS. 14A to 14C, the size of the first light-emitting area EA1 and the size of the second light-emitting area EA2 may be the same as each other, and the size of the third light-emitting area EA3 may be different from the size of each of the first light-emitting area EA1 and the second light-emitting area EA2. As another example, the size of the first light-emitting area EA1 may be larger than the size of the second light-emitting area EA2, or the size of the first light-emitting area EA1 may be smaller than the size of the second light-emitting area EA2.

Further, a distance between the first light-emitting area EA1 and the second light-emitting area EA2 adjacent to each other, a distance between the second light-emitting area EA2 and the third light-emitting areas EA3 adjacent to each other, and a distance between the first light-emitting area EA1 and the third light-emitting areas EA3 adjacent to each other may be substantially equal to each other. However, the disclosure is not limited thereto. For example, the distance between the first light-emitting area EA1 and the second light-emitting area EA2 adjacent to each other and the distance between the second light-emitting area EA2 and the third light-emitting areas EA3 adjacent to each other may be different from each other, and the distance between the first light-emitting area EA1 and the third light-emitting areas EA3 adjacent to each other may be different from the distance between the second light-emitting area EA2 and the third light-emitting areas EA3 adjacent to each other.

Further, the first light-emitting area EA1 may emit the first light. The second light-emitting area EA2 may emit the second light, and the third light-emitting area EA3 may emit the third light. However, the disclosure is not limited thereto. For example, the first light-emitting area EA1 may emit the first light, the second light-emitting area EA2 may emit the third light, and the third light-emitting areas EA3 may emit the second light. As another example, the first light-emitting area EA1 may emit the second light, the second light-emitting area EA2 may emit the first light, and the third light-emitting areas EA3 may emit the third light. As another example, the first light-emitting area EA1 may emit the third light, the second light-emitting area EA2 may emit the second light, and the third light-emitting areas EA3 may emit the third light.

Further, each of the first light-emitting area EA1, the second light-emitting area EA2, and the third light-emitting areas EA3 may have a rectangular planar shape. However, the disclosure is not limited thereto. For example, the planar shape of each of the first light-emitting area EA1, the second light-emitting area EA2, and the third light-emitting areas EA3 may be a polygonal shape such as a triangle, a pentagon, a hexagon, and an octagon or may be a circular, oval, or irregular shape.

Hereinafter, a display device 10 according to another embodiment will be described with reference to other drawings.

Figure 15:
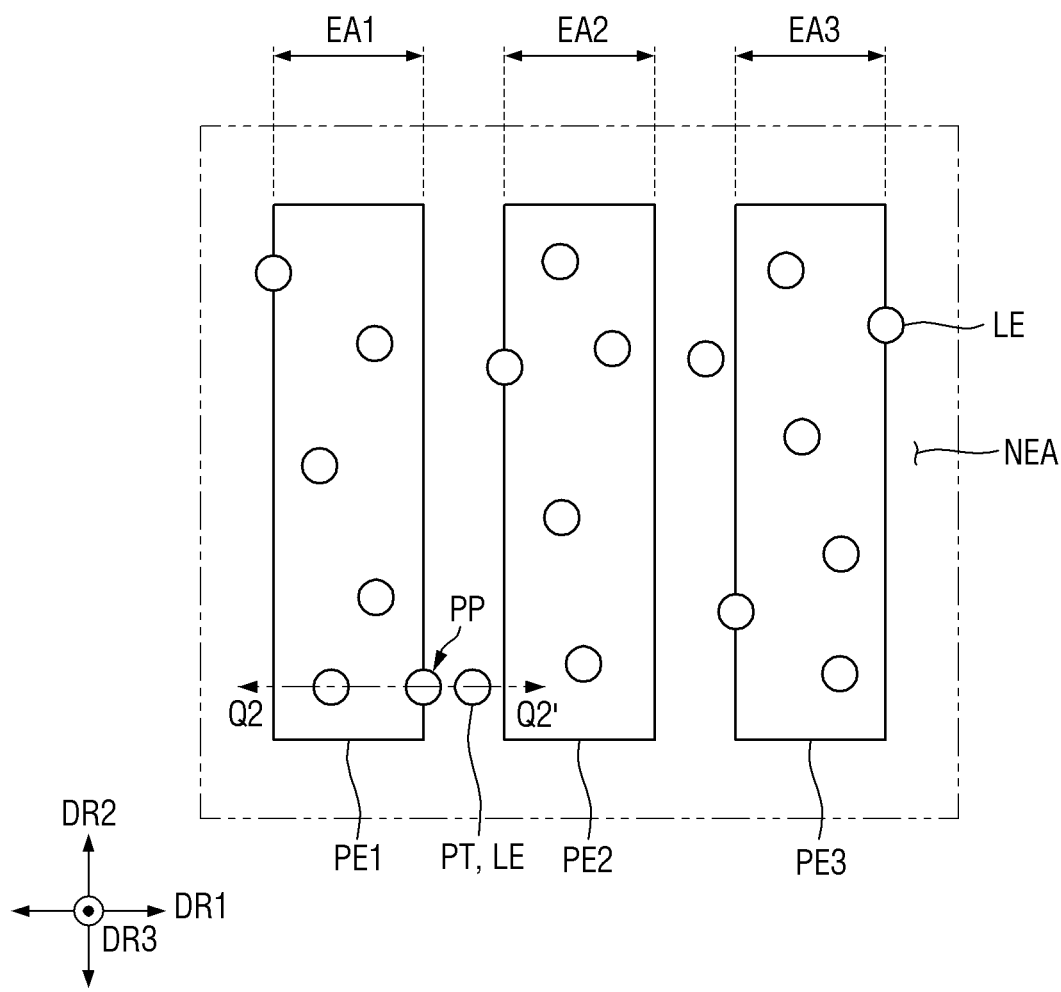
FIG. 15 is a plan view schematically showing light-emitting areas of a display device according to another embodiment.
Figure 16:
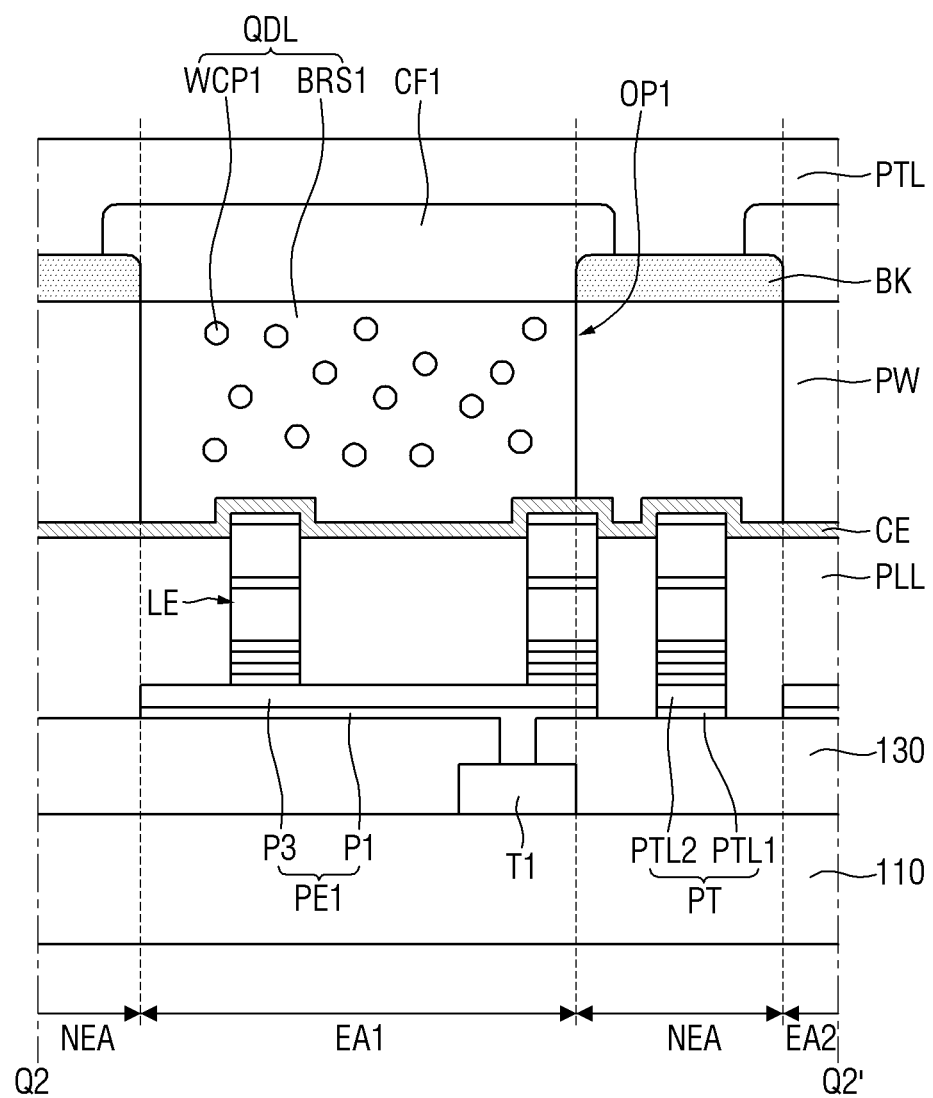
FIG. 16 is a schematic cross-sectional view taken along a line Q2-Q2' in FIG. 15.
Figure 17:
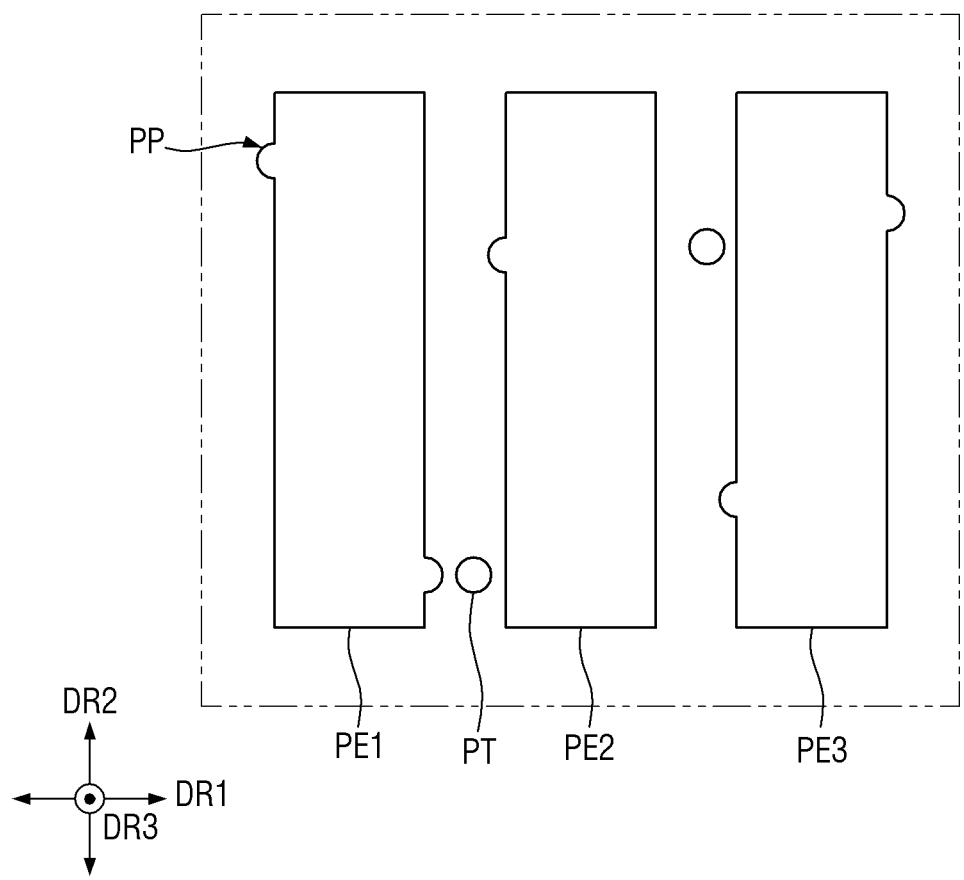
FIG. 17 is a plan view schematically showing a pixel electrode according to another embodiment.

FIG. 15 is a schematic plan view illustrating light-emitting areas of a display device according to another embodiment. FIG. 16 is a schematic cross-sectional view taken along line Q2-Q2' in FIG. 15. FIG. 17 is a plan view schematically illustrating a pixel electrode according to another embodiment.

Referring to FIGS. 15 to 17, this embodiment is different from the above-described embodiment of FIGS. 6 to 12 at least in that a conductive pattern PT is disposed between adjacent ones of the pixel electrodes PE1, PE2, and PE3, and the light-emitting element LE is disposed on the conductive pattern PT. Hereinafter, descriptions of the same configuration therebetween will be simplified or omitted, and the differences therebetween will be described in detail.

The conductive pattern PT may be disposed between at least two of the pixel electrodes PE1, PE2, and PE3, and the light-emitting element LE may be disposed on the conductive pattern PT.

The conductive pattern PT may be disposed between the first pixel electrode PE1 and the second pixel electrode PE2 or between the second pixel electrode PE2 and the third pixel electrode PE3. The conductive pattern PT may be disposed to be spaced apart from each of the pixel electrodes PE1, PE2, and PE3, and may be disposed to be spaced apart from the protrusion PP of each of the pixel electrodes PE1, PE2, and PE3.

The conductive pattern PT may include a first metal layer PTL1 disposed on the insulating layer 130 and a second metal layer PTL2 disposed on the first metal layer PTL1. The first metal layer PTL1 and the lower electrode layer P1 of each of the pixel electrodes PE1, PE2, and PE3 may include a same material. The second metal layer PTL2 and the upper electrode layer P3 of each of the pixel electrodes PE1, PE2, and PE3 may include a same material.

As described above, each of the pixel electrodes PE1, PE2, and PE3 may be etched using the photoresist pattern and the light-emitting element LE as a mask, such that the pixel electrode material layer (or pixel electrode layer) may remain in an area in which the light-emitting element LE is disposed thereon. The conductive pattern PT may be made of (or include) a remaining portion of the pixel electrode layer, and the conductive pattern PT and the lower electrode layer P1 and the upper electrode layer P3 of each of the pixel electrodes PE1, PE2, and PE3 may include a same material.

The light-emitting element LE may be disposed on the conductive pattern PT. The light-emitting element LE may overlap the conductive pattern PT. For example, the light-emitting element LE may entirely overlap the conductive pattern PT. In an embodiment, each of opposing both sides of the conductive pattern PT may be aligned with each of opposing both sides of the light-emitting element LE. Each of opposing both sides of each of the first metal layer PTL1 and the second metal layer PTL2 of the conductive pattern PT may be aligned and coincide with each of opposing both sides of the light-emitting element LE.

A planar shape of the conductive pattern PT may be circular. However, the disclosure is not limited thereto. The planar shape of the conductive pattern PT may be the same as a shape of a cut face of the light-emitting element LE perpendicular to a longitudinal direction or an extending direction of the light-emitting element LE or a vertical direction. For example, the planar shape of the conductive pattern PT may vary depending on the shape of the cut face perpendicular to the longitudinal direction of the light-emitting element LE. For example, in case that the cut face of the light-emitting element LE is rectangular, the planar shape of the conductive pattern PT may be a rectangle.

The common electrode CE may be disposed on the light-emitting element LE overlapping the conductive pattern PT. An end of the light-emitting element LE may contact the common electrode CE. The conductive pattern PT may be a floating pattern that is spaced apart from each of the pixel electrodes PE1, PE2, and PE3 so that a driving signal of the switching element is not applied thereto. Accordingly, the light-emitting element LE overlapping the conductive pattern PT may be a dummy light-emitting element that does not substantially emit light even in case that the common electrode CE contacts the light-emitting element LE. Therefore, although the light-emitting element LE is not adhered to each of the pixel electrodes PE1, PE2, and PE3, this non-adhering does not affect an operation of the display device 10.

Figure 18:
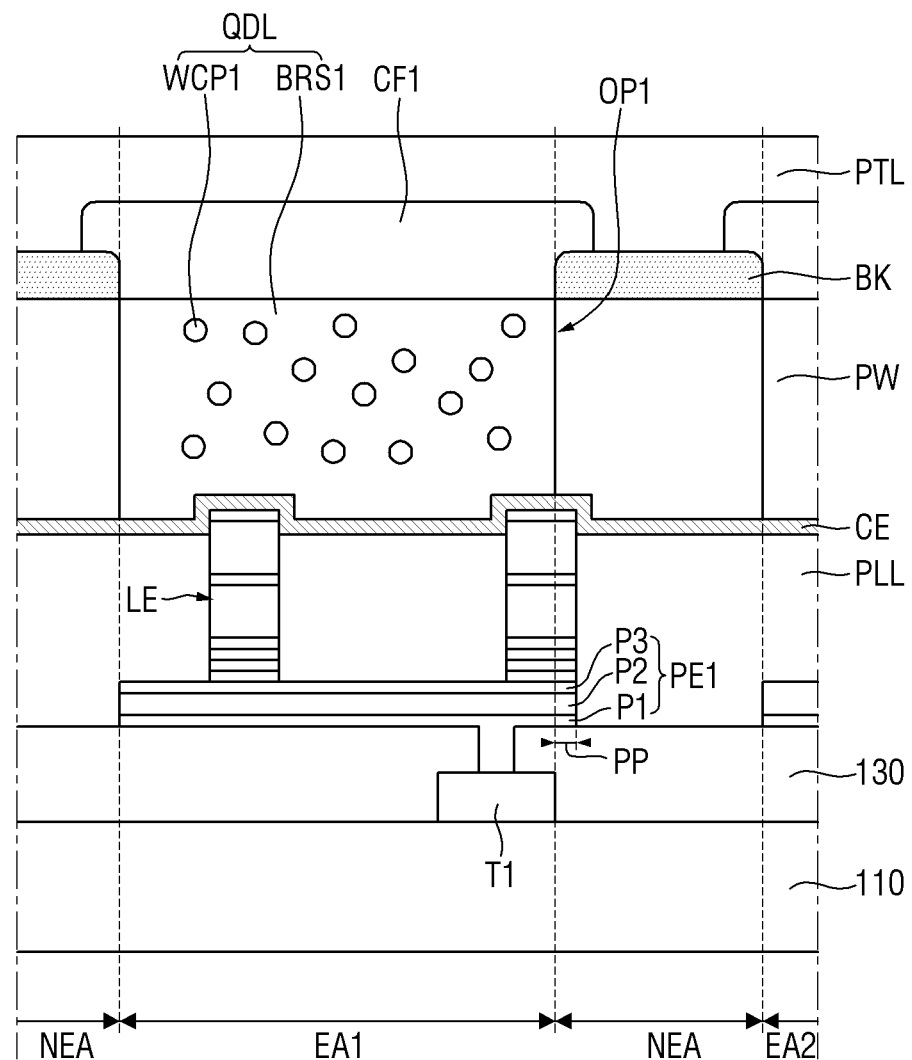
FIG. 18 is a cross-sectional view schematically showing a first light-emitting area of a display device according to still another embodiment.
Figure 19:
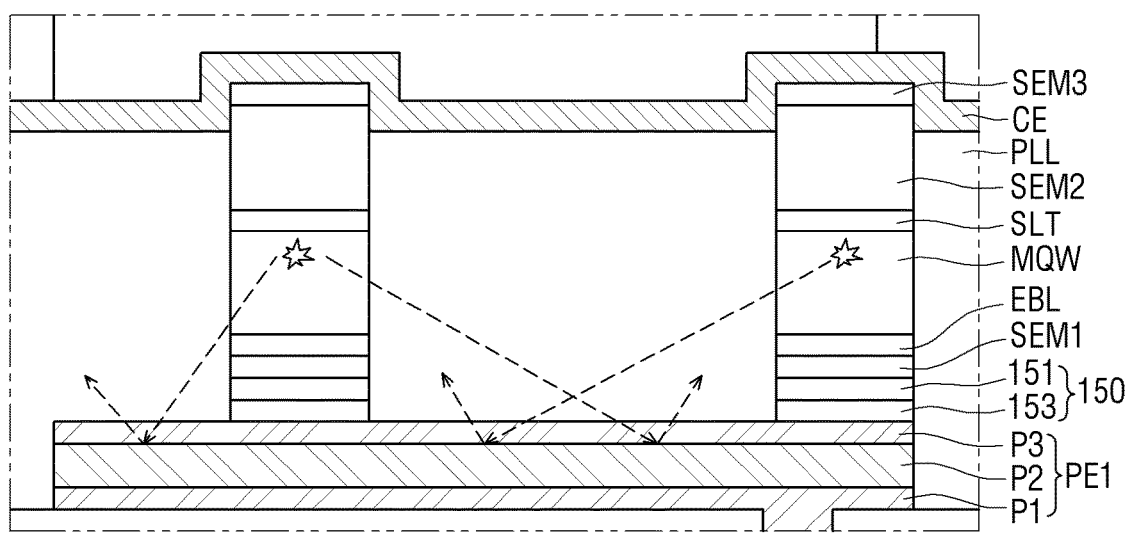
FIG. 19 is a cross-sectional view schematically showing a pixel electrode and light-emitting elements of a display device according to still another embodiment.

FIG. 18 is a cross-sectional view schematically illustrating a first light-emitting area of a display device according to still another embodiment. FIG. 19 is a cross-sectional view schematically illustrating a pixel electrode and light-emitting elements of the display device according to still another embodiment.

Referring to FIGS. 18 and 19, this embodiment is different from the embodiment of FIGS. 16 and 17 as described above in which each of the pixel electrodes PE1, PE2, and PE3 has a reflective electrode layer P2 disposed between the lower electrode layer P1 and the upper electrode layer P3. Hereinafter, descriptions of the same configuration therebetween will be simplified or omitted, and the difference therebetween will be described in detail.

Each of the first pixel electrode PE1, the second pixel electrode PE2, and the third pixel electrode PE3 may be act as a reflective electrode. Each of the first pixel electrode PE1, the second pixel electrode PE2, and the third pixel electrode PE3 may have a stack structure in which a layer made of a material having a higher work function such as titanium oxide ($TiO_2$), indium tin oxide (ITO), indium zinc oxide (IZO), zinc oxide (ZnO), indium tin zinc oxide (ITZO) or magnesium oxide (MgO), and a reflective material layer (or reflective layer) made of silver (Ag), magnesium (Mg), aluminum (Al), platinum (Pt), lead (Pb), palladium (Pd), gold (Au), nickel (Ni), neodymium (Nd), iridium (Ir), chromium (Cr), lithium (Li), calcium (Ca) or mixtures thereof are stacked each other. In this connection, the layer made of the material having the higher work function may be disposed on a top face of the reflective material layer and may be closer to the light-emitting element LE. Each of the first pixel electrode PE1, the second pixel electrode PE2, and the third pixel electrode PE3 may have a multilayer structure of ITO/Mg, ITO/MgF, ITO/Ag, and ITO/Ag/ITO, but the disclosure is not be limited thereto.

In this embodiment, each of the pixel electrodes PE1, PE2, and PE3 may include the lower electrode layer P1, the reflective electrode layer P2, and the upper electrode layer P3. Hereinafter, the first pixel electrode PE1 will be described by way of example.

The lower electrode layer P1 may form a bottommost portion of the first pixel electrode PE1 and be electrically connected to the switching element. The lower electrode layer P1 may include a metal oxide, for example, titanium oxide ($TiO_2$), indium tin oxide (ITO), indium zinc oxide (IZO), zinc oxide (ZnO), indium tin zinc oxide (ITZO), or magnesium oxide (MgO).

The reflective electrode layer P2 may be disposed on the lower electrode layer P1 to reflect light emitted from the light-emitting element LE upwardly. The reflective electrode layer P2 may include a metal with high reflectivity, for example, silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), or a mixture thereof.

The upper electrode layer P3 may be disposed on the reflective electrode layer P2 and may directly contact the light-emitting element LE. The upper electrode layer P3 may be disposed between the reflective electrode layer P2 and the connective electrode 150 of the light-emitting element LE. The upper electrode layer P3 may include a metal oxide, for example, titanium oxide ($TiO_2$), indium tin oxide (ITO), indium zinc oxide (IZO), zinc oxide (ZnO), indium tin zinc oxide (ITZO), or magnesium oxide (MgO). In an embodiment, the first pixel electrode PE1 may have a multi-layer structure of ITO/Ag/ITO.

However, the disclosure is not limited thereto. In an embodiment, the lower electrode layer P1 of the first pixel electrode PE1 may be omitted. The first pixel electrode PE1 may include a two-layer structure in which the upper electrode layer P3 is disposed on the reflective electrode layer P2.

Referring to FIG. 19, a portion of the light emitted from the active layer MQW of each light-emitting element LE may be reflected upwards from the reflective layer 151 of the light-emitting element LE, and the remaining portion thereof may travel in a direction toward the pixel electrode PE1. In this embodiment, each of the pixel electrodes PE1, PE2, and PE3 includes the reflective electrode layer P2 to reflect the light emitted from the light-emitting element LE upwardly, thereby improving light extraction efficiency.

Figure 20:
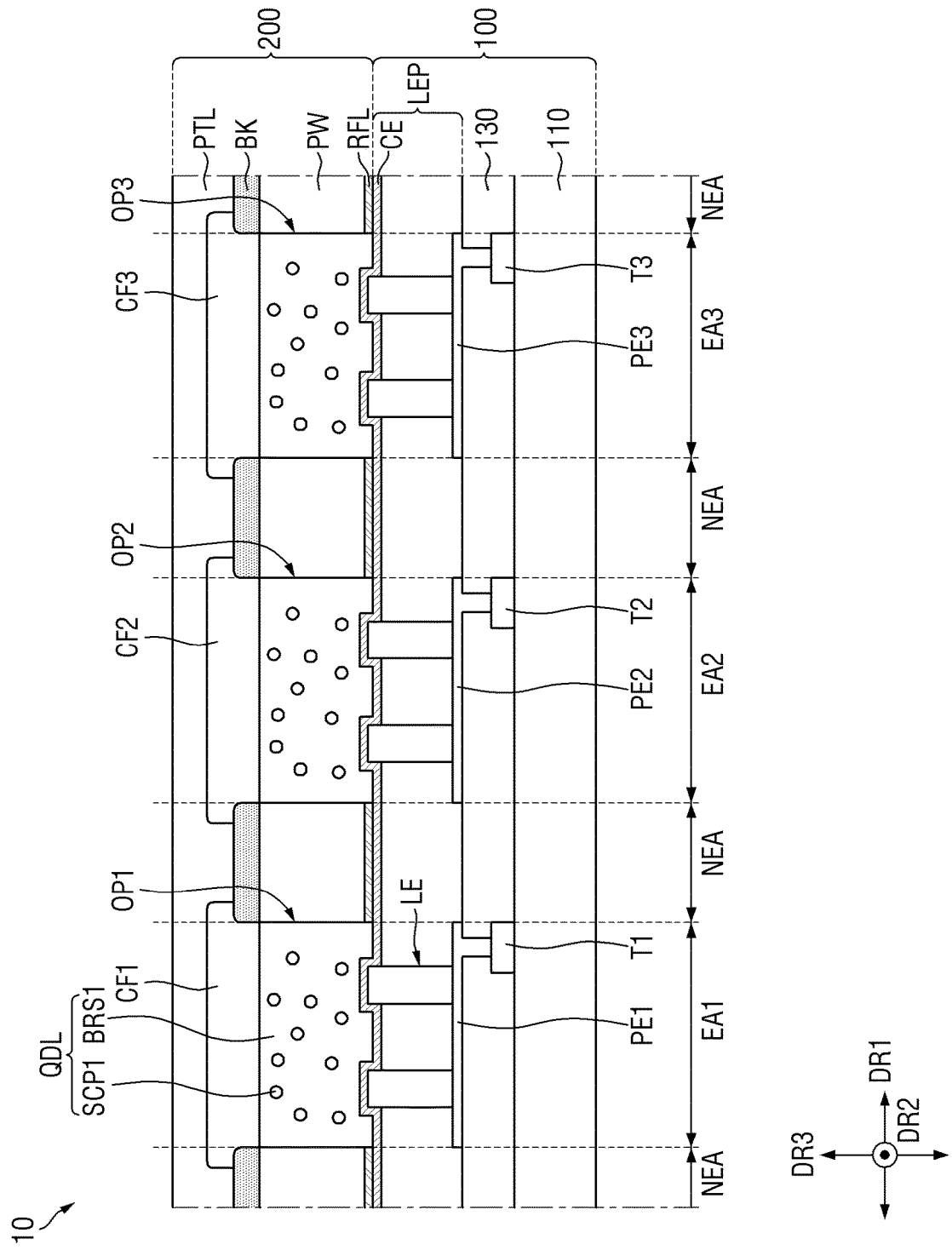
FIG. 20 is a cross-sectional view schematically showing a display device according to still yet another embodiment.
Figure 21:
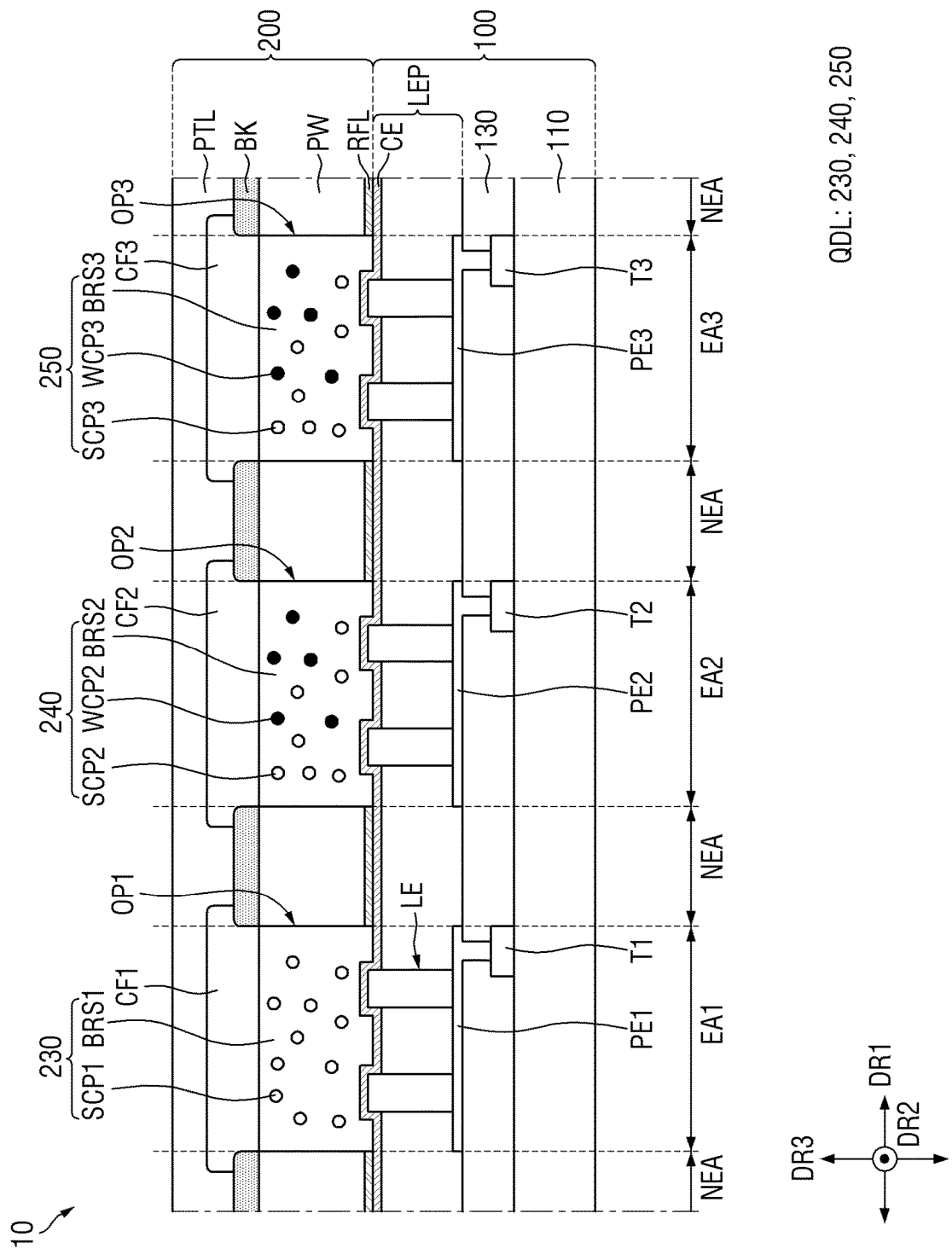
FIG. 21 is a cross-sectional view schematically showing a display device according to still yet another embodiment.
Figure 22:
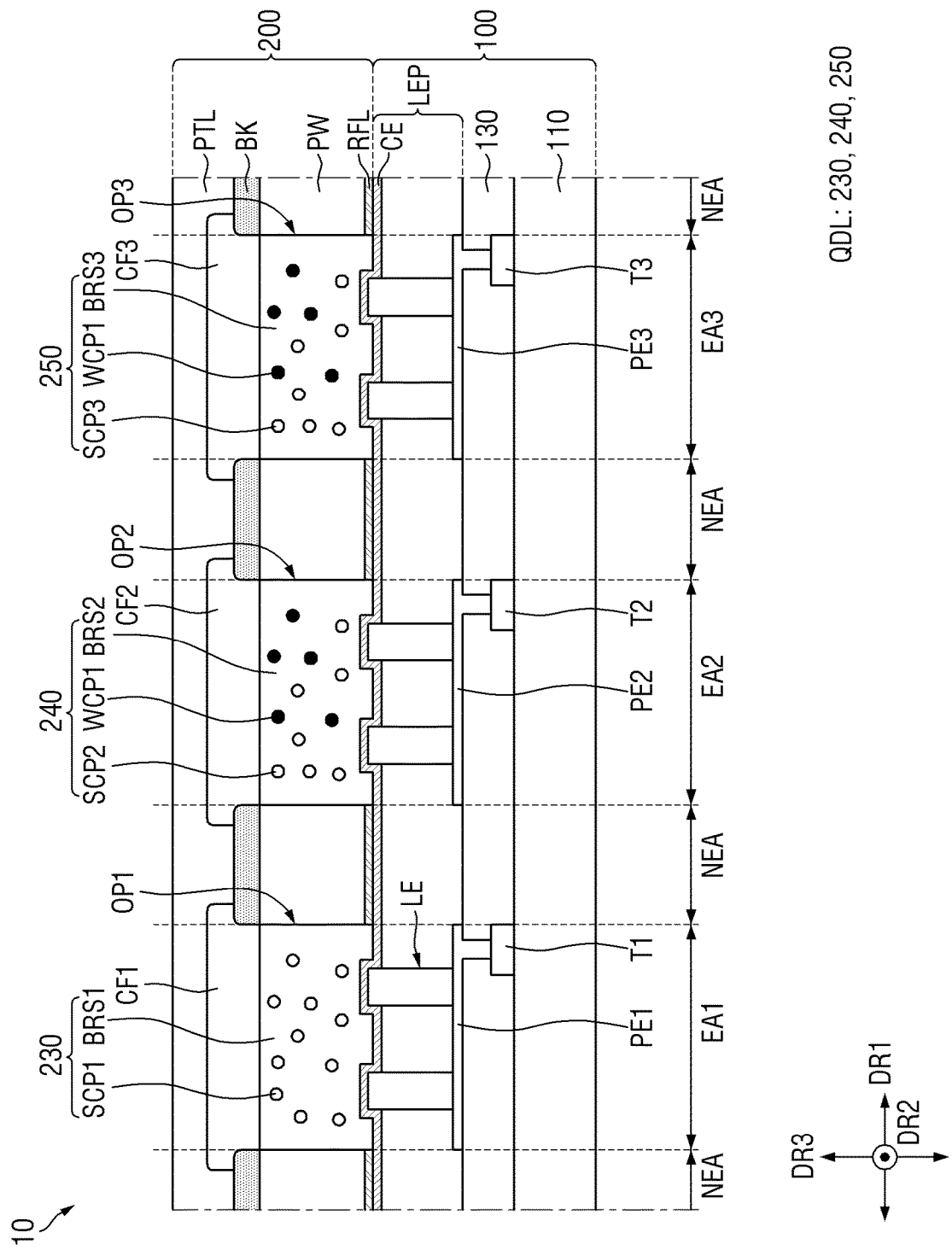
FIG. 22 is a cross-sectional view schematically showing a display device according to still yet another embodiment.
Figure 24:
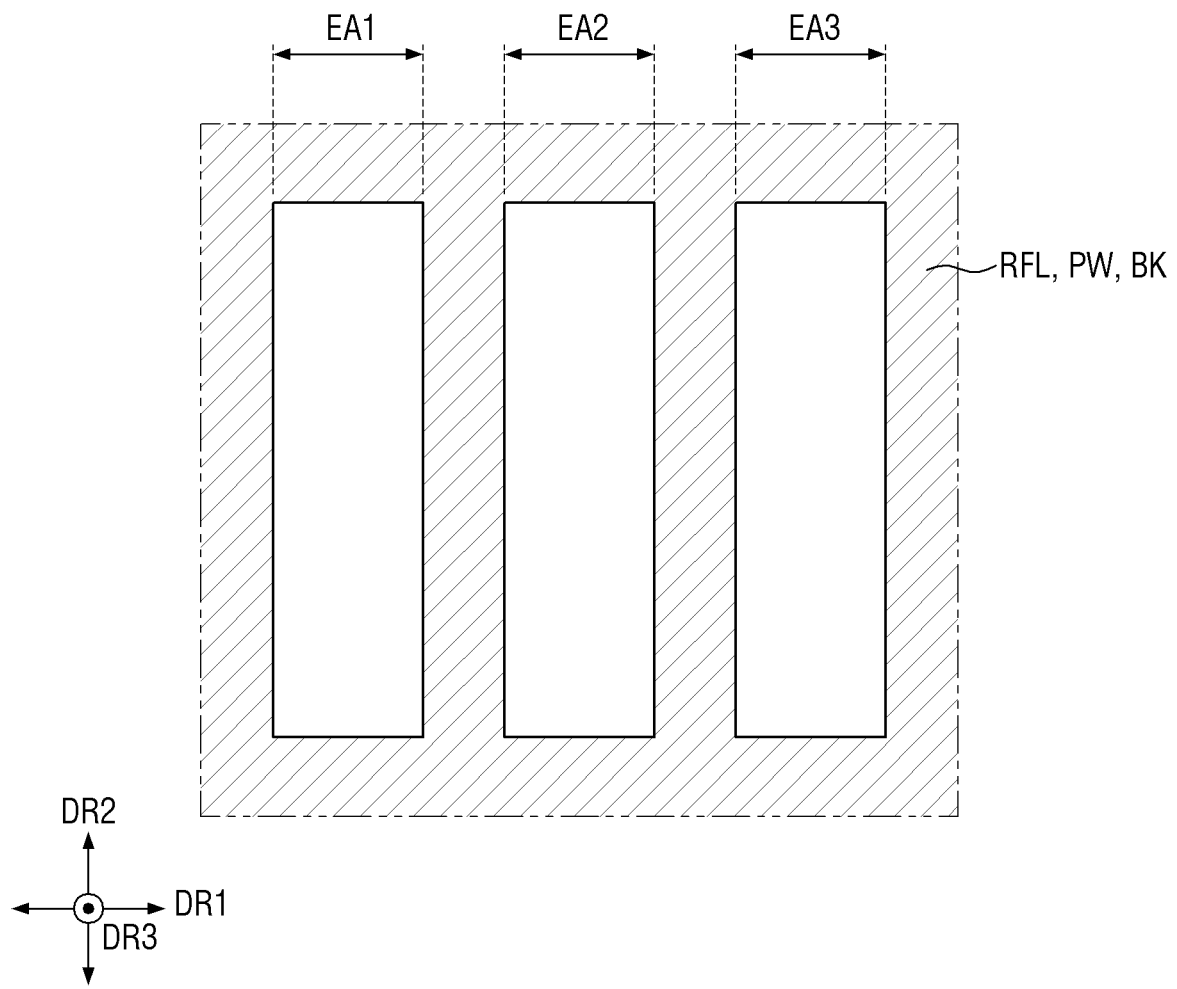
FIG. 24 is a schematic plan view of a plurality of light-emitting areas and a reflective metal layer.
Figure 25:
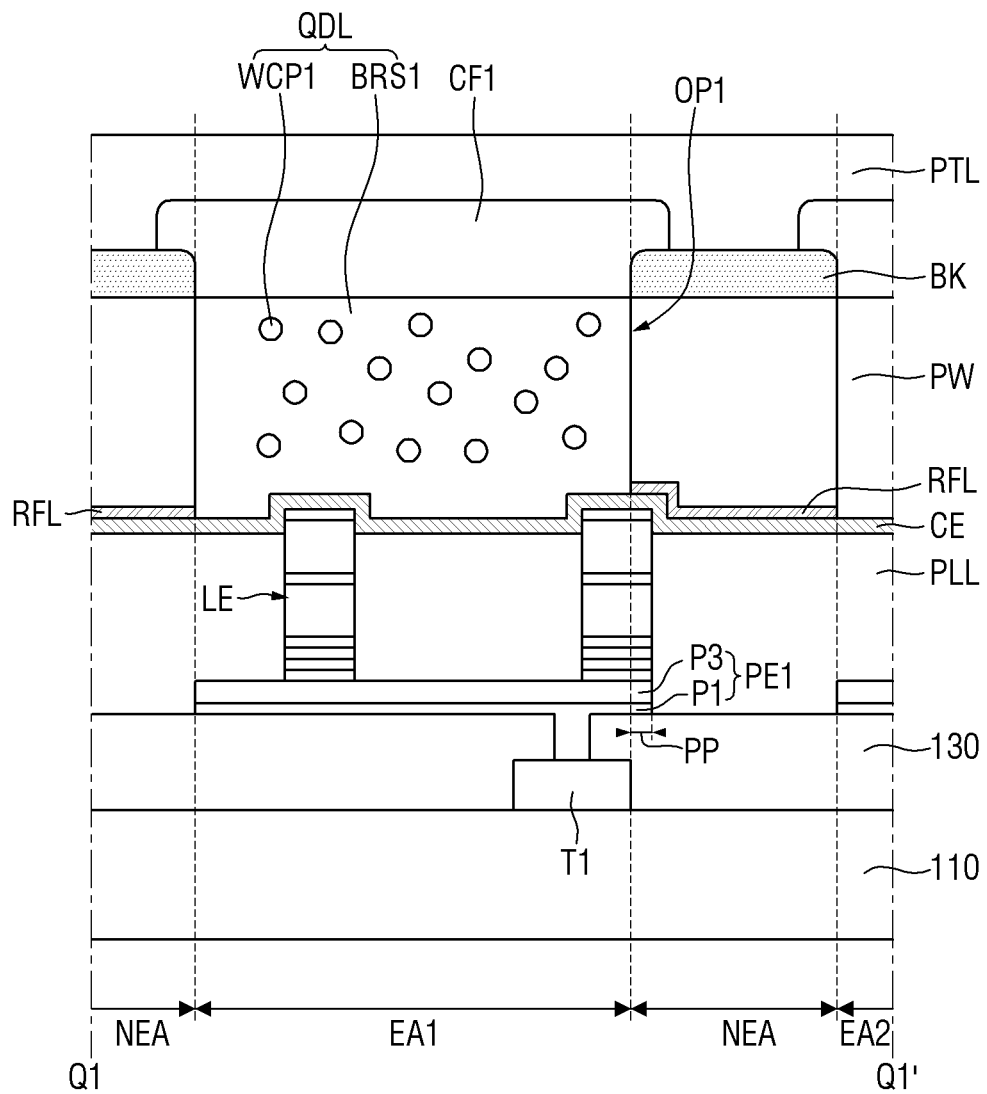
FIG. 25 is a cross-sectional view schematically showing a display device according to still yet another embodiment.

FIG. 20 is a cross-sectional view schematically illustrating a display device according to still yet another embodiment. FIG. 21 is a cross-sectional view schematically illustrating a display device according to still yet another embodiment. FIG. 22 is a cross-sectional view schematically illustrating a display device according to still yet another embodiment. FIG. 23 is a cross-sectional view schematically illustrating a display device according to still yet another embodiment. FIG. 24 is a schematic plan view of light-emitting areas and a reflective metal layer. FIG. 25 is a cross-sectional view schematically illustrating a display device according to still yet another embodiment.

Referring to FIGS. 20 to 24, this embodiment is different from the embodiments of FIGS. 6 to 19 as described above at least in that a reflective metal layer RFL is further disposed between the common electrode CE and the partitioning wall PW. Hereinafter, description of the same configuration therebetween will be simplified or omitted, and the difference therebetween will be described in detail.

In an embodiment, the reflective metal layer RFL may be disposed between the common electrode CE and the partitioning wall PW. The reflective metal layer RFL may not overlap the light-emitting areas EA1, EA2, and EA3 and may overlap the non-light-emitting area NEA. The reflective metal layer RFL may extend in each of the first direction DR1 and the second direction DR2, and thus may be formed in a grid-like pattern in an entirety of the display area DPA. The reflective metal layer RFL may entirely overlap the partitioning wall PW and may also overlap the light-blocking member BK.

In an embodiment, the light-emitting element LE of the first light-emitting area EA1 may emit the first light as blue light. The light-emitting element LE of the second light-emitting area EA2 may emit the second light as red light. The light-emitting element LE of the third light-emitting area EA3 may emit the third light as green light. The light-blocking member BK serves to prevent light beams from the light-emitting area EA1, EA2, and EA3 from being mixed with each other.

The reflective metal layer RFL may be disposed in the non-light-emitting area NEA overlapping the light-blocking member BK and may prevent light beams from the light-emitting areas EA1, EA2, and EA3 from being mixed with each other.

As shown in FIG. 23, in an embodiment, one of the light-emitting elements LE may be disposed on an edge of the first pixel electrode PE1 so as to be inclined. The light-emitting element LE may overlap (e.g., vertically overlap) the protrusion PP of the first pixel electrode PE1. In this case, the light-emitting element LE may partially overlap the non-light-emitting area NEA, so that light emitted from the light-emitting element LE may invade a light-emitting area adjacent thereto.

In this embodiment, the reflective metal layer RFL may be formed on the common electrode CE and in the non-light-emitting area NEA. Thus, a portion of the light emitted from the light-emitting element LE may be reflected from the reflective metal layer RFL and thus may be prevented from invading the light-emitting areas EA2 and EA3 adjacent thereto. Further, the portion of the light emitted from the light-emitting element LE may be reflected from the reflective metal layer RFL and thus may be emitted at the corresponding light-emitting area EA1.

In an example, in FIG. 20, the light-emitting element LE of the first light-emitting area EA1 may emit the first light as blue light. The light-emitting element LE of the second light-emitting area EA2 may emit the second light as red light. The light-emitting element LE of the third light-emitting area EA3 may emit the third light as green light. In this case, the wavelength conversion layer QDL include a first scatterer SCP1 and a first base resin BRS1, may scatter the light emitted from each of the light-emitting elements LE, and may emit the scattered light toward a corresponding one of color filters CF1, CF2, and CF3.

Referring to FIG. 21, in another embodiment, the light-emitting element LE disposed in each of the first light-emitting area EA1, the second light-emitting area EA2, and the third light-emitting area EA3 may emit the first light as blue light. In this case, the wavelength conversion layer QDL may include a light-transmissive pattern 230 overlapping the first light-emitting area EA1, a first wavelength conversion pattern 240 overlapping the second light-emitting area EA2, and a second wavelength conversion pattern 250 overlapping the third light-emitting area EA3.

The light-transmissive pattern 230 may be disposed in the first opening OP1 and may overlap each of the first light-emitting area EA1 and the first color filter CF1. The light-transmissive pattern 230 may transmit light incident thereto. The first light emitted from the light-emitting element LE disposed in the first light-emitting area EA1 may be blue light. The first light as the blue light may pass through the light-transmissive pattern 230 and may be output to the first color filter CF1 of the first light-emitting area EA1. The light-transmissive pattern 230 may include the first base resin BRS1 and the first scatters SCP1 dispersed in first base resin BRS1. The first base resin BRS1 and the first scatter SCP1 have been described above, and thus the descriptions thereof are omitted.

The first wavelength conversion pattern 240 may be disposed in the second opening OP2 and may overlap each of the second light-emitting area EA2 and the second color filter CF2. The first wavelength conversion pattern 240 may convert or shift a peak wavelength of incident light thereto to a specific peak wavelength different therefrom and may output light having the specific peak wavelength. In an embodiment, the first wavelength conversion pattern 240 may convert the first light emitted from the light-emitting element LE in the second light-emitting area EA2 to second light as red light having a peak wavelength in a range of about 610 nm to about 650 nm and may emit the red light.

The first wavelength conversion pattern 240 may include a second base resin BRS2, and second wavelength conversion particles WCP2 and second scatters SCP2 dispersed in the second base resin BRS2.

The second base resin BRS2 may be made of a material having high light transmittance. The second base resin BRS2 and the first base resin BRS1 as descried above may be made of a same material.

The second wavelength conversion particles WCP2 may convert or shift a peak wavelength of incident light thereto to a specific peak wavelength different therefrom. In an embodiment, the second wavelength conversion particles WCP2 may convert the first color light as the blue light from the light-emitting element LE into third light as red light having a peak wavelength in a range of about 610 nm to about 650 nm and emit the red light.

An example of the second wavelength conversion particle WCP2 may include a quantum dot, a quantum rod, or phosphor. A more detailed description of the second wavelength conversion particle WCP2 is substantially identical or similar to the description of the first wavelength conversion particle WCP1, and thus will be omitted.

A portion of the first light as the blue light emitting from the light-emitting element LE may not be converted to the second light as the red light by the second wavelength conversion particle WCP2, but may pass through the first wavelength conversion pattern 240. However, the portion of the first light that has not been converted to the red light may be blocked by the second color filter CF2. In contrast, the red light into which a portion of the first light emitting from the light-emitting element LE has been converted by the first wavelength conversion pattern 240 may pass through the second color filter CF2 and may be emitted to an outside.

The second wavelength conversion pattern 250 may be disposed in the third opening OP3 and may overlap each of the third light-emitting area EA3 and the third color filter CF3. The second wavelength conversion pattern 250 may convert or shift a peak wavelength of light incident thereto into a specific peak wavelength different therefrom and may emit light having the specific peak wavelength. In an embodiment, the second wavelength conversion pattern 250 may convert the first light emitting from the light-emitting element LE in the third light-emitting area EA3 into the third light as green light having a peak wavelength in a range of about 510 nm to about 550 nm, and may emit the third light.

The second wavelength conversion pattern 250 may include a third base resin BRS3 and third wavelength conversion particles WCP3 and third scatters SCP3 dispersed in the third base resin BRS3.

The third base resin BRS3 may be made of a material having high light transmittance. The third base resin BRS3 and the first base resin BRS1 or the second base resin BRS2 as above-mentioned may be made of a same material, or the third base resin BRS3 may include at least one of the materials as the examples of the material of the first base resin BRS1 or the second base resin BRS2.

The third wavelength conversion particles WCP3 may convert or shift a peak wavelength of incident light thereto to a specific peak wavelength different therefrom. In an embodiment, the third wavelength conversion particles WCP3 may convert the first light as the blue light from the light-emitting element LE into a third light as green light having a peak wavelength in a range of about 510 nm to about 550 nm and emit the third light.

An example of the third wavelength conversion particle WCP3 may include a quantum dot, a quantum rod, or phosphor. A more detailed description of the third wavelength conversion particle WCP3 is substantially the same as or similar to the description of the first wavelength conversion particle WCP1, and thus will be omitted.

A portion of the first light as the blue light emitting from the light-emitting element LE may not be converted to the third light as the green light by the third wavelength conversion particle WCP3, but may pass through the second wavelength conversion pattern 250. However, the portion of the first light that has not been converted to the green light may be blocked by the third color filter CF3 disposed on the second wavelength conversion pattern 250. In contrast, the green light into which a portion of the first light emitting from the light-emitting element LE has been converted by the second wavelength conversion pattern 250 may pass through the third color filter CF3 and may be emitted to an outside.

The display device 10 according to an embodiment as described above may include the wavelength conversion layer QDL including the light-transmissive pattern 230, the first wavelength conversion pattern 240, and the second wavelength conversion pattern 250, thereby improving light emission efficiency of each of the blue, green, and red light beams.

The embodiment of FIG. 22 is different from the embodiment of FIG. 21 as described above at least in that each of the first wavelength conversion pattern 240 and the second wavelength conversion pattern 250 includes first wavelength conversion particles WCP1.

Each of the first wavelength conversion pattern 240 and the second wavelength conversion pattern 250 may include the first wavelength conversion particles WCP1 that convert the first light as blue light to fourth light as yellow light. Accordingly, the first light as the blue light emitted from the light-emitting element LE disposed in each of the second light-emitting area EA2 and the third light-emitting area EA3 may be converted into the fourth light as the yellow light. In each of the first wavelength conversion pattern 240 and the second wavelength conversion pattern 250, the first light as blue light and the fourth light as yellow light may be mixed with each other to emit fifth light as white light. The fifth light may be converted to the second light by the second color filter CF2 and may be output to an outside. The fifth light may be converted into the third light by the third color filter CF3 and may be emitted to an outside.

In one example, FIG. 23 as described above illustrates that the light-emitting element LE is inclined on the edge of the first pixel electrode PE1. However, this embodiment is not limited thereto. As shown in FIG. 25, an entire bottom of the light-emitting element LE may be adhered on a top face of the edge of the first pixel electrode PE1. In this case, the light-emitting element LE may overlap the non-light-emitting area NEA, such that the light emitted from the light-emitting element LE may be emitted to the non-light-emitting area NEA, thereby causing color mixing. In this embodiment, the reflective metal layer RFL may be disposed above the light-emitting element LE and in the non-light-emitting area NEA, such that the light emitted from the light-emitting element LE may be prevented from being emitted to a light-emitting area adjacent thereto, thereby preventing the color mixing.

Hereinafter, a manufacturing process of the display device 10 according to an embodiment will be described with reference to other drawings.

Figure 26:
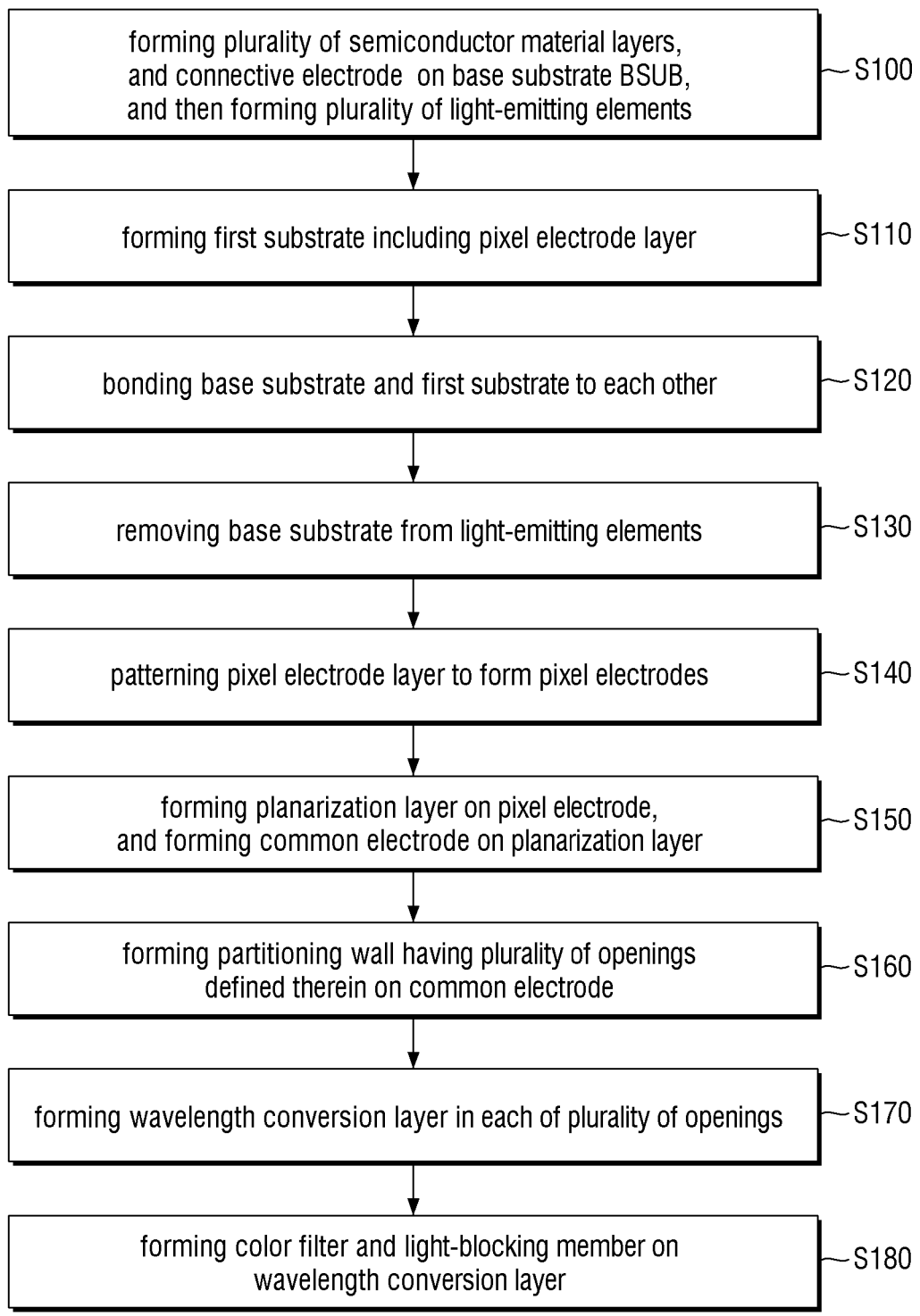
FIG. 26 is a flowchart schematically showing a method for manufacturing a display device according to an embodiment.

FIG. 26 is a schematic flowchart illustrating the manufacturing method of a display device according to an embodiment. FIGS. 27 to 40 are schematic cross-sectional views for illustrating the manufacturing method of the display device according to an embodiment.

FIGS. 27 to 40 are schematic cross-sectional views and schematic plan views of structures according to a formation order of the layers of the display device 10. FIGS. 27 to 40 mainly show a manufacturing process of the light-emitter LEP and the wavelength converter 200. FIGS. 27 to 40 may generally correspond to the schematic cross-sectional view of FIG. 7. Further, the first and second light-emitting areas EA1 and EA2 of the display device 10 are mainly described hereinafter. In the following descriptions, the manufacturing method of the display device as shown in FIGS. 27 to 40 will be described in conjunction with FIG. 26.

Figure 27:
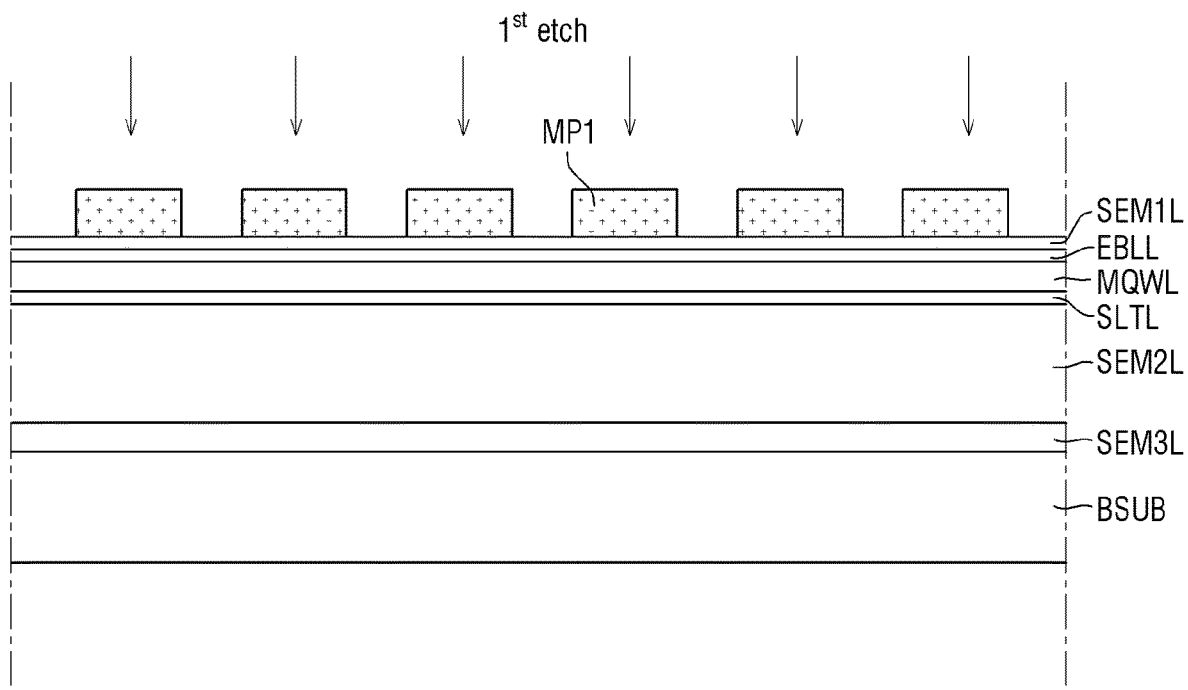

Referring to FIG. 27, semiconductor layers (or semiconductor material layers) SEM3L, SEM2L, SLTL, MQWL, EBLL, and SEM1L are formed on the base substrate BSUB, and the light-emitting elements LE are formed S100 (see FIG. 26).

First, the base substrate BSUB is provided. The base substrate BSUB may be a sapphire substrate ($Al_2O_3$) or a silicon wafer including silicon. However, the disclosure is not limited thereto. In an embodiment, the base substrate BSUB is embodied as the sapphire substrate will be described by way of example.

The semiconductor layers SEM3L, SEM2L, SLTL, MQWL, EBLL, and SEM1L are formed on the base substrate BSUB. The semiconductor layers may be grown using an epitaxial method and may be formed by growing a seed crystal. In this connection, each of the semiconductor layers may be formed using electron beam deposition, physical vapor deposition (PVD), chemical vapor deposition (CVD), plasma laser deposition (PLD), dual-type thermal evaporation, sputtering, or metalorganic chemical vapor deposition (MOCVD). However, the disclosure is not limited thereto.

A precursor material for forming the semiconductor layers may not be particularly limited and may be selected from a group of materials used conventionally for forming a target material. In an example, the precursor material may be a metal precursor including an alkyl group such as a methyl group or an ethyl group. For example, the precursor material may be a compound such as trimethyl gallium ($Ga(CH_3)_3$), trimethyl aluminum ($Al(CH_3)_3$), or triethyl phosphate ($(C_2H_5)_3PO_4$). However, the disclosure is not limited thereto.

The third semiconductor layer SEM3L is formed on the base substrate BSUB. Although the drawing shows that a third semiconductor layer SEM3L is stacked, the disclosure is not limited thereto. Third semiconductor layers SEM3 may be formed. The third semiconductor layer SEM3L may be disposed to reduce a difference between lattice constants of the second semiconductor layer SEM2L and the base substrate BSUB. In an example, the third semiconductor layer SEM3L may include a semiconductor material which is undoped with an n-type or p-type dopant. In an embodiment, the third semiconductor layer SEM3 may be made of at least one of InAlGaN, GaN, AlGaN, InGaN, AlN and InN undoped with an n-type or p-type dopant. However, the disclosure is not limited thereto.

Using the above-described method, a second semiconductor layer SEM2L, a superlattice layer (or superlattice material layer) SLTL, an active layer (or active material layer) MQWL, an electron blocking layer (or electron blocking material layer) EBLL, and a first semiconductor layer SEM1L are sequentially formed on the third semiconductor layer SEM3L.

Subsequently, the semiconductor layers SEM3L, SEM2L, SLTL, MQWL, EBLL, and SEM1L are etched to form the light-emitting elements LE.

First mask patterns MP1 are formed on the first semiconductor layer SEM1L. Each of the first mask patterns MP1 may be embodied as a hard mask including an inorganic material or a photoresist mask including an organic material. The first mask pattern MP1 may prevent a portion of each of the semiconductor layers SEM3L, SEM2L, SLTL, MQWL, EBLL, and SEM1L beneath each of the first mask patterns MP1 from being etched away. Using the first mask patterns MP1 as masks, a portion of each of the semiconductor layers SEM3L, SEM2L, SLTL, MQWL, EBLL, and SEM1L is etched (first etched) to form the light-emitting elements LE.

Figure 28:
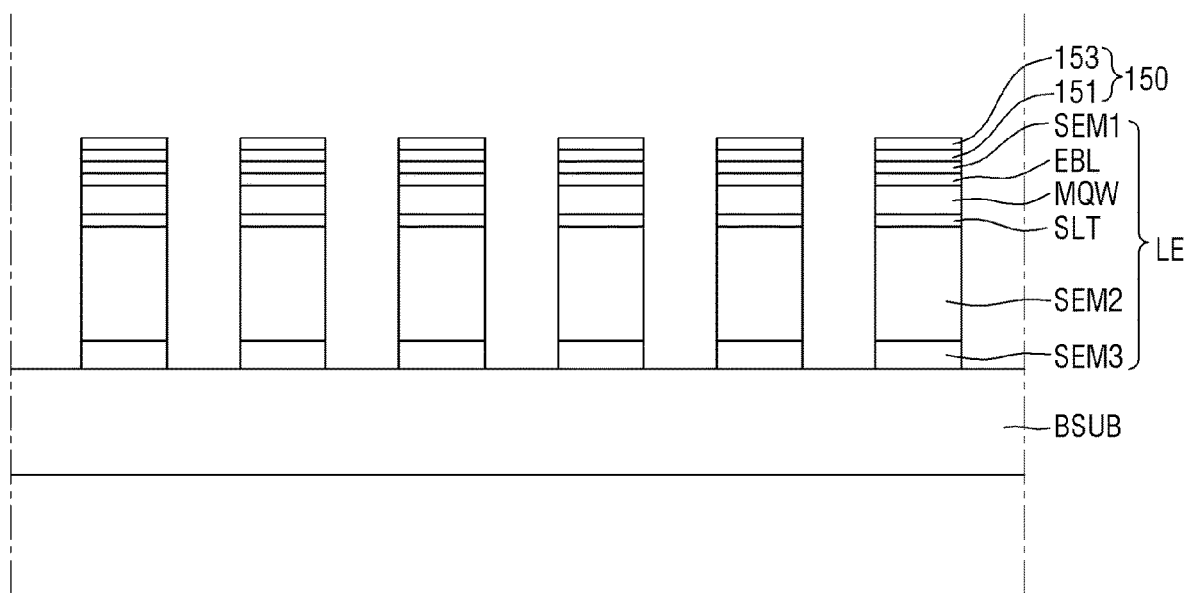

Referring to FIG. 28, the portion of each of the semiconductor layers SEM3L, SEM2L, SLTL, MQWL, EBLL, and SEM1L that does not overlap the first mask pattern MP1 may be etched and removed so that an unetched portion thereof overlapping the first mask pattern MP1 may act as the light-emitting elements LE.

The semiconductor layers SEM3L, SEM2L, SLTL, MQWL, EBLL, and SEM1L may be etched using a conventional method. For example, a process of etching the semiconductor layers SEM3L, SEM2L, SLTL, MQWL, EBLL, and SEM1L may include dry etching, wet etching, reactive ion etching (RIE), deep reactive ion etching (DRIE), inductively coupled plasma reactive ion etching (ICP-RIE), etc. The dry etching may realize anisotropic etching and thus may be suitable for vertical etching. In case that the above-described etching method is used, an etchant may be $Cl_2$ or $O_2$. However, the disclosure is not limited thereto.

The portion of each of the semiconductor layers SEM3L, SEM2L, SLTL, MQWL, EBLL, and SEM1L overlapping the first mask pattern MP1 may not be etched but may form each of the light-emitting elements LE. Accordingly, each of the light-emitting elements LE may be formed and include the third semiconductor layer SEM3, the second semiconductor layer SEM2, the superlattice layer SLT, the active layer MQW, the electron blocking layer EBL, and the first semiconductor layer SEM1.

A connective electrode layer (or connective electrode material layer) is deposited on the base substrate BSUB and is etched. Thus, the connective electrodes 150 are respectively formed on the light-emitting elements LE. A reflective layer (or reflective layer material layer) and a connection layer (or connection layer material layer) may be sequentially stacked on the base substrate BSUB, and then may be etched to form the connective electrode 150 including the reflective layer 151 and the connection layer 153. The connective electrode 150 may be formed directly on a top face of the first semiconductor layer SEM1 of the light-emitting element LE. In an embodiment, the reflective layer 151 of the connective electrode 150 may directly contact the top face of the first semiconductor layer SEM1 of the light-emitting element LE. The light-emitting element LE may include the connective electrode 150.

Referring to FIG. 29, a first substrate 110 including a pixel electrode layer PEL is formed S110 (see FIG. 26).

The first switching element T1 is formed on the first substrate 110, and the insulating layer 130 is formed on the first switching element T1. The first substrate 110 may be a transparent insulating substrate which may be a glass or quartz substrate. The first switching element T1 may include thin-film transistors and a capacitor. The insulating layer 130 may have a contact hole formed therein exposing the first switching element T1.

Subsequently, a lower electrode layer (or lower electrode material layer) P1L is formed by stacking a metal material on the insulating layer 130. An upper electrode layer (or upper electrode material layer) P3L is formed thereon by stacking a metal material thereon. Thus, the pixel electrode layer PEL is formed. The pixel electrode layer PEL may be electrically connected to the first switching element T1 via a contact hole formed in the insulating layer 130.

Subsequently, the base substrate BSUB is bonded to the first substrate 110 S120 (see FIG. 26).

The base substrate BSUB is aligned with the first substrate 110. In this case, the connective electrode 150 of the light-emitting element LE formed on the base substrate BSUB faces toward the first substrate 110.

Next, the first substrate 110 and the base substrate BSUB are bonded to each other. The connective electrode 150 of the light-emitting element LE formed on the base substrate BSUB contacts the upper electrode layer P3L of the first substrate 110. In this case, the connection layer 153 of the light-emitting element LE contacts the upper electrode layer P3L. Then, the method melt-bonds the connection layer 153 of the light-emitting element LE to the upper electrode layer P3L, such that the first substrate 110 and the base substrate BSUB are bonded to each other. In this case, the light-emitting elements LE are adhered to a top face of the upper electrode layer P3L. The melt-bonding may be achieved by irradiating laser from a position above the base substrate BSUB to the upper electrode layer P3L. High-temperature heat of the laser is transmitted to the upper electrode layer P3L irradiated with the laser, so that an interface thereof may be adhered to the connection layer 153 of the light-emitting element LE. The upper electrode layer P3L may be made of copper (Cu) having excellent thermal conductivity, so that adhesive properties thereof with respect to the connection layer 153 of the light-emitting element LE may be excellent. YAG may be used as a source of the laser used for the melt-bonding.

Subsequently, the base substrate BSUB is removed from the light-emitting elements LE S130 (see FIG. 26).

Referring to FIG. 30, the base substrate BSUB is removed from the third semiconductor layer SEM3 of the light-emitting element LE. A process of removing the base substrate BSUB may include a laser lift off (LLO) process. The laser lift-off process may use laser. KrF excimer laser (248 nm wavelength) may be used as a source of the laser. The excimer laser may be irradiated at an energy density in a range of about 550 mJ/cm$^2$ to about 950 mJ/cm$^2$. An incident area thereof may be in a range of about 50×50 μm$^2$ to 1×1 cm$^2$. However, the disclosure is not limited thereto. The method may include irradiating the laser onto the base substrate BSUB, such that the base substrate BSUB may be removed from the light-emitting elements LE.

Figure 31:
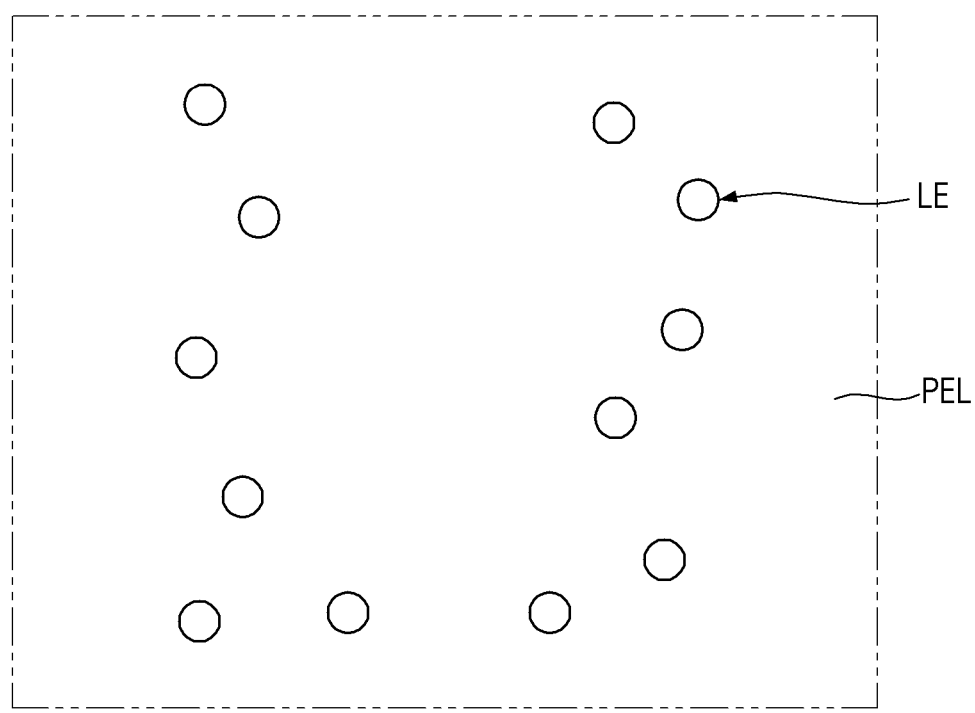

Accordingly, as shown in FIG. 31, the light-emitting elements LE may be randomly arranged on the pixel electrode layer PEL.

Next, the pixel electrode layer PEL is patterned such the pixel electrodes PE1 and PE2 are formed S140 (see FIG. 26).

Referring to FIGS. 32 and 33, photoresist is applied on the first substrate 110 on which the light-emitting elements LE have been formed, and is exposed and developed to form a first photoresist pattern PR1. The first photoresist pattern PR1 may cover a portion of the light-emitting element LE and a portion of the pixel electrode layer PEL.

Referring to FIG. 34, the pixel electrode layer PEL is etched by spraying an etchant on the first substrate 110. A portion of the pixel electrode layer PEL masked with the first photoresist pattern PR1 and the light-emitting element LE may not be etched, and the remaining portion thereof may be etched by the etchant. Accordingly, the pixel electrode layer PEL is converted into the first pixel electrode PE1 and the second pixel electrode PE2, each including the lower electrode layer P1 and the upper electrode layer P3. As each of the pixel electrodes PE1 and PE2 is formed, the first light-emitting area EA1 overlapping the first pixel electrode PE1 and the second light-emitting area EA2 overlapping the second pixel electrode PE2 may be defined. Although not shown, light-emitting areas corresponding to other pixel electrodes may be defined.

Figure 36:
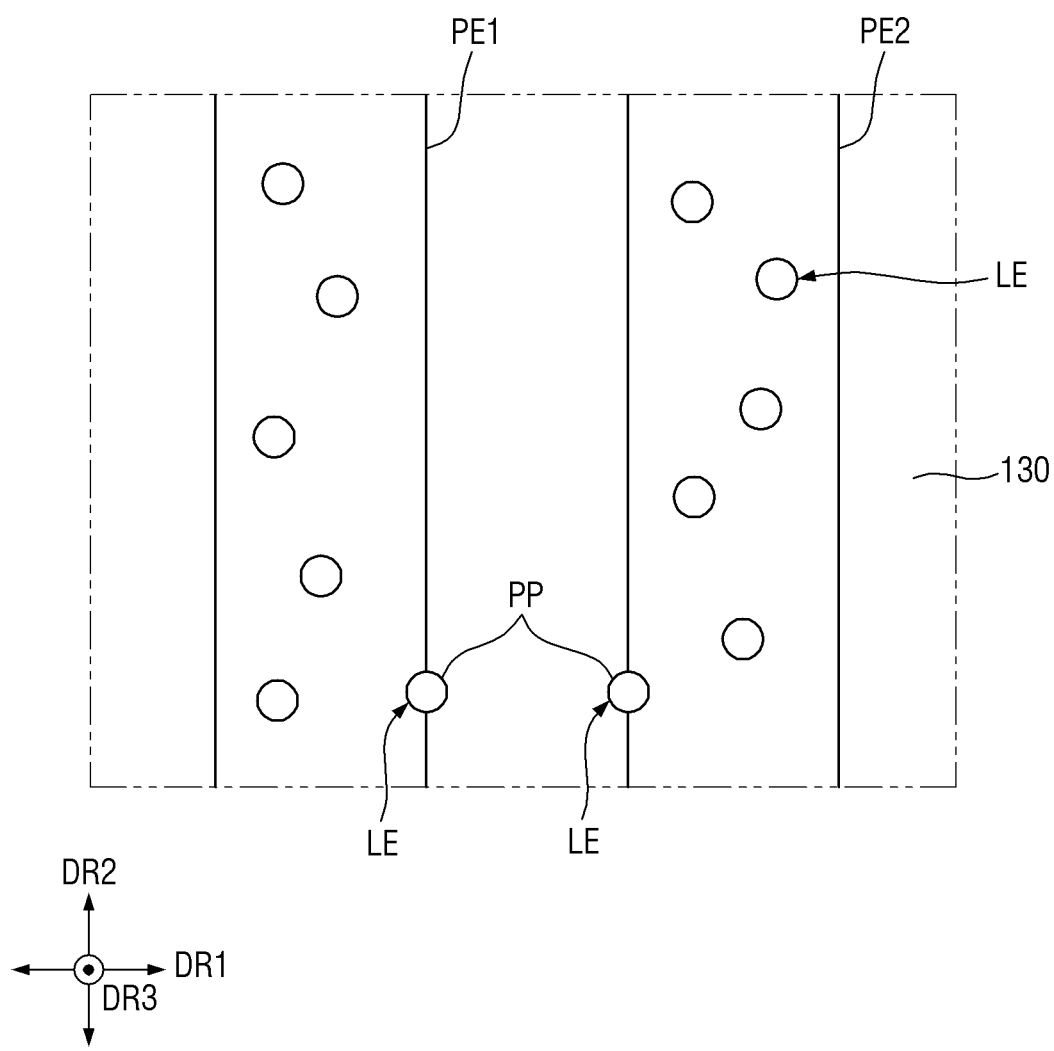

Referring to FIGS. 35 and 36, the first photoresist pattern PR1 is removed by stripping or ashing. The etching process may allow each of the pixel electrodes PE1 and PE2 to have the protrusion PP protruding from one side outwardly, and allow the light-emitting element LE to be disposed on the protrusion PP. The protrusion PP may protrude toward a pixel electrode adjacent thereto and may overlap the light-emitting element LE. An outer side of the protrusion PP may be aligned and coincide with an outer side of the light-emitting element LE.

In this embodiment, each of the pixel electrodes PE1 and PE2 may be formed using the light-emitting element LE and the first photoresist pattern PR1 as a mask, such that the light-emitting elements LE may be aligned with and may be disposed on the pixel electrodes PE1 and PE2. Accordingly, a process of aligning the light-emitting elements LE with the pixel electrodes PE1 and PE2 may be omitted.

Next, the planarization layer PLL is formed on the insulating layer 130 and the pixel electrodes PE1 and PE2, and then, the common electrode CE is formed on the planarization layer PLL S150 (see FIG. 26).

Referring to FIG. 37, an organic material is applied on the first substrate 110 to form the planarization layer PLL. The planarization layer PLL has a thickness smaller than a vertical dimension of the light-emitting element LE so that a portion of the second semiconductor layer SEM2 and the third semiconductor layer SEM3 of the light-emitting element LE are exposed.

The common electrode CE is formed by depositing a transparent conductive material on the planarization layer PLL. The common electrode CE covers the light-emitting elements LE and the planarization layer PLL. The common electrode CE contacts the exposed third semiconductor layer SEM3 and an exposed portion of the second semiconductor layer SEM2 of the light-emitting element LE protruding beyond the planarization layer PLL.

Subsequently, the partitioning wall PW having the openings OP1 defined therein is formed on the common electrode CE S160 (see FIG. 26).

Figure 38:
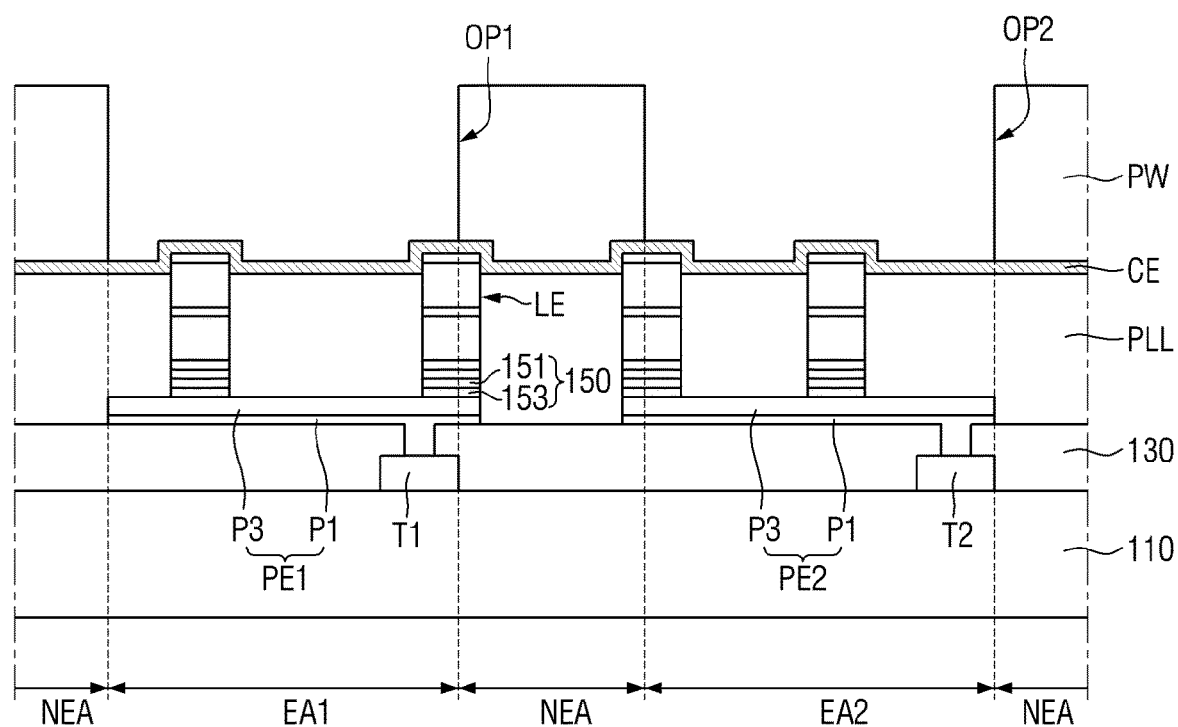

Referring to FIG. 38, an organic material is applied on the first substrate 110 including the common electrode CE and is patterned to form the partitioning wall PW. The openings are defined to correspond to the light-emitting areas. For example, the first opening OP1 is defined to correspond to the first light-emitting area EA1. The first opening OP2 is defined to correspond to the second light-emitting area EA2. Although not shown in the drawings, other openings are also defined to correspond to other light-emitting areas.

Each wavelength conversion layer QDL is formed in each of the openings OP1 S170 (see FIG. 26).

Figure 39:
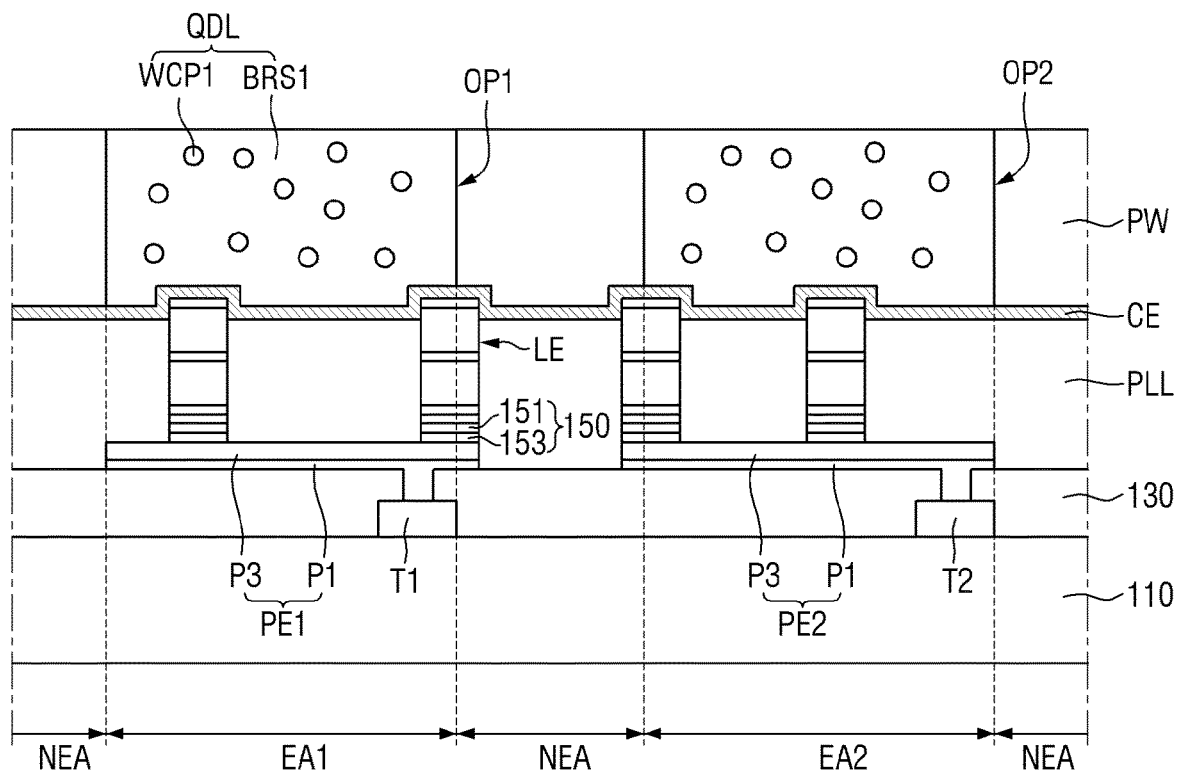

Referring to FIG. 39, the wavelength conversion layer QDL may fill the first opening OP1. The wavelength conversion layer QDL may be formed using a solution process such as inkjet printing, imprinting, etc. of a solution in which the first base resin BRS1 and the first wavelength conversion particles WCP1 are mixed with each other. However, the disclosure is not limited thereto. Each wavelength conversion layer QDL may be formed in each of the openings and may overlap each of the light-emitting areas.

Subsequently, the color filter CF1 and the light-blocking member BK are formed on the wavelength conversion layer QDL S180 (see FIG. 26).

Figure 40:
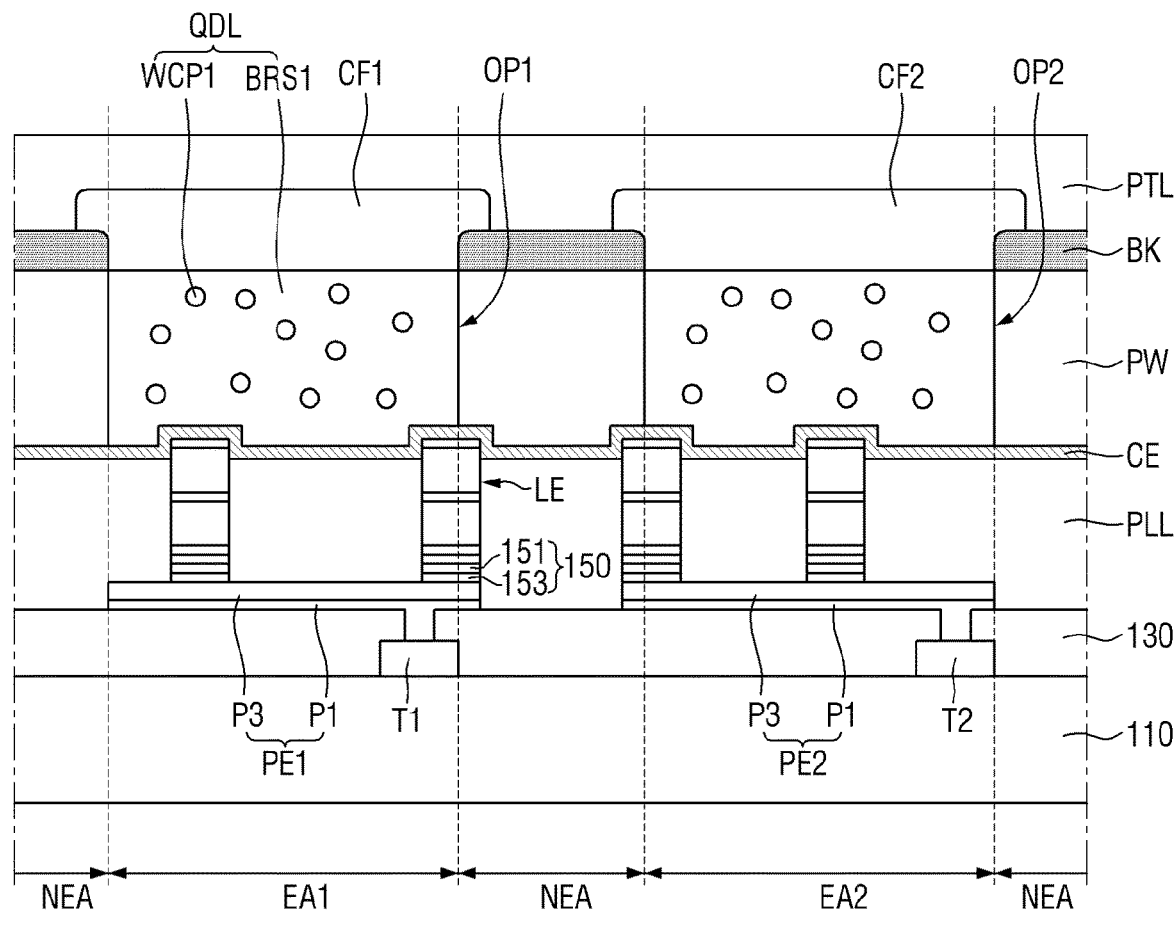

Referring to FIG. 40, the light-blocking member BK is formed on the partitioning wall PW. The light-blocking member BK is formed by applying a light-blocking material thereon and patterning the same. The light-blocking member BK overlaps the non-light-emitting area NEA and may not overlap each of the light-emitting areas EA1 and EA2.

The color filter CF1 is formed on the wavelength conversion layer QDL defined by the light-blocking member BK. The color filter CF1 may be formed using a photolithography process. A thickness of the color filter CF1 may be smaller than or equal to about 1 μm, but may not be limited thereto.

A first color filter layer (or first color filter material layer) is applied on the partitioning wall PW and the wavelength conversion layer QDL and then is patterned using a photolithography process to form the first color filter CF1 overlapping the first opening OP1. In a similar manner, other color filters may be formed so as to respectively overlap other openings by using a patterning process.

The protective layer PTL is formed on the light-blocking member BK and the color filter CF1. In this way, the display device 10 according to an embodiment is manufactured.

As described with reference to FIGS. 26 to 40, in the display device 10 according to an embodiment, each of the pixel electrodes PE1 and PE2 may be formed using the first photoresist pattern PR1 and the light-emitting element LE as a mask. Thus, the process of aligning the light-emitting elements LE with the pixel electrodes PE1 and PE2 respectively may be omitted. Further, the light-emitting elements LE may be prevented from being misaligned with the pixel electrodes PE1 and PE2, and thus a defect may be prevented.

FIGS. 41 to 53 are schematic cross-sectional views illustrating a manufacturing process of a display device according to another embodiment.

Referring to FIGS. 41 to 53, this embodiment is different from the embodiment of FIGS. 26 to 40 as described above at least in that films are attached to the light-emitting elements LE formed on the base substrate BSUB and are stretched and removed from the light-emitting elements LE such that the light-emitting elements LE are attached to the display substrate 100. Processes different from those of the above embodiment will be described, and descriptions of remaining processes will be omitted because they are the same as those in FIGS. 26 to 40.

Figure 41:
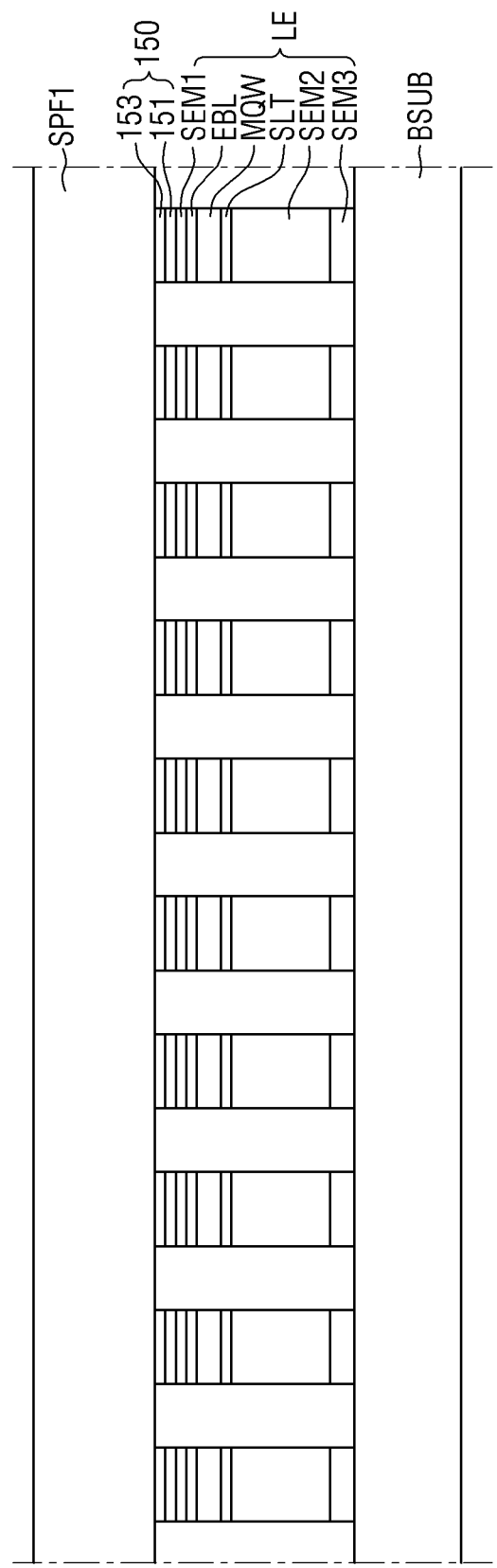
FIG. 41 to FIG. 53 are cross-sectional views schematically showing a manufacturing process of a display device according to another embodiment.

Referring to FIG. 41, a first support film SPF1 is attached to the light-emitting elements LE of the base substrate BSUB manufactured in FIG. 28.

The first support film SPF1 is attached to the light-emitting elements LE. The first support film SPF1 may be aligned with the light-emitting elements LE and may be attached to each of the connective electrodes 150 of the light-emitting elements LE. A large number of light-emitting elements LE may be disposed so that the light-emitting elements LE may not be detached from the first support film SPF1.

The first support film SPF1 may be composed of a support layer and an adhesive layer disposed on the support layer. The support layer may be made of a material that is transparent to allow light to pass therethrough and has mechanical stability. For example, the support layer may include a transparent polymer such as polyester, polyacrylic, polyepoxy, polyethylene, polystyrene, polyethylene terephthalate, and the like. The adhesive layer may include an adhesive material for bonding the support layer to the light-emitting element LE. For example, the adhesive material may include urethane acrylate, epoxy acrylate, and polyester acrylate, and the like. The adhesive material may have an adhesive strength varying as ultraviolet (UV) light or heat is applied thereto. Accordingly, the adhesive layer may be readily removed from the light-emitting element LE.

Figure 42:
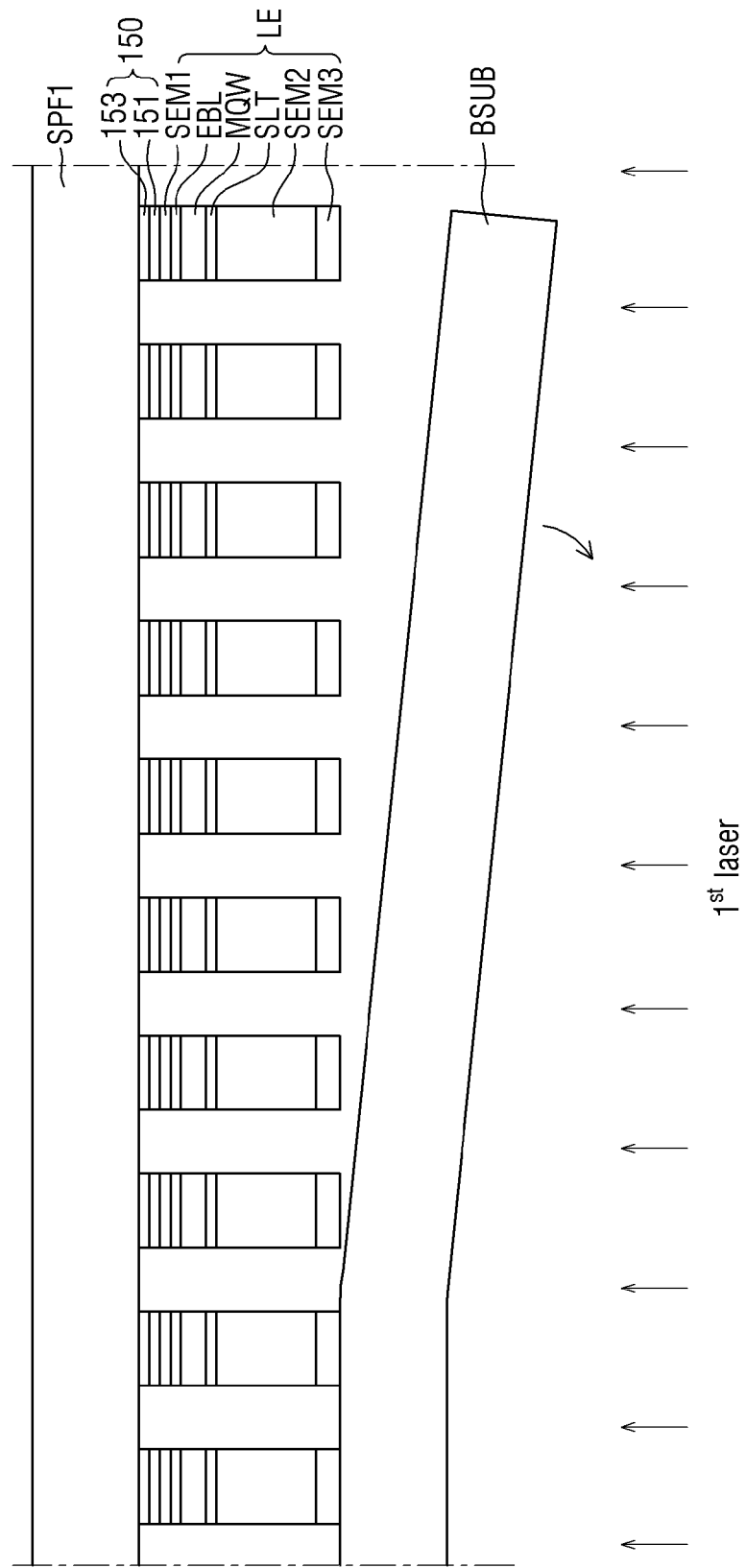

Referring to FIG. 42, the base substrate BSUB is removed from the light-emitting elements LE by irradiating first laser $1^{st}$ laser to the base substrate BSUB. The base substrate BSUB is removed from the third semiconductor layer SEM3 of each of the light-emitting elements LE. The process of removing the base substrate BSUB has been described above, and thus the description thereof is omitted.

Figure 43:
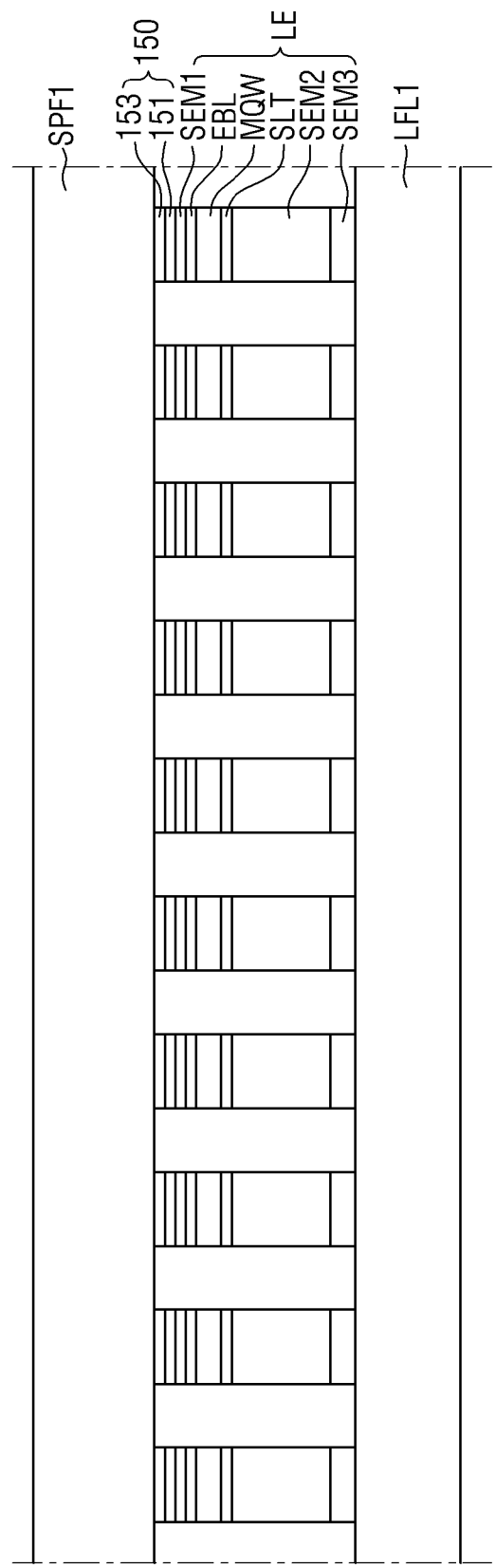

Referring to FIG. 43, a first transfer film LFL1 is attached to the light-emitting elements LE from which the base substrate BSUB is removed.

The first transfer film LFL1 is attached to the third semiconductor layer SEM3 of each of the light-emitting elements LE. The first transfer film LFL1 may be aligned with the light-emitting elements LE and may be attached to the third semiconductor layer SEM3 of each of the light-emitting elements LE.

The first transfer film LFL1 may include a stretchable material. The stretchable material may include, for example, polyolefine, polyvinyl chloride (PVC), elastomeric silicone, elastomeric polyurethane, elastomeric polyisoprene, and the like. The first transfer film LFL1 may include a support layer and an adhesive layer as in the above-described first support film SPF1. Thus, the first transfer film LFL1 may be adhered to and support the light-emitting elements LE.

Figure 44:
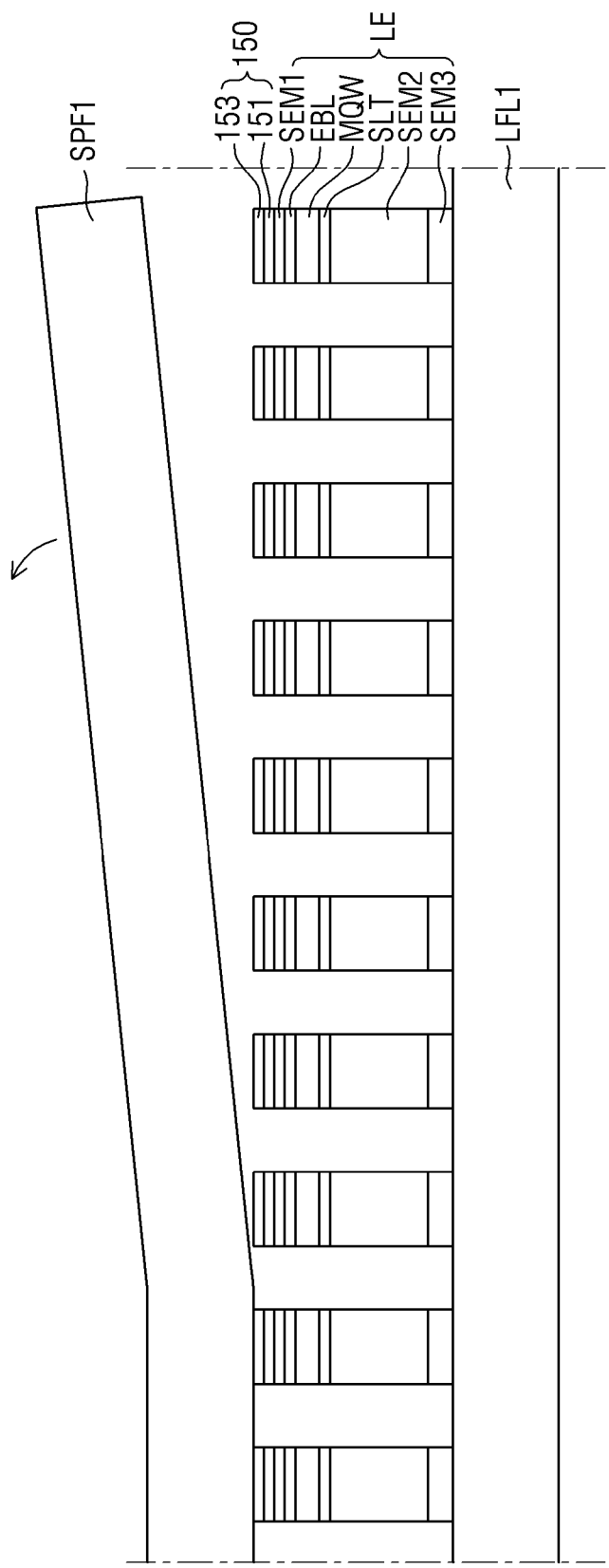
Figure 45:
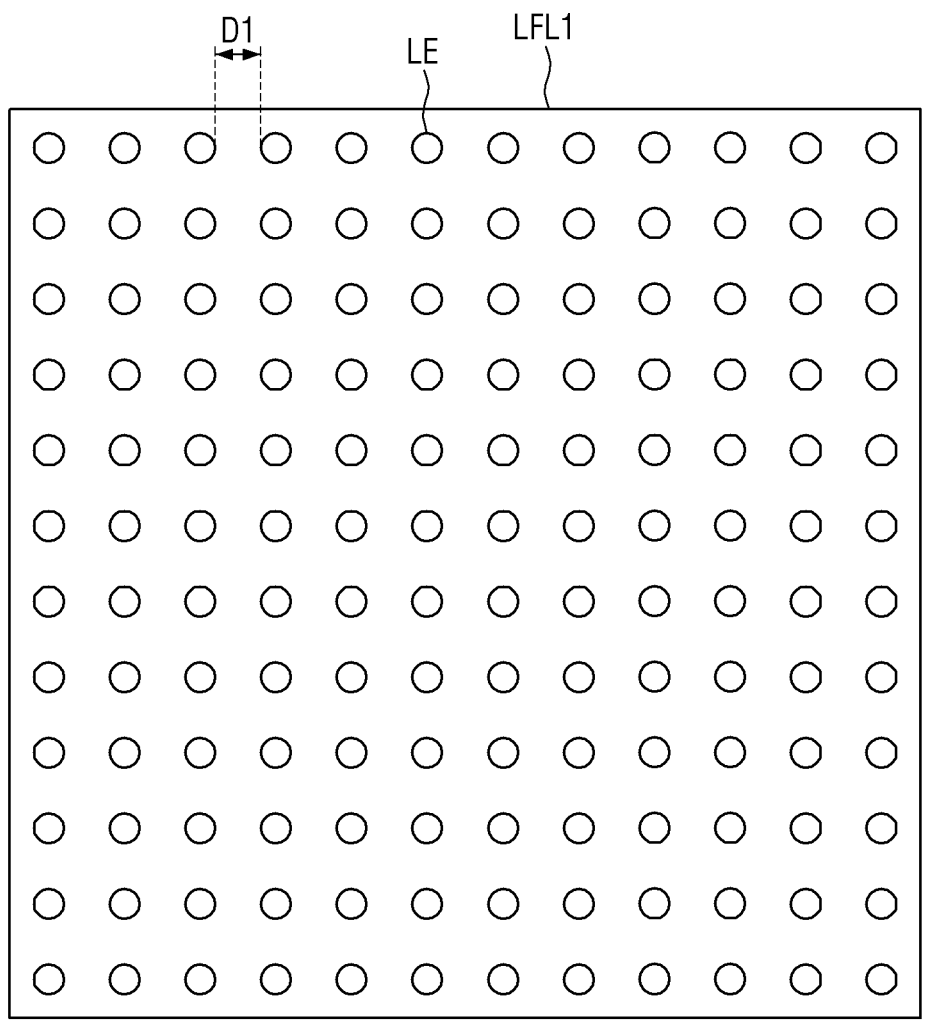

Referring to FIGS. 44 and 45, the first support film SPF1 is removed from the light-emitting elements LE. UV light or heat may be applied to the first support film SPF1 to lower the adhesive strength of the adhesive layer of the first support film SPF1, and then the first support film SPF1 may be physically or naturally removed from the light-emitting elements LE. The light-emitting elements LE may be disposed on the first transfer film LFL1 and may be arranged in a dot array in which the light-emitting elements LE are spaced apart from each other by a first spacing (e.g., a predefined or selected spacing) D1.

Figure 46:
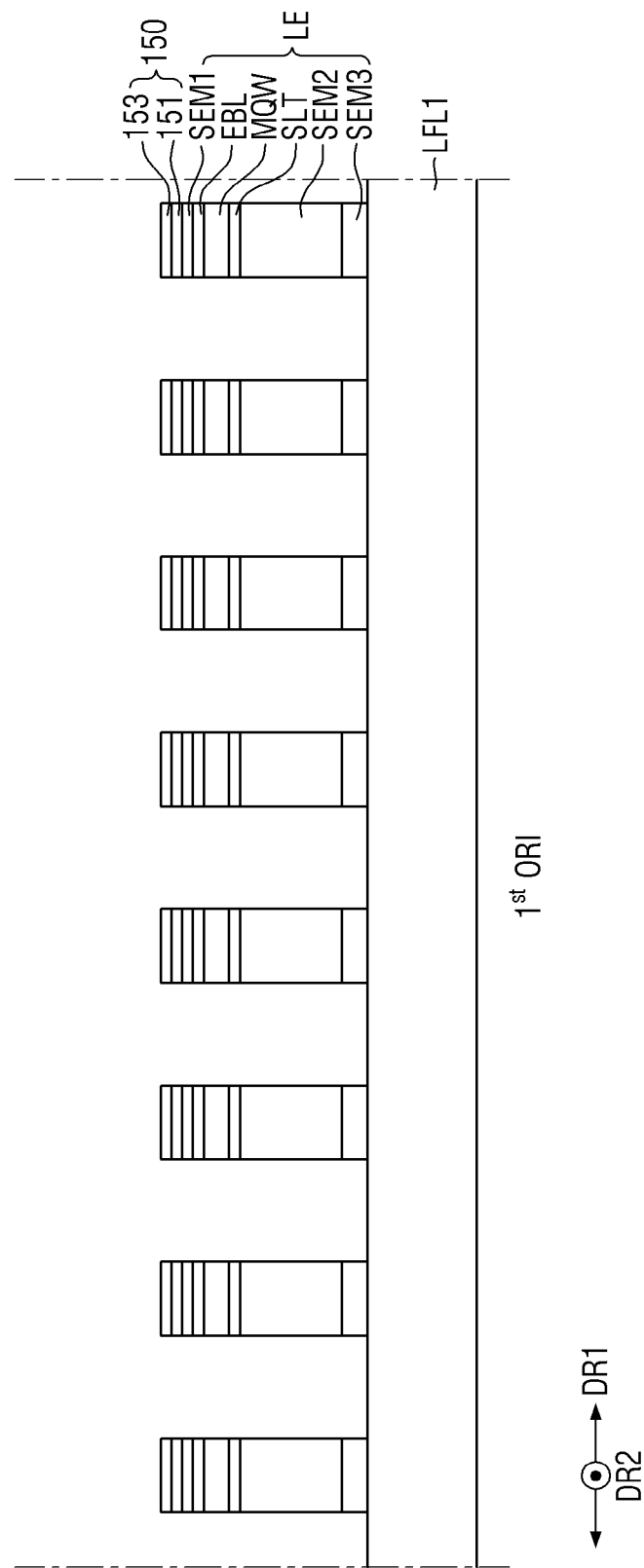
Figure 47:
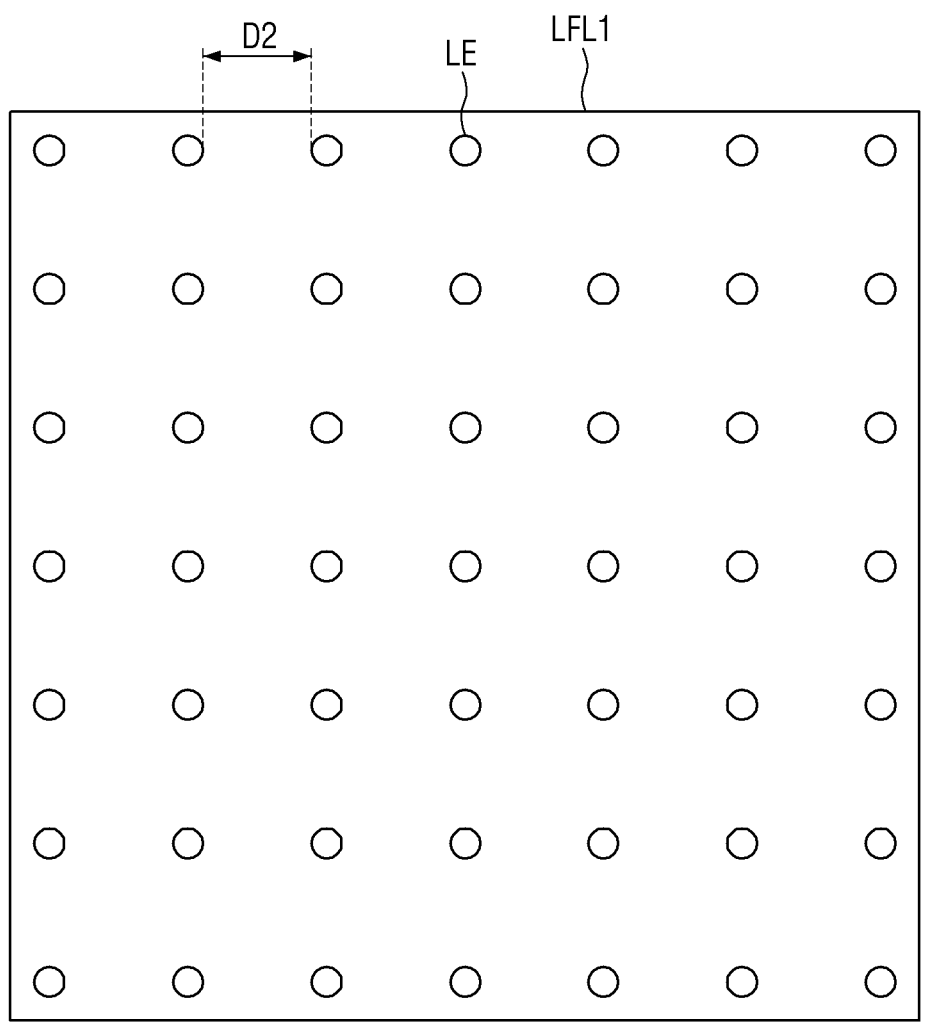

Referring to FIGS. 46 and 47, the first transfer film LFL1 is stretched ($1^{st}$ ORI). The first transfer film LFL1 may be stretched two-dimensionally, for example, in a plane defined by the first direction DR1 and the second direction DR2. As the first transfer film LFL1 is stretched, the light-emitting elements LE bonded onto the first transfer film LFL1 may be spaced apart from each other by a second spacing D2. The light-emitting elements LE may be uniformly spaced apart from each other by the second spacing D2 greater than the first spacing D1 as described above.

The stretching strength (or tensile strength) of the first transfer film LFL1 may be adjusted based on the second spacing D2 between the light-emitting elements LE. For example, the stretching strength (or tensile strength) of the first transfer film LFL1 may be about 120 gf/inch. However, the disclosure is not limited thereto. The stretching strength (or tensile strength) of the first transfer film LFL1 may be adjusted based on the second spacing D2 between the light-emitting elements LE.

Figure 48:
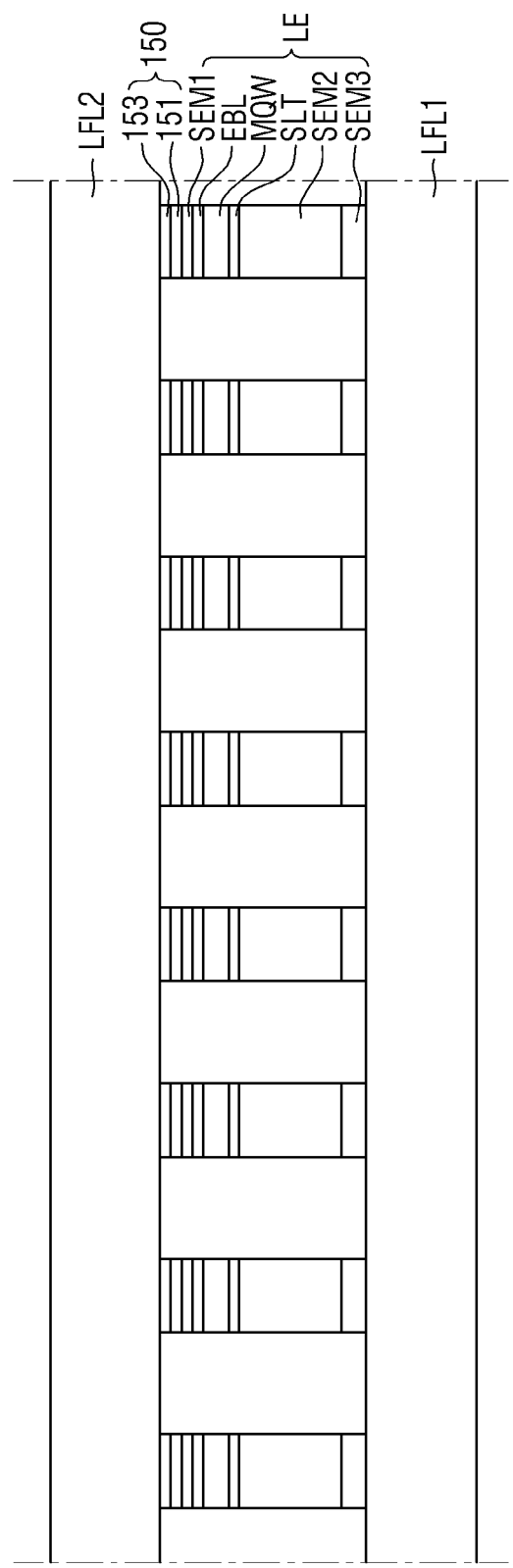

Referring to FIG. 48, a second transfer film LFL2 is attached onto the light-emitting elements LE from which the first support film SPF1 is removed. The second transfer film LFL2 may be aligned with the light-emitting elements LE and may be attached to the connective electrode 150 of each of the light-emitting elements LE. The second transfer film LFL2 may include a support layer and an adhesive layer as in the first transfer film LFL1 as described above. The detailed description thereof has been made above and thus is omitted.

Figure 49:
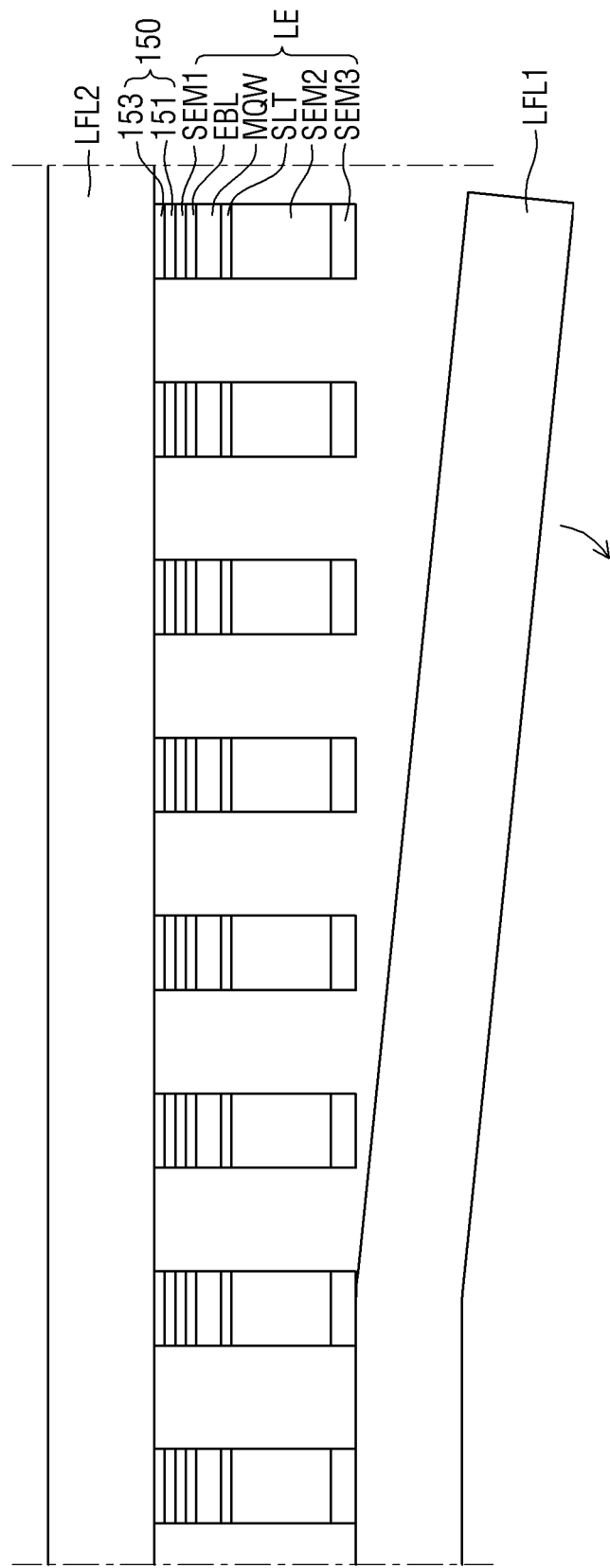

Referring to FIG. 49, the first transfer film LFL1 is removed from the light-emitting elements LE. UV light or heat may be applied to the first transfer film LFL1 to reduce the adhesive strength of the adhesive layer of the first transfer film LFL1, and then the first transfer film LFL1 may be physically or naturally removed therefrom.

Figure 50:
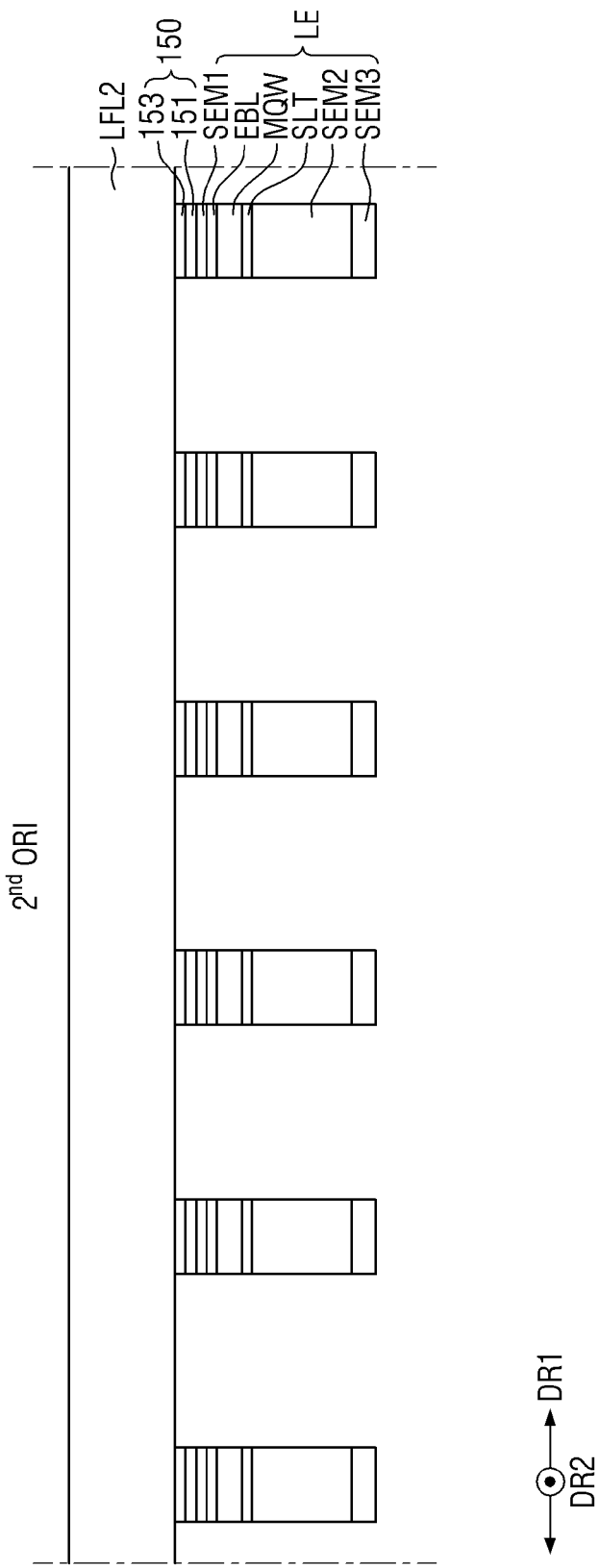
Figure 51:
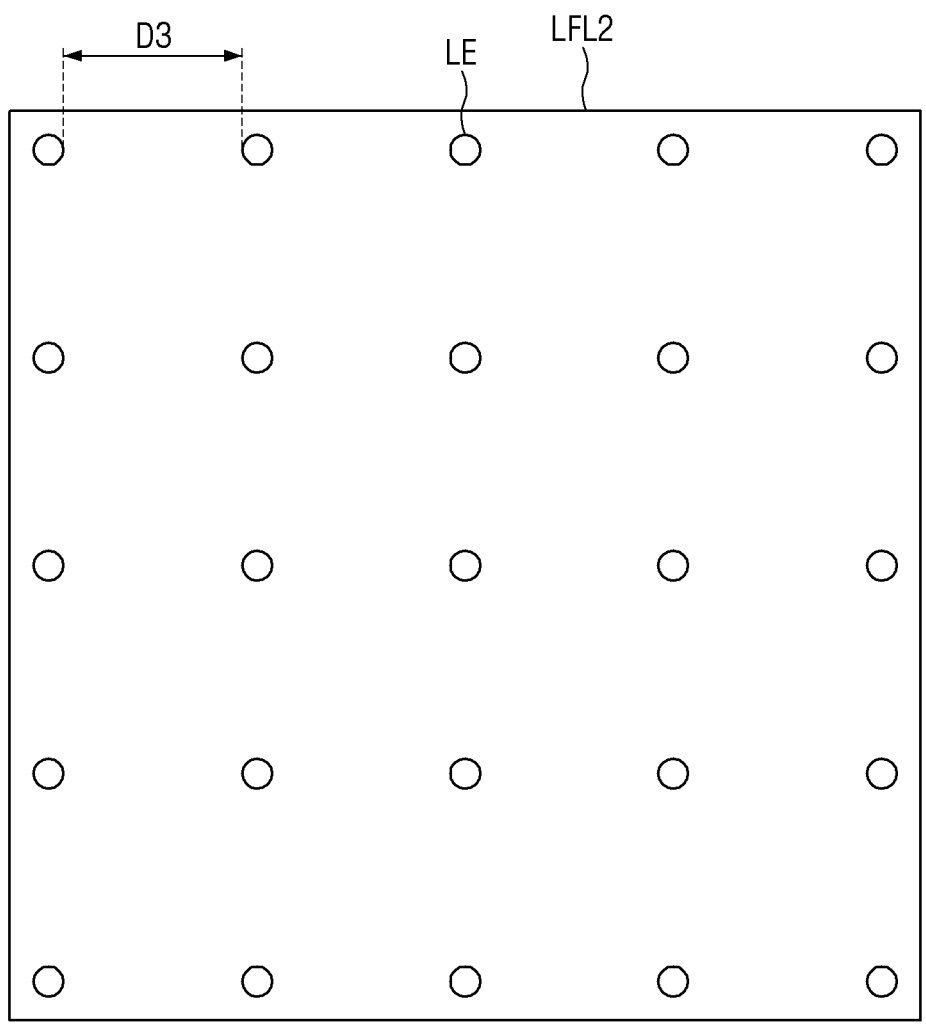

Referring to FIGS. 50 and 51, the second transfer film LFL2 is stretched ($2^{nd}$ ORI). The second transfer film LFL2 may be stretched two-dimensionally, for example, in a plane defined by the first direction DR1 and the second direction DR2. As the second transfer film LFL2 is stretched, the light-emitting elements LE adhered to the second transfer film LFL2 may be spaced apart from each other by a third spacing D3. The light-emitting elements LE may be uniformly spaced apart from each other by the third spacing D3 greater than the second spacing D2 as described above.

The stretching strength (or tensile strength) of the second transfer film LFL2 may be adjusted based on the third spacing D3 between the light-emitting elements LE. For example, the stretching strength (or tensile strength) of the second transfer film LFL2 may be about 270 gf/inch. However, the disclosure is not limited thereto. The stretching strength (or tensile strength) of the second transfer film LFL2 may be adjusted based on the third spacing D3 between the light-emitting elements LE.

Figure 52:
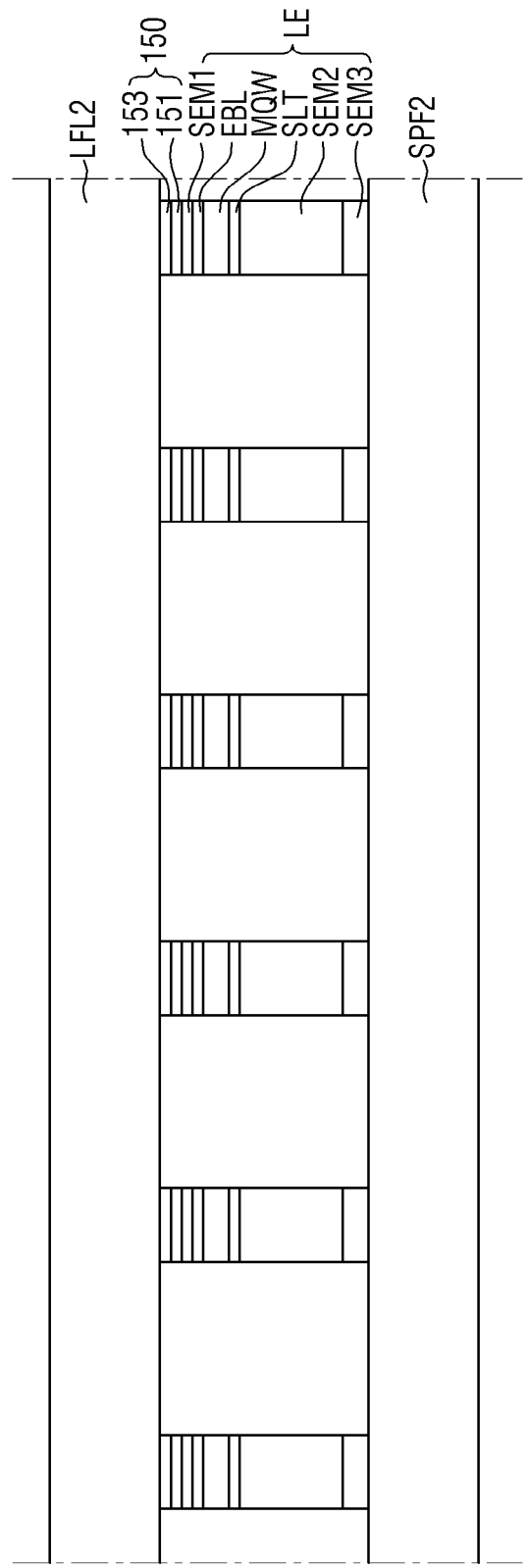

Referring to FIG. 52, a second support film SPF2 is attached onto the light-emitting elements LE from which the first transfer film LFL1 is removed. The second support film SPF2 may be aligned with the light-emitting elements LE and may be attached to the third semiconductor layer SEM3 of each of the light-emitting elements LE. The second support film SPF2 may include a support layer and an adhesive layer as in the first support film SPF1 as described above. The detailed description thereof has been made above and thus is omitted.

Figure 53:
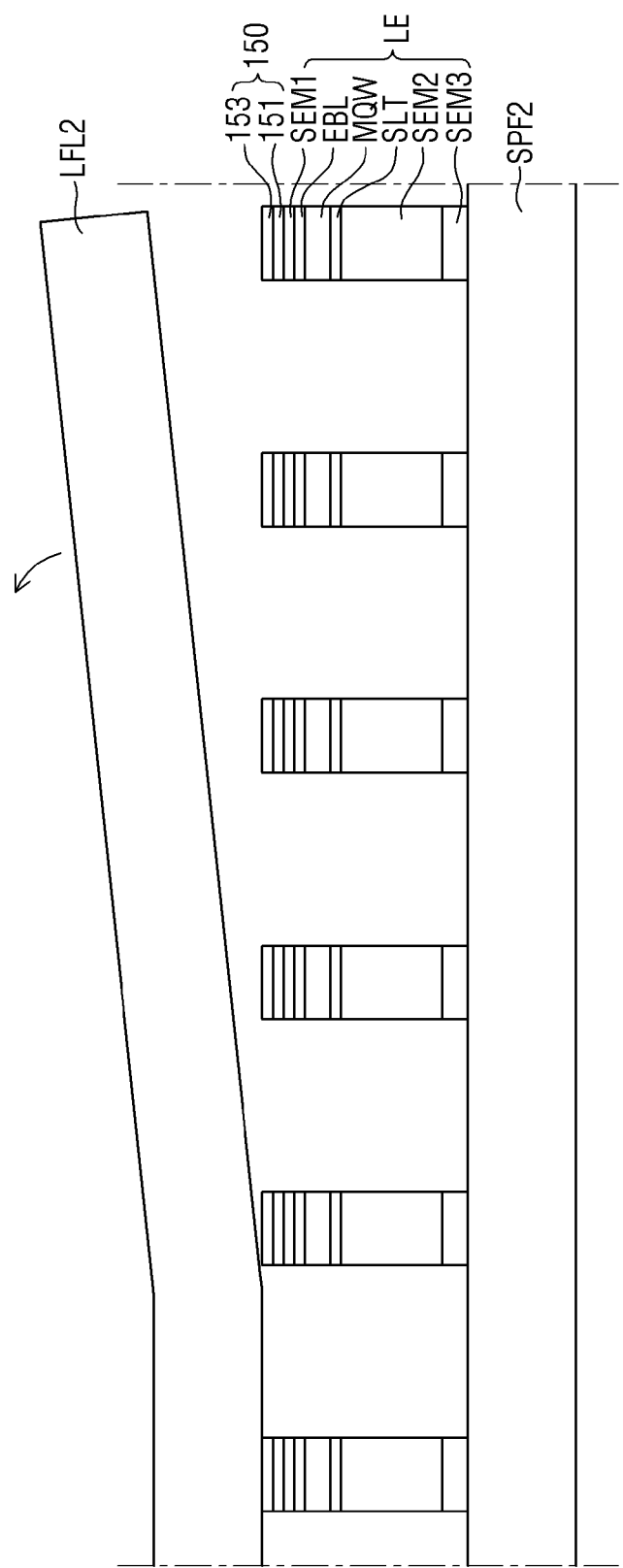

Referring to FIG. 53, the second transfer film LFL2 is removed from the light-emitting elements LE. The second transfer film LFL2 attached to the connective electrode 150 of each of the light-emitting elements LE is removed therefrom. The process of removing the second transfer film LFL2 is the same as the process of removing the first transfer film LFL1 as described above, and thus the description thereof is omitted. The second transfer film LFL2 may be removed from the connective electrode 150 of the light-emitting elements LE.

A second support film SPF2 is bonded to the first substrate 110. The light-emitting elements LE are attached to the first substrate 110. The process shown in FIGS. 28 to 41 as described above is carried out. Thus, the display device 10 may be manufactured.

In this embodiment, manufacturing the display device 10 using the transfer film may allow the density of the light-emitting elements LE to be controlled based on the pixel size. Accordingly, the light-emitting elements LE may be arranged to correspond to the pixels of various sizes. Thus, the display device may be readily manufactured.

Figure 54:
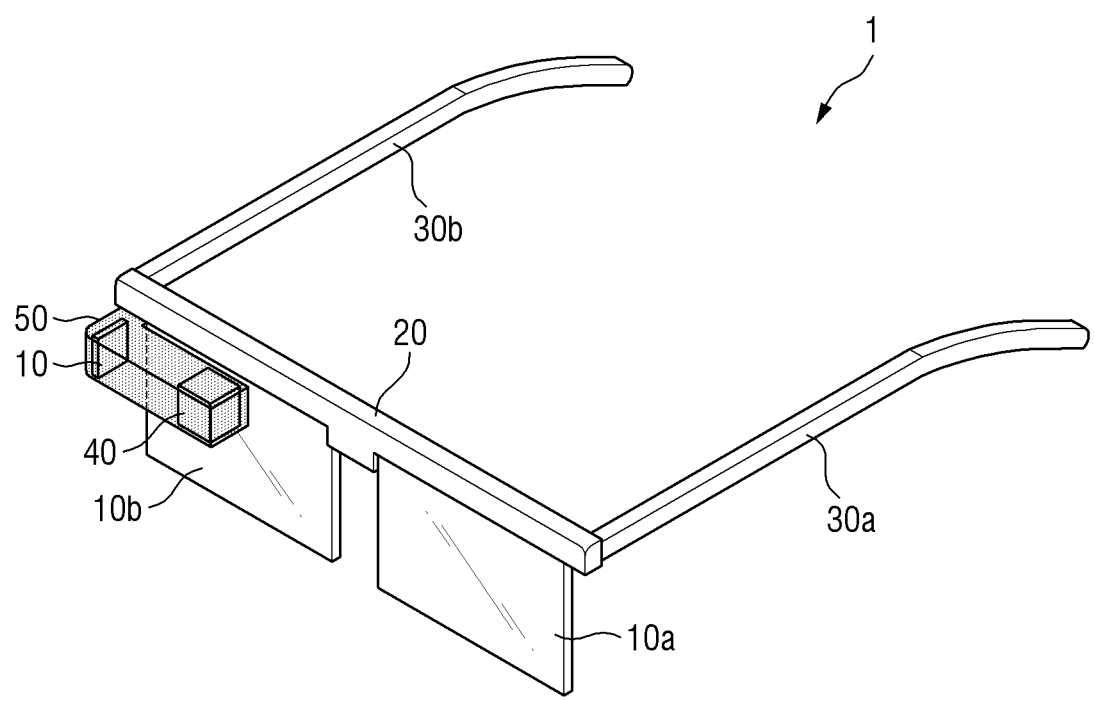
FIG. 54 is an example diagram schematically showing a virtual reality device including a display device according to an embodiment.

FIG. 54 is an example diagram illustrating a virtual reality device including a display device according to an embodiment. FIG. 54 illustrates a virtual reality device 1 in which the display device 10 according to an embodiment is used.

Referring to FIG. 54, the virtual reality device 1 according to an embodiment may be a device in a form of glasses. The virtual reality device 1 according to an embodiment may include a display device 10, a left-eye lens 10a, a right-eye lens 10b, a support frame 20, left and right legs 30a and 30b, a reflective member 40, and a display device housing 50.

FIG. 54 illustrates the virtual reality device 1 including the two legs 30a and 30b. However, the disclosure is not limited thereto. The virtual reality device 1 according to an embodiment may be used in a head-mounted display including a head-mounted band that may be mounted on a head instead of the legs 30a and 30b. For example, the virtual reality device 1 according to an embodiment may not be limited to the example shown in FIG. 54, and may be applied in various forms and in various electronic devices.

The display device housing 50 may receive the display device 10 and the reflective member 40. An image displayed on the display device 10 may be reflected from the reflective member 40 and provided to a user's right eye through the right-eye lens 10b. Thus, the user may view a virtual reality image displayed on the display device 10 via the right eye.

FIG. 54 illustrates that the display device housing 50 is disposed at a right end of the support frame 20. However, an embodiment of the disclosure is not limited thereto. For example, the display device housing 50 may be disposed at a left end of the support frame 20. In this case, the image displayed on the display device 10 may be reflected from the reflective member 40 and provided to the user's left eye via the left-eye lens 10a. Thus, the user may view the virtual reality image displayed on the display device 10 via the left eye. As another example, the display device housing 50 may be disposed at each of the left end and the right end of the support frame 20. In this case, the user may view the virtual reality image displayed on the display device 10 via both the left eye and the right eye.

Figure 55:
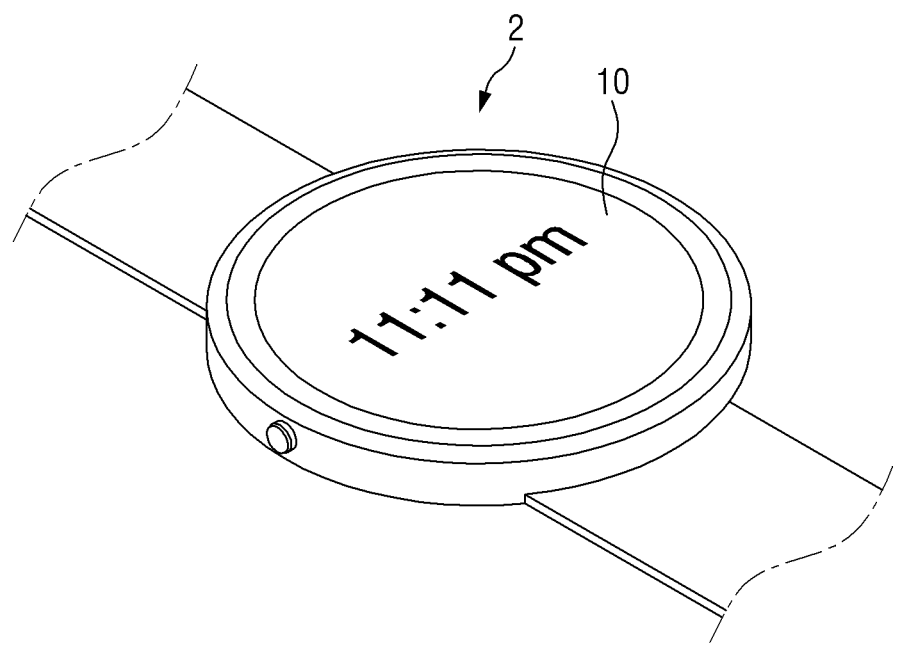
FIG. 55 is an example diagram schematically showing a smart device including a display device according to an embodiment.

FIG. 55 is an example diagram illustrating a smart device including a display device according to an embodiment.

Referring to FIG. 55, a display device 10 according to an embodiment may be applied to a smart watch 2 as one of smart devices.

Figure 56:
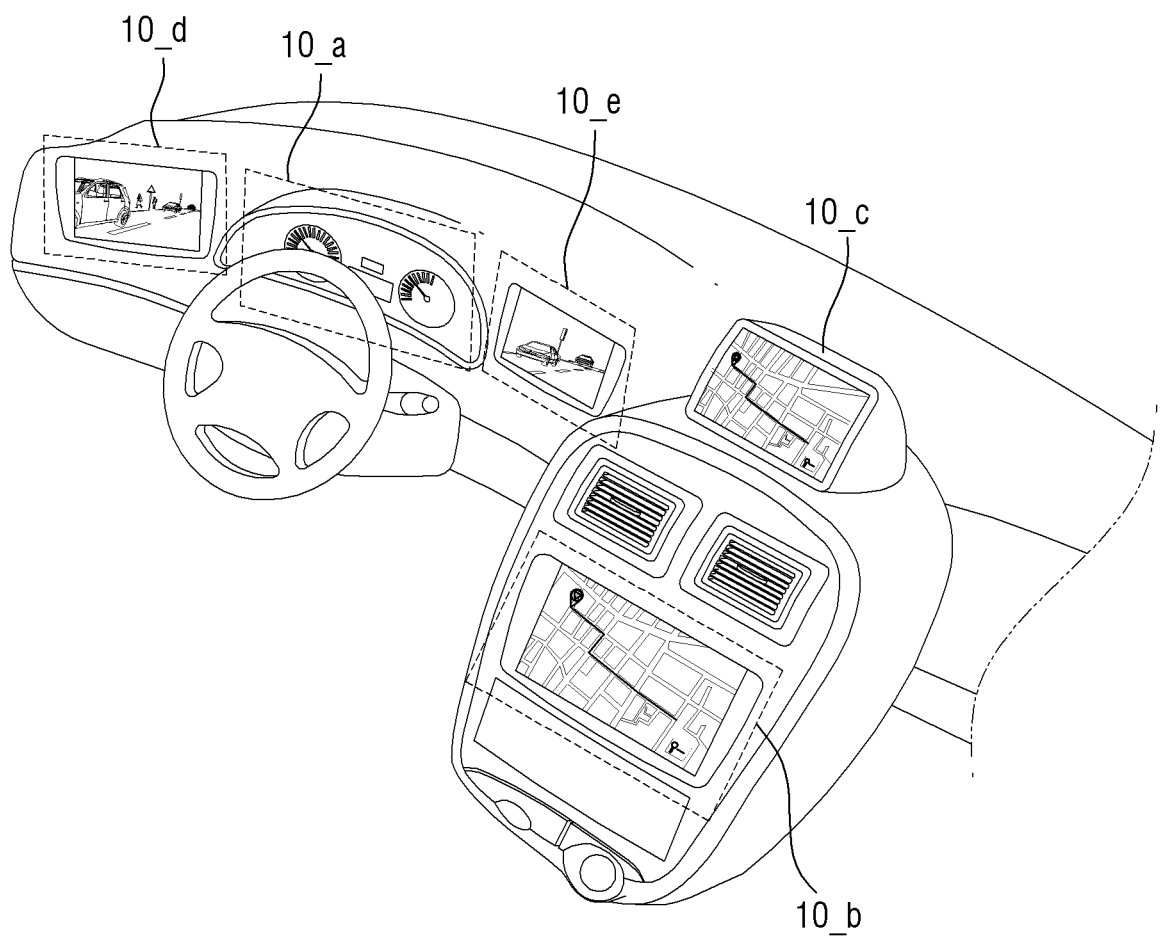
FIG. 56 is a diagram of an example schematically showing a vehicle including a display device according to an embodiment.

FIG. 56 is an example diagram illustrating a vehicle including a display device according to an embodiment. FIG. 56 illustrates a vehicle in which display devices according to an embodiment are used.

Referring to FIG. 56, the display devices 10_a, 10 b, and 10_c according to an embodiment may be applied to the dashboard of the vehicle, applied to the center fascia of the vehicle, or applied to a CID (Center Information Display) disposed on the dashboard of the vehicle. Further, each of the display devices 10_d and 10_e according to an embodiment may be applied to each room mirror display that replaces each of side-view mirrors of the vehicle.

Figure 57:
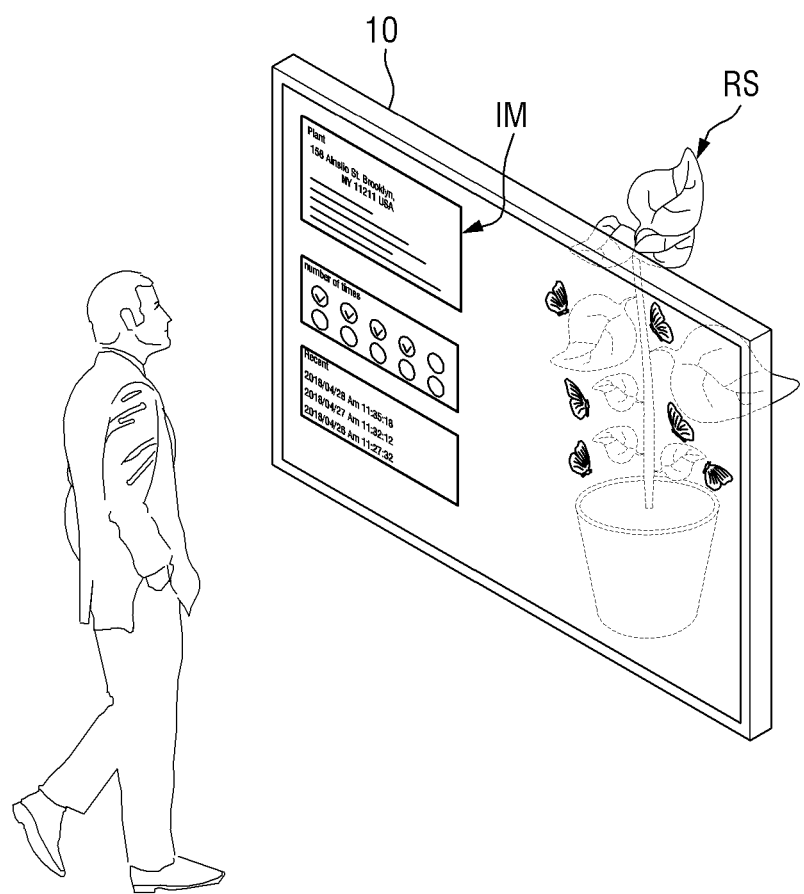
FIG. 57 is a diagram of an example schematically showing a transparent display device including a display device according to an embodiment.

FIG. 57 is an example diagram illustrating a transparent display device including a display device according to an embodiment.

Referring to FIG. 57, a display device according to an embodiment may be applied to a transparent display device. The transparent display device may transmit light therethrough while displaying an image IM thereon. Therefore, a user located in front of the transparent display device may not only view the image IM displayed on the display device 10, but also view an object RS or a background located in rear of the transparent display device. In case that the display device 10 is applied to the transparent display device, the first substrate 110 of the display device 10 shown in FIG. 6 may include a light transmitting portion that may transmit light therethrough or may be made of a material that may transmit light therethrough.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:

pixel electrodes disposed on a substrate;

light-emitting elements, each of the pixel electrodes having at least two corresponding light-emitting elements among the light-emitting elements disposed thereon;

a planarization layer disposed on and spacing the pixel electrodes apart from one another, the planarization layer filling spaces between the light-emitting elements and spaces between the pixel electrodes; and a common electrode disposed on the planarization layer and the light-emitting elements, wherein each of the at least two corresponding light-emitting elements is arranged perpendicular to a top face of a corresponding pixel electrode among the pixel electrodes;

at least one of the pixel electrodes includes a protrusion protruding toward and spaced apart from an adjacent one of the pixel electrodes, and one of the at least two corresponding light-emitting elements disposed on the at least one pixel electrode overlaps the protrusion in a plan view.

2. The device of claim 1, wherein an outer lateral side of the protrusion is aligned and coincident with an outer lateral side of the one of the at least two corresponding light-emitting elements.

3. The device of claim 1, wherein a first width of the at least one of the pixel electrodes extending in a direction and through the protrusion is greater than a second width of the at least one of the pixel electrodes extending in the direction and not through the protrusion.

4. The device of claim 1, wherein a dimension of a first line extending between the pixel electrodes adjacent to each other and in a direction is smaller than a dimension of a second line extending between the pixel electrodes adjacent to each other and in the direction, the first line contacts the protrusion, and the second line does not contact the protrusion.

5. The device of claim 1, further comprising:

a wavelength converter disposed on the common electrode, wherein the wavelength converter includes:

banks separating light-emitting areas from each other, each of the banks being disposed in association with a corresponding non-light-emitting area among non-light-emitting areas;

a wavelength conversion layer disposed between the banks and overlapping each of the light-emitting areas in the plan view;

a light-blocking member disposed on the banks; and a color filter disposed on the wavelength conversion layer.

6. The device of claim 5, wherein both a bank among the banks and the light-blocking member overlaps the protrusion in the corresponding non-light-emitting area in the plan view.

7. The device of claim 5, further comprising:

a reflective metal layer disposed between the common electrode and the banks, wherein the reflective metal layer overlaps each of the non-light-emitting areas in the plan view.

8. The device of claim 1, wherein each of the pixel electrodes includes a lower electrode layer and an upper electrode layer disposed on the lower electrode layer, and each of the lower electrode layer and the upper electrode layer includes a metal.

9. The device of claim 1, wherein
each of the pixel electrodes includes:

a lower electrode layer;

a reflective electrode layer disposed on the lower electrode layer; and an upper electrode layer disposed on the reflective electrode layer, each of the lower electrode layer and the upper electrode layer includes a metal oxide, and the reflective electrode layer includes a metal.

10. An electronic device comprising:

pixel electrodes disposed on a substrate;

light-emitting elements, each of the pixel electrodes having at least two corresponding light-emitting elements among the light-emitting elements disposed thereon;

a planarization layer disposed on and spacing the pixel electrodes apart from one another, the planarization layer filling spaces between the light-emitting elements and spaces between the pixel electrodes; and a common electrode disposed on the planarization layer and the light-emitting elements, wherein each of the at least two corresponding light-emitting elements is arranged perpendicular to a top face of a corresponding pixel electrode among the pixel electrodes;

at least one of the pixel electrodes includes a protrusion protruding toward and spaced apart from an adjacent one of the pixel electrodes, and one of the at least two corresponding light-emitting elements disposed on the at least one pixel electrode overlaps the protrusion in a plan view.

* * * * *